(12) United States Patent
Nakamura

(10) Patent No.: US 7,513,595 B2
(45) Date of Patent: Apr. 7, 2009

(54) LIQUID DROP DISCHARGE METHOD AND DISCHARGE DEVICE; ELECTRO OPTICAL DEVICE, METHOD OF MANUFACTURE THEREOF, AND DEVICE FOR MANUFACTURE THEREOF; COLOR FILTER METHOD OF MANUFACTURE THEREOF, AND DEVICE FOR MANUFACTURING THEREOF; AND DEVICE INCORPORATING BACKING, METHOD

(75) Inventor: Shinichi Nakamura, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 126 days.

(21) Appl. No.: 11/594,958

(22) Filed: Nov. 9, 2006

(65) Prior Publication Data

US 2007/0052751 A1 Mar. 8, 2007

Related U.S. Application Data

(60) Division of application No. 11/433,449, filed on May 15, 2006, which is a continuation of application No. 10/994,893, filed on Nov. 23, 2004, now Pat. No. 7,093,924, which is a division of application No. 10/815,752, filed on Apr. 2, 2004, now Pat. No. 6,837,568, and a division of application No. 10/314,261, filed on Dec. 9, 2002, now Pat. No. 6,736,484.

(30) Foreign Application Priority Data

Dec. 14, 2001 (JP) ............................. 2001-381578

(51) Int. Cl.
*B41J 2/15* (2006.01)
*B41J 2/145* (2006.01)

(52) U.S. Cl. .......................................... 347/40; 347/105
(58) Field of Classification Search ............. 347/40–43, 347/105

See application file for complete search history.

(56) References Cited

U.S. PATENT DOCUMENTS 6,257,699 B1 7/2001 Tracy et al.
6,328,418 B1 12/2001 Yamada et al.

(Continued)

FOREIGN PATENT DOCUMENTS

EP 0 832 751 A2 4/1998

(Continued)

*Primary Examiner*—Thinh H Nguyen
(74) *Attorney, Agent, or Firm*—Oliff & Berridge, PLC

(57) ABSTRACT

A liquid drop discharge device provides a head unit 420 which discharges filter element material relative to each of various colors of color filters. The head unit 420 is composed of an ink jet heads which are arranged on one end of a print substrate plate having a shape of rectangular card and head devices 433 which are arranged on the other end of the print substrate plate comprising connectors 441. The head devices 433 are aligned in two rows, as two groups, in a staggered arrangement so that a portion on which the connectors 441 are aligned in one of the two rows does not face to the same portion of the other in the two rows and protrudes outside of the print substrate plate. The head unit 420 discharges the filter element material onto predetermined portions in a superimposing manner while shifting along a direction which intersects to a direction along which the head devices 433 are arranged.

4 Claims, 45 Drawing Sheets

U.S. PATENT DOCUMENTS

| | | |
|---|---|---|
| 6,375,308 B1 | 4/2002 | Shimada |
| 6,471,352 B2 * | 10/2002 | Akahira ...................... 347/106 |
| 6,630,274 B1 | 10/2003 | Kiguchi et al. |
| 6,857,722 B1 | 2/2005 | Greiser et al. |
| 6,955,415 B2 * | 10/2005 | Koblinger et al. ............. 347/44 |
| 7,070,890 B2 | 7/2006 | Kiguchi et al. |
| 2006/0216617 A1 | 9/2006 | Kiguchi et al. |

FOREIGN PATENT DOCUMENTS

| | | |
|---|---|---|
| JP | A 07-081049 | 3/1995 |
| JP | A-11-020175 | 1/1999 |
| JP | A 11-248925 | 9/1999 |
| JP | A-2001-058422 | 3/2001 |
| JP | A 2001-066408 | 3/2001 |
| WO | WO 01/89844 A1 | 11/2001 |

* cited by examiner

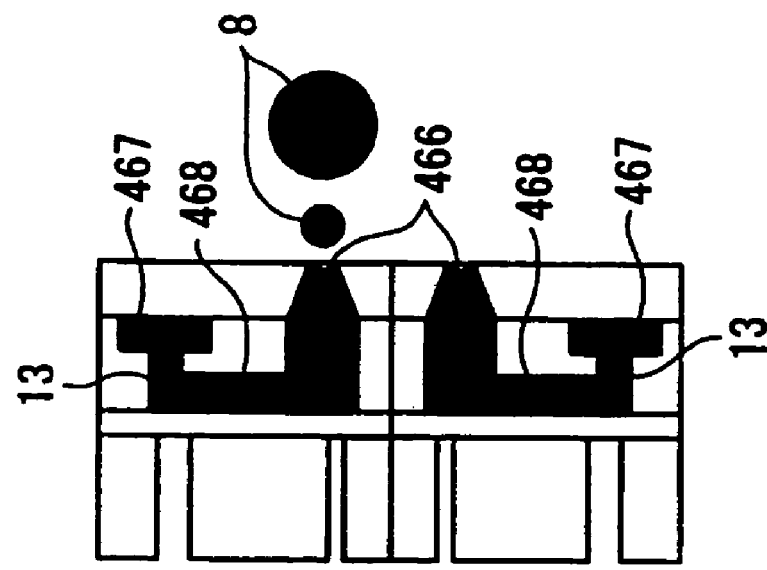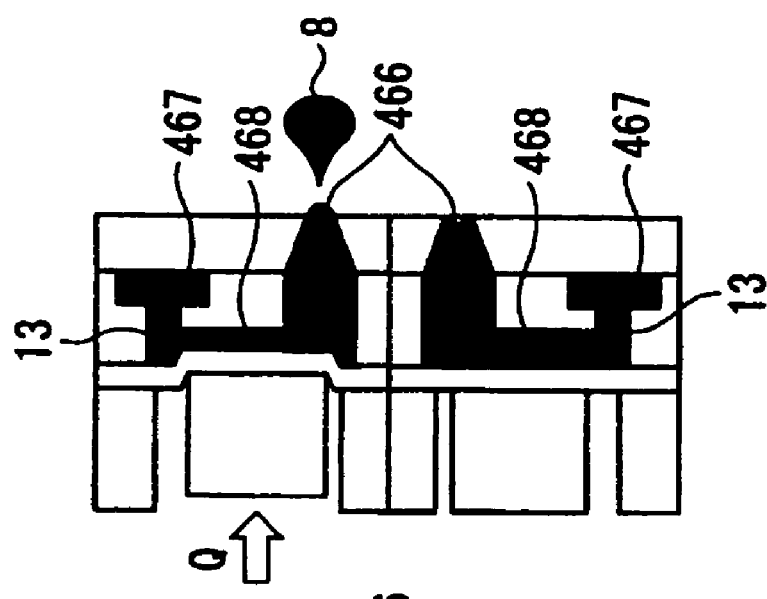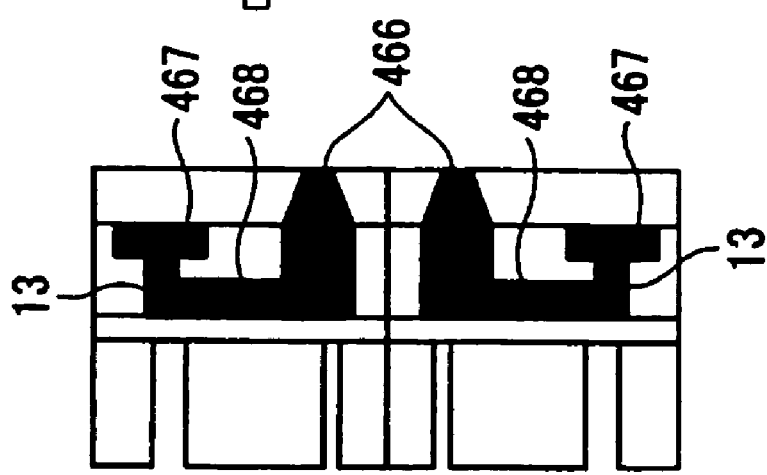

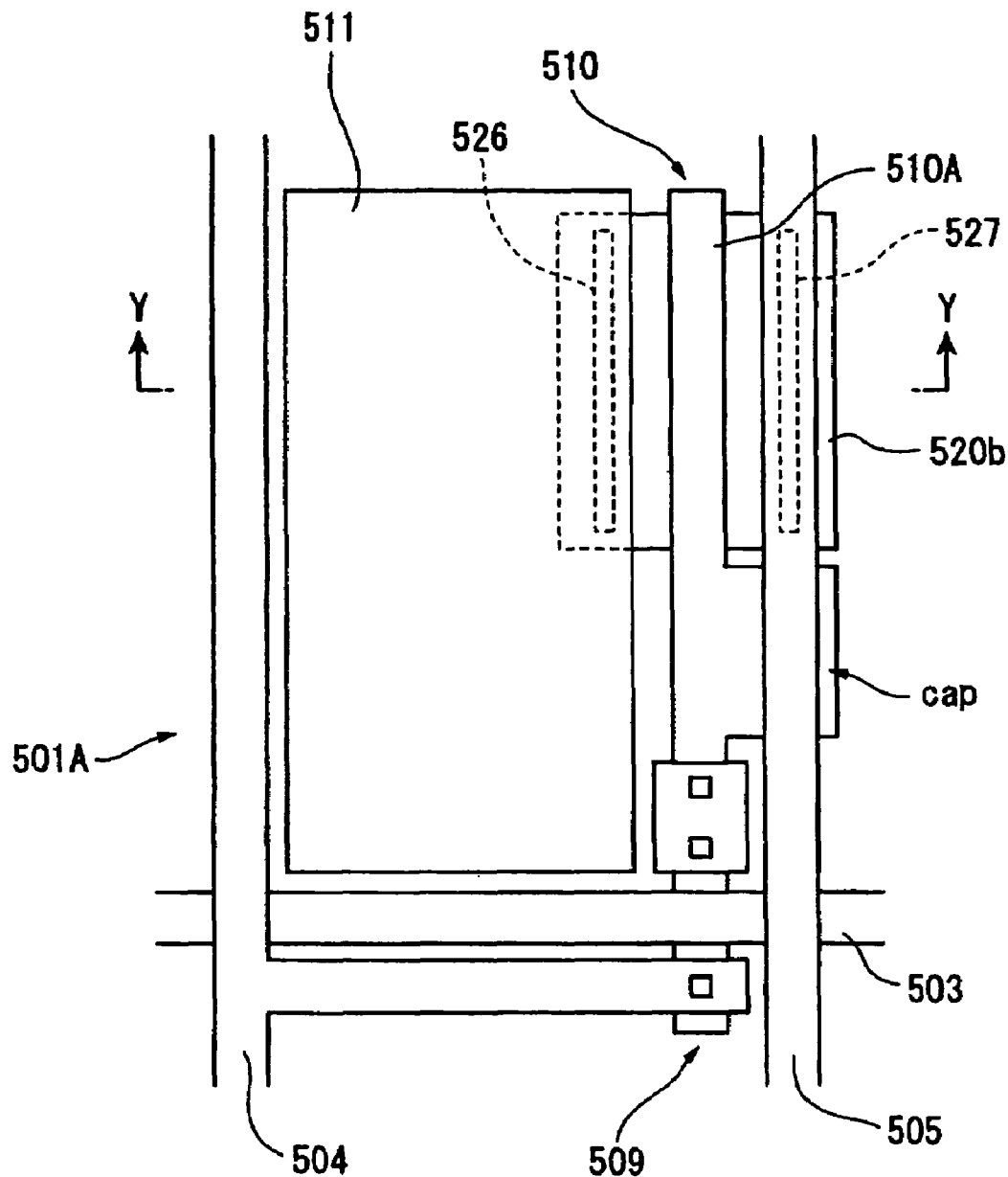

LIQUID DROP DISCHARGE METHOD AND DISCHARGE DEVICE; ELECTRO OPTICAL DEVICE, METHOD OF MANUFACTURE THEREOF, AND DEVICE FOR MANUFACTURE THEREOF; COLOR FILTER METHOD OF MANUFACTURE THEREOF, AND DEVICE FOR MANUFACTURING THEREOF; AND DEVICE INCORPORATING BACKING, METHOD

This is a Division of application Ser. No. 11/433,449 filed May 15, 2006, which in turn is a Continuation of Ser. No. 10/994,893 filed Nov. 23, 2004, which in turn is a Division of application Ser. No. 10/815,752 filed Apr. 2, 2004 (U.S. Pat. No. 6,837,568), which in turn is a Division of application Ser. No. 10/314,261 filed Dec. 9, 2002 (U.S. Pat. No. 6,736,484). The entire disclosures of the prior applications are hereby incorporated by reference herein in their entirety.

FIELD OF THE INVENTION

The present invention relates to a discharge method and device for discharging a liquid mass which has a certain flowability.

And, the present invention relates to an electro optical device such as a liquid crystal device, an electroluminescent device, an electrical migration device, an electron emission device or a PDP (Plasma Display Panel) device or the like, to a method of manufacture of an electro optical device for manufacturing such an electro optical device, and to a device for manufacturing the same. Furthermore, the present invention relates to a color filter which is used in an electro optical device, and to a method of manufacture of such a color filter and to a device for manufacturing the same. Yet further, the present invention relates to a device which comprises a backing such as an electro optical member, a semiconductor device, an optical member, a reagent inspection member or the like, and to a method of manufacture of such a device which comprises such a backing and to a device for manufacturing the same.

BACKGROUND ART

In recent years display devices which are so called electro optical devices, such as liquid crystal devices and electroluminescent devices and the like, have become widespread as display sections for electronic devices such as portable telephones, portable computers and the like. Furthermore, recently, it has become common to provide a full color display upon such a display device. A full color display upon such a liquid crystal device is provided, for example, by passing light which has been modulated by a liquid crystal layer through a color filter. And such a color filter is made by arranging filter elements of various colors such as R (red), G (green), and B (blue) in dot form upon the surface of a substrate plate which is made from, for example, glass or plastic or the like in a predetermined array configuration such as a so called stripe array, delta array, or mosaic array or the like.

Furthermore, a full color display upon such an electroluminescent device is provided by, for example, arranging electroluminescent layers of various colors such as R (red), G (green), and B (blue) in dot form upon the surface of a substrate plate which is made from, for example, glass or plastic or the like in a predetermined array configuration such as a so called stripe array, delta array, or mosaic array or the like, and sandwiching these electroluminescent layers between pairs of electrodes so as to form picture elements (pixels). And, by controlling the voltage which is applied between these electrodes for each picture element pixel, a full color display is provided by causing light of the desired colors to be emitted from these picture elements.

In the past, there has been a per se known method of using photolithography when patterning the filter elements of a color filter of various colors such as R, G, and B, or when patterning the picture elements of an electroluminescent device of various colors such as R, G, and B. However there are certain problems when using this photolithography method, such as the fact that the process is complicated, the fact that large quantities of the color material or the photoresist are consumed, the fact that the cost becomes high, and the like.

In order to solve this problem, a method has been contemplated of forming a filament or an electroluminescent layer or the like as a dot form array by discharging in dot form a filter element material or an electroluminescent material by an ink jet method.

Now, a method of making a filament or an electroluminescent layer or the like as a dot form array by an ink jet method will be explained. The case will be considered in which, as shown in FIG. 29(a), a plurality of filter elements 303 which are arrayed in dot form are formed, based upon an ink jet method, upon the internal regions of a plurality of panel regions 302 shown in FIG. 29(b) which are established upon the surface of a so called motherboard 301 which is a substrate plate of relatively large area which is made from glass, plastic or the like. In this case, as for example shown in FIG. 29(c), while performing a plurality of episodes of main scanning (in FIG. 29, two episodes) for a single panel region 302, as shown by the arrow signs A1 and A2 in FIG. 29(b), with an ink jet head which has a plurality of nozzles 304 which are arranged in a linear array so as to constitute a nozzle row 305, filter elements 303 are formed in the desired positions by discharging ink, i.e. filter material, selectively from this plurality of nozzles during these main scanning episodes.

These filter elements 303 are ones which are formed by arraying various colors such as R, G, and B and the like as described above in a suitable array form such as a so called stripe array, delta array, or mosaic array or the like. Due to this, in the ink discharge processing by the ink jet head 306 shown in FIG. 29(b), ink jet heads 306 for just the three colors R, G, and B are provided in advance, so as to discharge the single colors R, G, and B. And a three color array including R, G, and B or the like is formed upon the single motherboard 301 by using these ink jet heads 306 in order.

On the other hand, if a plurality of panel regions 302 are formed upon the motherboard 301, then it has been contemplated to form the filter element 303 at high efficiency by using an ink jet head of elongated form so that the ink jet head is positioned along substantially the entire extent of the widthwise dimension of the motherboard 301, which constitutes its widthwise direction with respect to the main scanning direction of the ink jet head. However there is the problem that, if a motherboard 301 is utilized whose size is different from and does not correspond to the size of the panel regions 302, every time this happens, a different ink jet head comes to be required, and accordingly the cost is increased.

Because the ink jet head has a mechanism in which ink is pressurized by a pressing means, for instance a piezo electric crystal, it is necessary wirings through which signal to drive the piezo electric crystal passes. According to the above necessity, a head device which comprises a board on which a ink jet head and a connector by which a circuit for driving the ink jet head are integrally mounted is utilized.

However, it is necessary to consider a working efficiency in wiring the ink jet heads, a layout of the head devices so as to obtain a desired print pattern, and an noise prevention in designing an arrangement of the head devices.

SUMMARY OF THE INVENTION

The present invention has been conceived in view of the above described considerations, and its objective is to provide: a liquid drop discharge device and a discharge method which are prevented from being influenced by an electrical noise and are easy in a construction, a electro optical device, a method and device of manufacture thereof, a color filter, a method and device of manufacture thereof, a device incorporating backing, a method and device of manufacture thereof.

(1) A discharge device according to the present invention proposes a plurality of discharge means each of which comprises a liquid drop discharge head provided with nozzles which discharge liquid mass having a certain flowability onto an object onto which liquid drops are to be discharged, a mounting board on which the liquid drop discharge head is mounted, and a connector which is arranged on the mounting board, a holding means on which the plurality of discharge means are arranged; and a shifting means for relatively shifting at least one of this holding means and the object onto which liquid drops are to be discharged. According to an aspect of the present invention, the plurality of discharge means are aligned to be separated into groups of discharge means and the discharge means in one of the groups are orientated so that their connectors do not face the discharge means in the other of the groups, and so as to orientate a plane, on which the nozzles of the liquid drop discharge heads are aligned, to face a surface of the object onto which liquid drops are to be discharged at a predetermined distance.

With the present invention having the above structure, because the plurality of discharge means, which comprise the liquid drop discharge heads and connectors on the mounting board, are arranged on holding means, it becomes to be easier to compose the discharge device, and the productivity of manufacturing the discharge device increases. Because the connectors of one the groups do not face the discharge means in the other of the groups, a portion of the mounting board of one of the groups on which the connectors are arranged is orientated to an outer side of the mounting board where opposes to the liquid drop discharge head of the other of the groups, and therefore an efficiency of wiring to the connectors increases. According to the discharge means thus wired, because a mutual influence among the electrical noise from the connectors is prevented, the discharge of the liquid mass is stabilized.

It is desirable for the discharge means of the present invention to form the mounting board in a rectangular shape and also to provide a liquid drop discharge head in one longitudinal end of the mounting board and a connector in another longitudinal end of the mounting board. Due to the above construction, it becomes easier to layout the plurality of discharge means so that the portion on which the connectors of one of the groups are arranged does not face to the discharge means of the other of the groups and directs outer side which opposes to a direction to face to the liquid drop discharge head of the other of the groups. And therefore the discharge device is in a state in which the conneceters of one of the groups are apart from the discharge heads of the other of the groups and an efficiency for wiring the connectors and a working rate for wiring the connectors increase.

It is desirable for the discharge means of one of the groups, which is orientated so that the portion in which the connectors are arranged does not face to the discharge means of the other of the groups, to be arranged so that the discharge means of one of the groups are arranged point symmetrically with the discharge means of the other of the groups. Due to the above construction, the connectors of the one of the groups are located in a position which is farthest from the connectors of the other of the groups, which are arranged point symmetrically with the other of the groups, and therefore, a efficiency of wiring increases and influences of electrical noise decrease.

It is desirable for the discharge means to further comprise a liquid supplying means which supplies liquid mass to the discharge means, the liquid supplying means connects a supply tube from positions between the groups of discharge means to each of the discharge means in each group of discharge means so as to supply the liquid mass to each of the discharge means. Due to the above constructions, the liquid mass is supplied through the supply tube from the positions between the groups of discharge means to each of the discharge means, and the supply tubes through which the liquid mass flows are combined as a single line in an intermediate position of the each tubes. Therefore an efficiency of piping for the tubes and an efficiency of a maintenance thereof increase. Further, a displacement and a damage of the tubes due to an interference among the one of the tubes and other of the tubes.

It is desirable for the liquid supplying means to comprise a tank which stores the liquid mass, a supplying tube through which the liquid mass flows, a pump which supplies the liquid mass in the tank to the liquid drop discharge head of the liquid discharge means through the supply tube, a plurality of the supply tubes are provided for each of the liquid drop discharge heads and which piping paths are located from positions between the groups of discharge means to each of the discharge means. Because the supplying tubes through which the liquid mass flows are located from positions between the groups of discharge means to each of the discharge means, in a piping by which the liquid is distributed, a flow resistance in one of the supplying tubes equals to the other of the supplying tubes. A discharge rate of one of the supplying tubes equals to a discharge rate of the other of the supplying tubes which dimensions are same as one of the supplying tubes. Because a commonly discharge is established by supplying tubes having same dimensions, a productivity of the discharge device increases.

It is desirable for the discharge device to comprise a plurality of wirings which connects a control means to the connectors of the discharge means, wherein the plurality of wirings are wired from an outer periphery of the holding means to the connectors. Because the plurality of wirings are wired from an outer periphery of the holding means to the connectors, influences of one of the wirings to the other are prevented, and it is possible to stably discharge the liquid mass.

It is desirable for the discharge device to comprise a plurality of discharge heads which are aligned along a plurality of lines which intersect to a direction along which the liquid drop discharge heads are shifted relative to the surface of the object onto which liquid drops are to be discharged. According to such a structure, the liquid drop discharge heads are arranged so that the liquid drop discharge heads are inclined with respect to a direction along which the liquid drop discharge means are shifted in order to set the pitch, i.e. the interval, between the nozzles relative to the pitch at which the liquid mass is discharged, and an interference between various one of the discharge means to the other of the discharge means next to the various one of the discharge means is prevented. Therefore, a productivity of the discharge device increases and an influence of an electric noise is prevented.

(2) With the present invention, it is convenient to manufacture an electro optical device by forming an electro-luminescent layer by, with the liquid mass which is to be discharged being a liquid mass which includes an electro-luminescent material, discharging this liquid mass against, as the object against which liquid drops are to be discharged, a substrate plate.

(3) With the present invention, it is convenient to manufacture a color filter which is an electro optical device by, with the liquid mass which is to be discharged being a liquid mass which includes a color filter material, discharging this liquid mass against, as the object against which liquid drops are to be discharged, one of a pair of substrate plates between which a liquid crystal is to be sandwiched.

(4) With the present invention, it is convenient to manufacture color filters of various colors by, with the liquid mass which is to be discharged being a liquid mass which includes a color filter material, discharging this liquid mass against a substrate as the object against which liquid drops are to be discharged.

(5) With the present invention, it is convenient to manufacture a device which comprises a backing, wherein a predetermined layer is formed upon the backing by discharging a liquid mass which is endowed with a certain flowability against the backing, which is the object onto which liquid drops are to be discharged, by a discharge method of one of the types described above.

According to the present invention, the discharge means, comprising the liquid drop discharge heads and the connectors being arranged on the mounting board, are separated into the groups and mounting board is orientated so that the portion the on which the connectors of one of the groups are arranged does not face to the discharge means of the other of the groups, and the liquid drop discharge head is shifted relative to the object onto which liquid drops are to be discharged while a plane in which the nozzles are aligned lays along the surface of the object onto which liquid drops are to be discharged so as to discharge the liquid mass to the object onto which liquid drops are to be discharged, therefore, it is possible to construct the discharge means easier compared with respectively constructing the plurality of liquid drop discharge means with corresponding connectors and also possible to increase a manufacturing efficiency. And the mounting board is orientated so that the portion on which the connectors of one of the groups are arranged does not face to the discharge means of the other of the groups, and the portion on which the connectors are arranged is orientated so that the portion faces to the outer periphery of the mounting board which is opposite with the liquid drop discharge head, and therefore, it is possible to easily wire the connectors and also to increase a manufacturing efficiency. Further, by the connectors thus arranged in the discharge means it is possible to prevent a noise from one of the connectors which influences to the other of the connector and also possible to stably discharge the liquid mass.

BRIEF DESCRIPTION OF THE DRAWINGS

FIGS. 8(A) thorough 8(C) are a set of explanatory views for explanation of the operation of the same ink jet head for discharging filter element material.

FIG. 15 is a magnified plan view showing the planar structure of a picture element region of the same display device.

DESCRIPTION OF THE PREFERRED EMBODIMENTS

Figure 5:
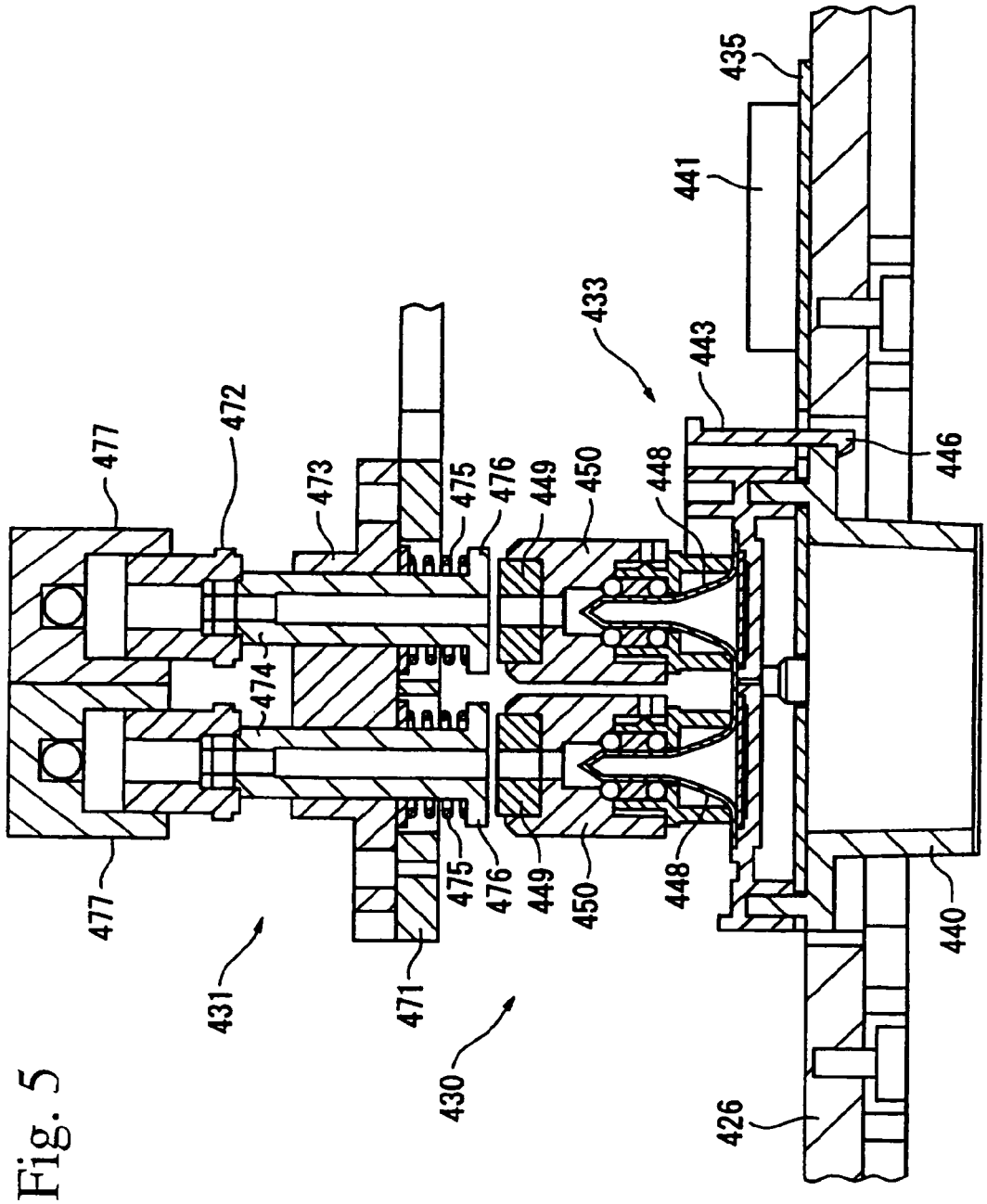
FIG. 5 is a sectional view of the same.
Figure 12A:
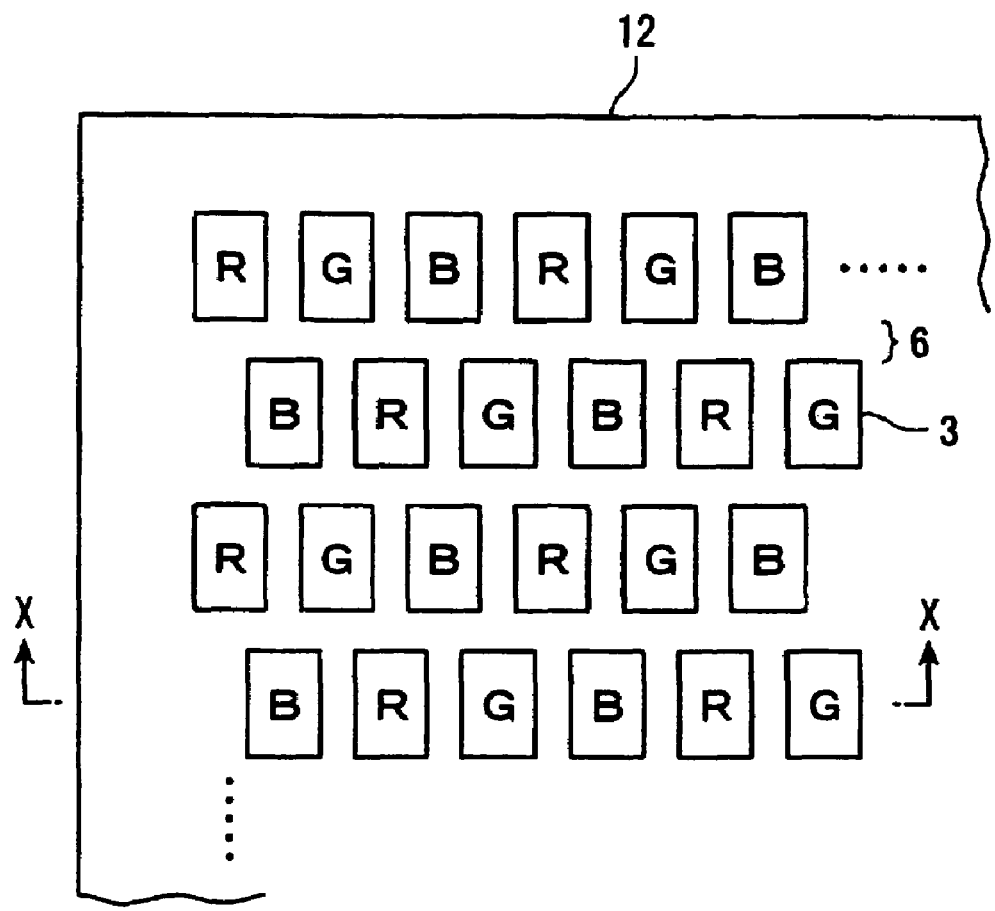
FIG. 12(A) is a general figure showing a color filter which has been manufactured by the same device for manufacturing a color filter, and is a plan view of the color filter

A Preferred Embodiment Related to a Method of Manufacture of a Color Filter, and a Device for Manufacturing the Same Next, a preferred embodiment of the device for manufacture of a color filter according to the present invention will be explained with reference to the figures. First, before explaining this device for manufacture of a color filter, the color filter which is to be manufactured will be explained. FIG. 12 is a figure which shows a portion of the color filter in a magnified view; its view 12(A) shows a plan view thereof, while the view 12(B) shows a sectional view thereof taken in a plane shown by the line X-X in FIG. 12(A). It should be understood that, with this color filter shown in FIG. 12, the portions for which the structure is the same as that of corresponding portions in the color filter of the preferred embodiment shown in FIG. 5 are designated by the same reference symbols.

—Construction of the Color Filter—

First, a preferred embodiment of a color filter manufactured by a manufacturing device according to the present invention will be explained with reference to the figures. FIG. 12 is a partially magnified view of the color filter, and FIG. 12(A) is a plan view of the color filter and FIG. 12(B) is a sectional view taken in a plane given by the arrows X-X in its view 12(A).

—Structure of the Color Filter—

Referring to FIG. 12(A), the color filter 1 comprises a plurality of picture elements 1A arranged in the form of a matrix. The boundaries of these picture elements 1A are defined by division walls 6. Color filter element material 13, i.e. color filter material which is a liquid mass which is either red (R), green (G), or blue (B) ink, is distributed into each one of these picture elements 1A. Although, in the following explanation of this color filter which is shown in FIG. 12, it will be assumed that the red, green, and blue picture elements are arranged in a so called mosaic array, this is not intended to be limitative: the same explanation would also apply in the case of a stripe array, a delta array or the like being utilized for the arrangement of the picture elements.

Figure 12B:
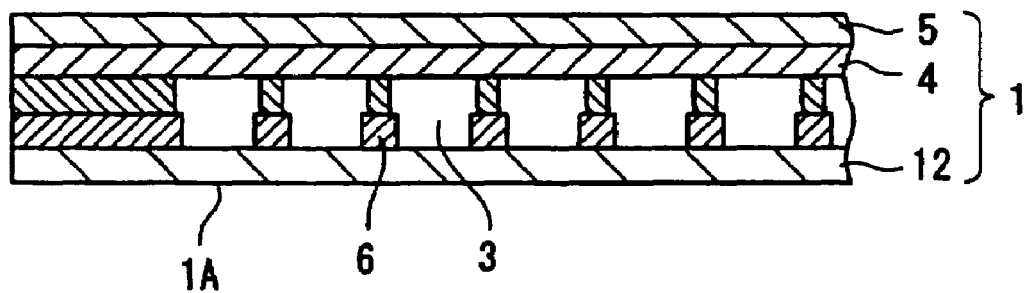
FIG. 12(B) is a sectional view taken in a plane given by the arrows X-X in its view FIG. 12(A).

The color filter 1, as shown in FIG. 12(B), comprises a transparent substrate plate 2 and transparent division walls 6. The portions where these division walls 6 are not formed, in other words the portions where they are eliminated, constitute the above described picture elements 1A. The filter element material 13 of various colors which is supplied into these picture elements 1A constitute the filter elements 3 of various adhered color layers. A protective layer 5 and an electrode layer 5 are formed over the upper surfaces of the division walls 6 and the filter elements 3.

—Structure of the Device for Manufacture of the Color Filter—

Figure 1:
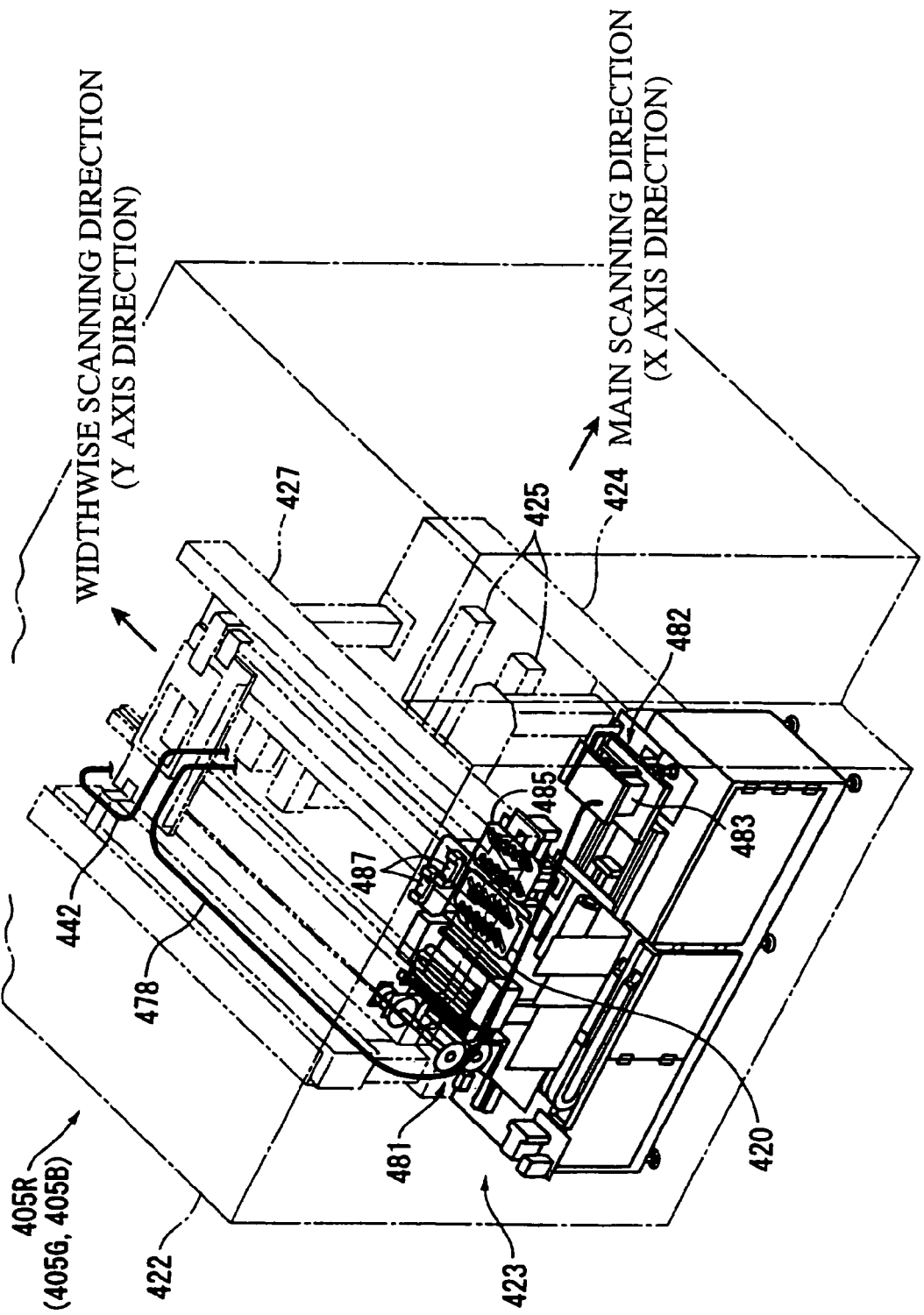
FIG. 1 is a perspective view showing a liquid drop discharge processing device of a liquid drop discharge device of a device for manufacture of a color filter according to the present invention, with a portion thereof cut away.

Next, the structure of a device for manufacturing the above described color filter will be explained with reference to the drawings. FIG. 1 is a perspective view showing a liquid drop discharge processing device of a device for manufacturing the color filter according to the present invention with one portion thereof cut away.

This device for manufacture of a color filter is adapted to manufacture a color filter which is to be incorporated in a color liquid crystal panel, which constitutes an electro optical device. This device for manufacture of a color filter comprises a liquid drop discharge device which is not shown in the figures.

—Structure of the Liquid Drop Discharge Processing Device—

And this liquid drop discharge device comprises three individual liquid drop discharge processing devices 405R, 405G, and 405B, as shown in FIG. 1, in the same manner as the liquid drop discharge devices of the various preferred embodiments described above. These liquid drop discharge processing devices 405R, 405G, and 405B correspond to the three colors R (red), G (green), and B (blue) of the filter element materials 13 of, for example, R, G, and B colors, which are the color filter materials, in other words the inks, which are to serve as liquid masses for being discharged against the motherboard 12. It should be understood that these liquid drop discharge processing devices 405R, 405G, and 405B are arranged approximately in series, thus making up the liquid drop discharge device. Furthermore, a control device for controlling the operation of various structural members, not shown in the figures, is provided integrally with each of the liquid drop discharge processing devices 405R, 405G, and 405B.

Moreover, it should be understood that each of the liquid drop discharge processing devices 405R, 405G, and 405B is connected to an individual transportation robot not shown in the drawings, each of which inserts and takes out motherboards 12, one at a time, into and from its respective liquid drop discharge processing devices 405R, 405G, and 405B. Furthermore, to each of the liquid drop discharge processing devices 405R, 405G, and 405B there is connected a multi stage baking furnace, not shown in the drawings, which is capable of accommodating, for example, six of the motherboards 12 at a time, and which subjects the motherboards 12 to heat processing by heating them up, for example at a temperature of 120 degree Celsius for a period of five minutes, for drying out the filter element material 13 which has been discharged against the motherboards 12.

And, as shown in FIG. 1, each of the liquid drop discharge processing devices 405R, 405G, and 405B comprises a thermal clean chamber 422 which is a hollow box shaped main body casing. In order to obtain properly stabilized painting by the ink jet method, the temperatures of the interiors of these thermal clean chambers 422 are adjusted to, for example, 20±0.5 degree Celsius, and they are formed so that dust or dirt cannot insinuate itself into them from the outside. The liquid drop discharge processing device main bodies 423 are housed within these thermal clean chambers 422.

The liquid drop discharge processing device main body 423 comprises an X axis air slide table 424, as shown in FIG. 1. A main scanning drive device 425, to which a linear motor not shown in the figures is provided, is disposed upon this X axis air slide table 424. This main scanning drive device 425 comprises a pedestal portion not shown in the figures to which the motherboard 12 is fixedly attached by, for example, suction, and this pedestal portion is shifted in the main scanning direction, which is the X axis direction, with respect to the motherboard 12.

As shown in FIG. 1, a widthwise scanning drive device 427 which serves as a Y axis table is disposed in the liquid drop discharge processing device main body 423 as positioned above the X axis air slide table 424. A head unit 420 which discharges filter element material 13, for example, in the vertical direction is shifted by this widthwise scanning drive device 427 along the widthwise scanning direction with respect to the motherboard 12, which is the Y axis direction. It should be understood that, in FIG. 1, the head unit 420 is shown by solid lines in its state in which it floats in the air, in order to clarify the various positional relationships.

Furthermore various cameras not shown in the drawings are provided in the liquid drop discharge processing device main body 423, and these are position detection means which detect various positions of various elements, for controlling the position of the ink jet head 421 and/or the position of the motherboard 12. It should be understood that it is possible to implement position control of the head unit 420 or of the pedestal portion by position control using pulse motors, or by feedback control using servo motors, or by some other control method, as may be appropriate.

Furthermore, as shown in FIG. 1, a wiping unit 481 which wipes off the surface of the head unit 420 which discharges filter element material 13 is provided to the liquid drop discharge processing device main body 423. In this wiping unit 481, a wiping member not shown in the figures in which, for example, a cloth member and rubber sheet are integrally superimposed is appropriately wound up from its one end, and the wiping unit 481 is arranged to wipe the surface which discharges filter element material 13 using new surfaces of this wiping member in order. By doing this, elimination of filter element material 13 which has adhered to the discharge surface is performed, and it is possible to prevent the occurrence of blockages of certain nozzles, which will be described hereinafter, in the surface which discharges filter element material 13.

Furthermore, as shown in FIG. 1, an ink system 482 is provided to the liquid drop discharge processing device main body 423. This ink system 482 comprises an ink tank 483 which stores filter element material 13, a supply conduit 478 which is capable of conducting this filter element material 13, and a pump not shown in the drawings which supplies filter element material 13 to the head unit 420 from the ink tank 483 via the supply conduit 478. It should be understood that the piping of the supply conduit 478 is only shown schematically in FIG. 1, and it is connected to the side of the widthwise scanning drive device 427 so as not to exert any influence from the ink tank 483 upon the shifting of the head unit 420, and so as to supply filter element material 13 to the head unit 420 from the vertical direction of the widthwise scanning drive device 427 which drives the head unit 420 to perform scanning.

Furthermore, a weight measurement unit 485 which detects the amount of discharge of filter element material 13 from the head unit 420 is provided to the liquid drop discharge processing device main body 423.

Yet further, a pair of dot missing detection units 487 are provided to the liquid drop discharge processing device main body 423, and these dot missing units 487 comprise, for example, optical sensors not shown in the drawings which detect the discharge state of filter element material 13 from the head unit 420. Moreover, these dot missing detection units 487 are arranged so that light sources and light reception portions of their optical sensors not shown in the figures are arranged along a crossing direction with respect to the direction in which the liquid mass is discharged from the head unit 420, for example along the X axis direction, and lie on either side of, and mutually oppose one another across, the space through which the liquid drops which have been discharged from the head unit 420 pass. Furthermore, these dot missing detection units 487 are arranged so as to be positioned on the Y axis direction side which is the transport direction of the head unit 420, and they detect dot missing by, for each episode of widthwise scanning shifting, detecting the discharge state of the head unit 420 for discharging the filter element material 13.

Although the details thereof will be described hereinafter, it should be understood that two rows of the head device 433 which discharges filter element material 13 are provided to the head unit 420. Due to this, a pair of the dot missing detection units 487 are also provided for detecting the discharge state, one for each row of these head devices.

—Structure of the Head Unit—

Figure 2:
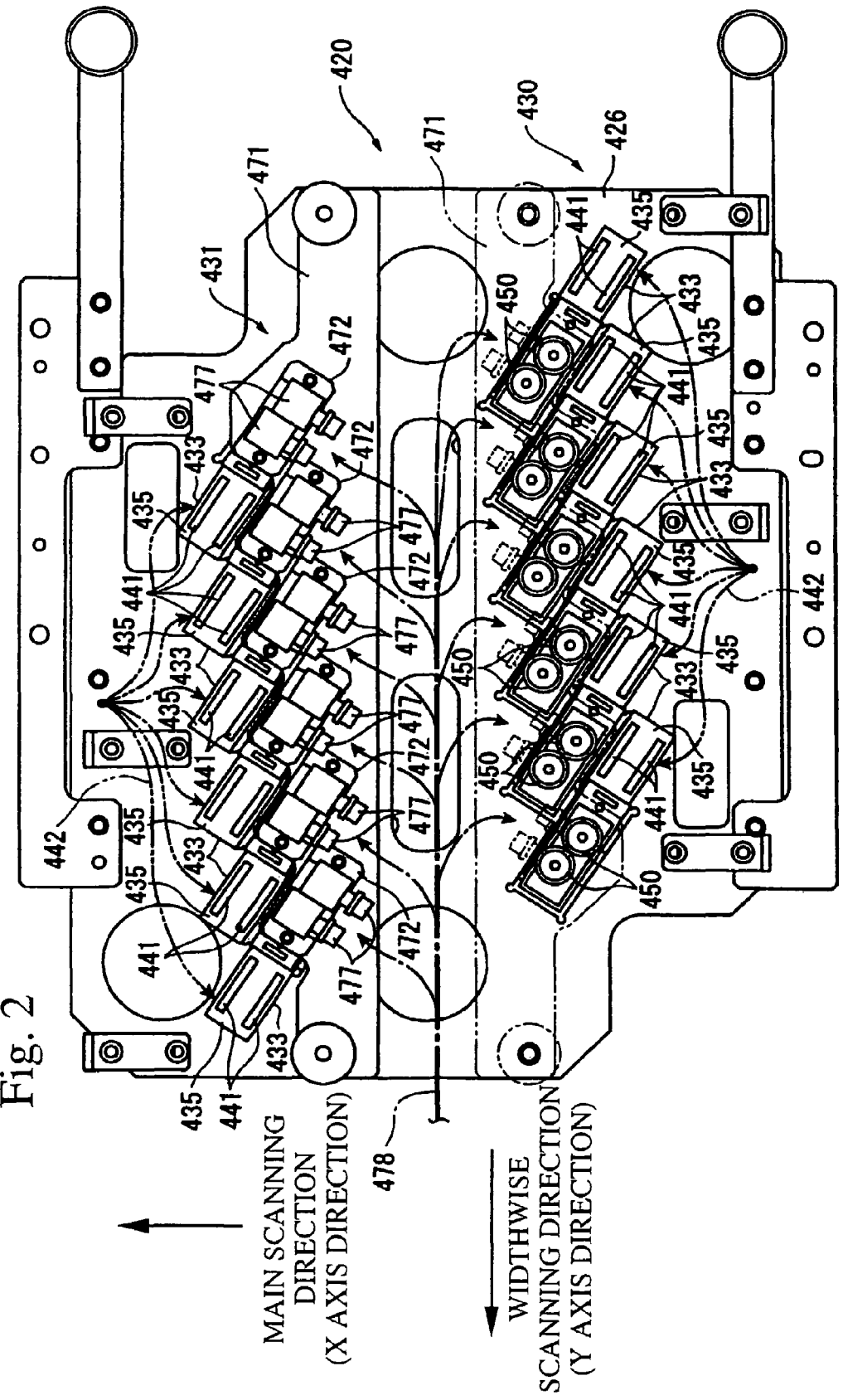
FIG. 2 is a plan view showing a head unit of the same liquid drop discharge processing device.
Figure 3:
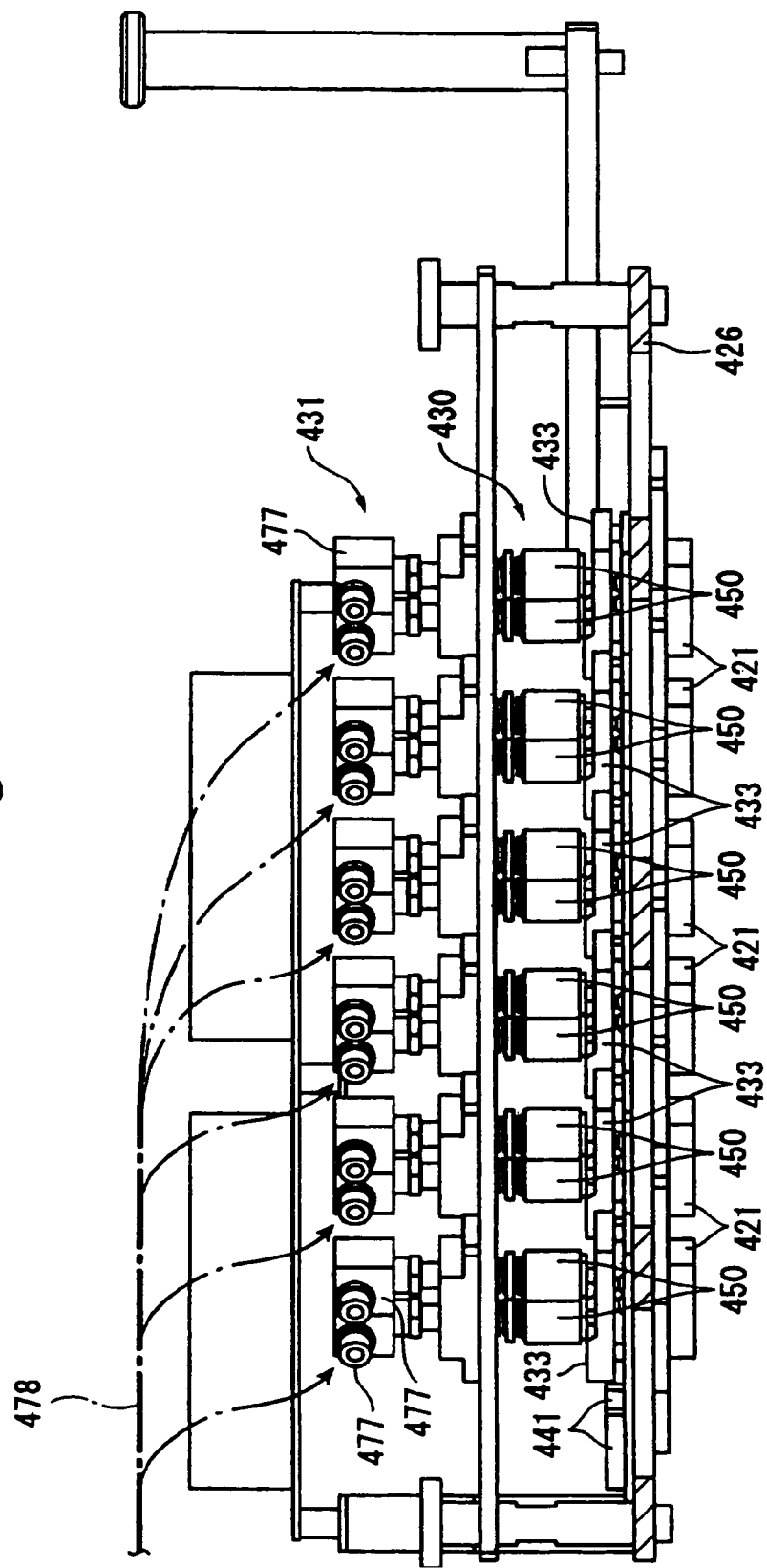
FIG. 3 is a side view of the same.

Next, the structure of the head unit 420 will be explained. FIG. 2 is a plan view showing the head unit 420, which is provided in each of the liquid drop discharge processing devices 405R, 405G, and 405B. FIG. 3 is a side view of this head unit 420.

Figure 4:
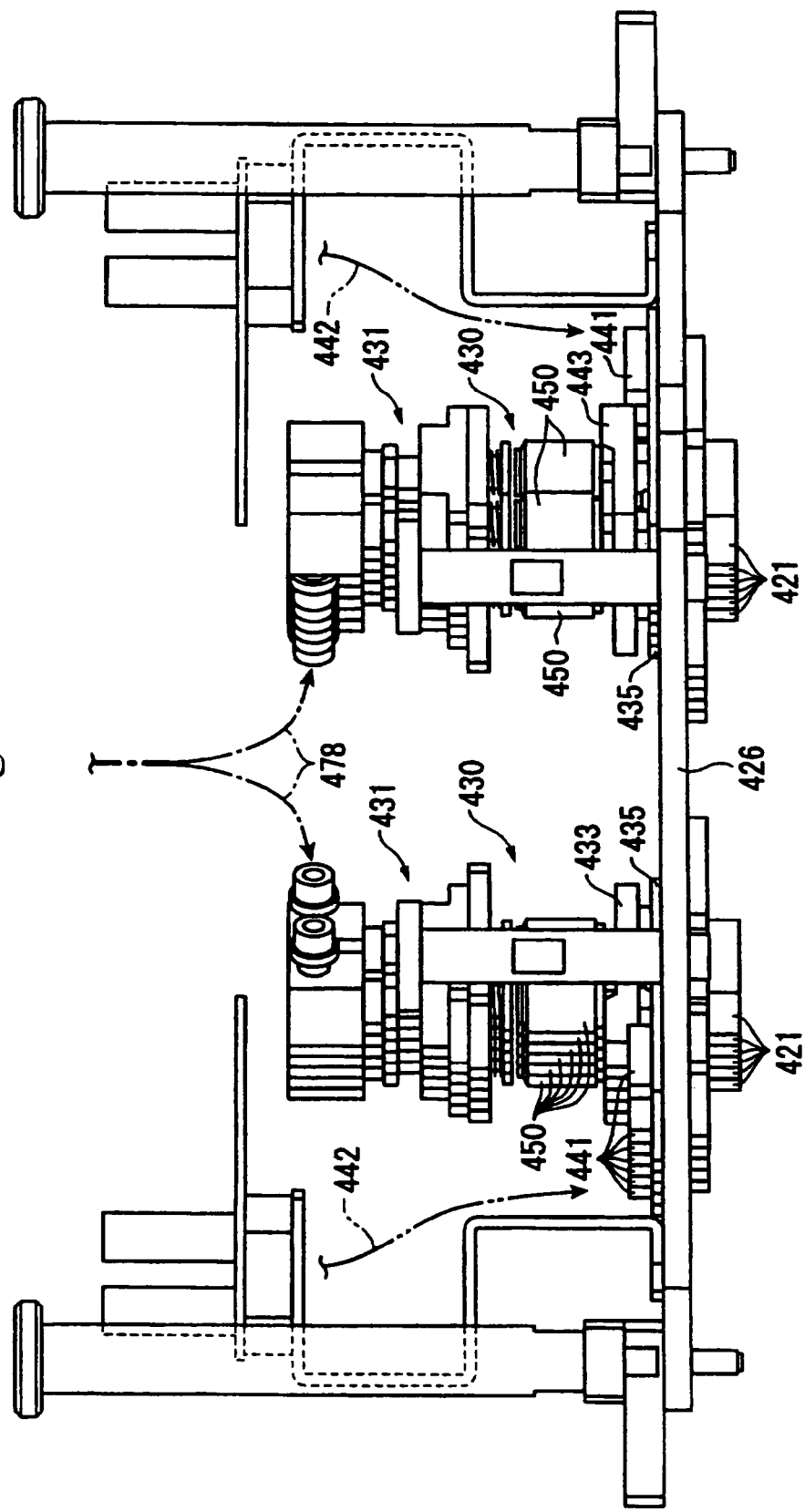
FIG. 4 is an elevation view of the same.

FIG. 4 is an elevation view of this head unit 420. And FIG. 5 is a sectional view showing this head unit 420.

As shown in FIGS. 2 through 5, the head unit 420 comprises a head main body portion 430 and an ink supply section 431. Furthermore, this head main body portion 430 comprises a planar carriage 426 and a plurality of head devices 433 fitted upon this carriage 426, all of which are, in practice, of roughly the same structure.

—Structure of the Head Device—

Figure 6:
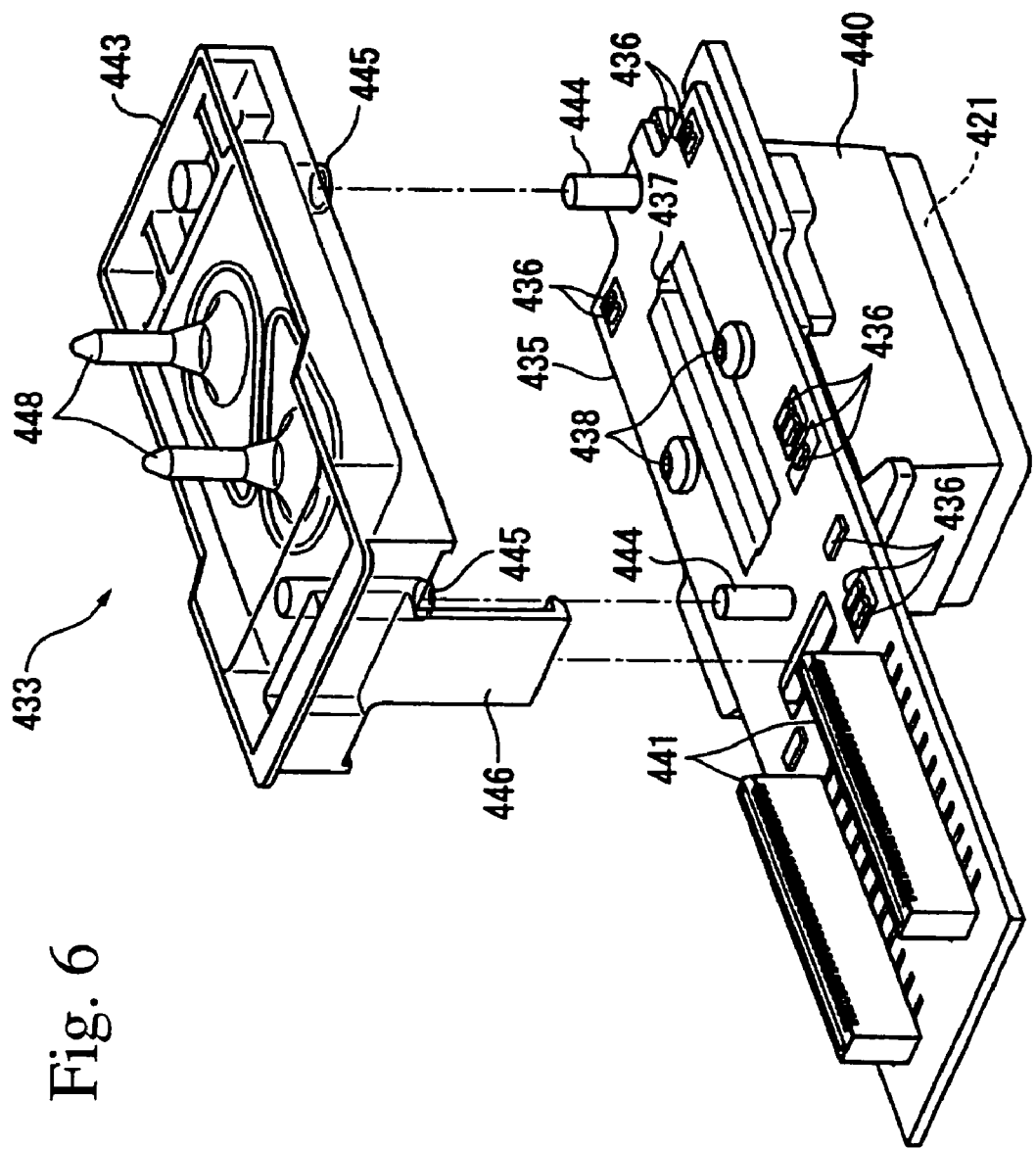
FIG. 6 is an exploded perspective view of the same head device.

FIG. 6 is an exploded perspective view showing a head device 433 which is provided to the head unit 420.

As shown in FIG. 6, this head device 433 comprises a print substrate plate 435 which has a shape of rectangular card. Electrical connecting wires which connect various electrical components 436 are provided upon this print substrate plate 435. Furthermore, a window portion 437 is formed through the print substrate plate 435, positioned at one end thereof (the right end in FIG. 6) along its longitudinal direction. Yet further, flow conduits 438 which are capable of carrying flows of filter element material 13, i.e. of ink, are provided in the print substrate plate 435 and are positioned at opposite sides of the window portion 437.

And an ink jet head 421 is integrally fitted by a fitting member 440 upon one surface side (the lower surface side in FIG. 6) of this print substrate plate 435, and is positioned approximately at one end thereof in its longitudinal direction (the right end in FIG. 6). This ink jet head 421 is formed in an elongated parallelepiped shape, and it is fixed to the print substrate plate 435 with its lengthwise direction running along the lengthwise direction of the plate 435. It should be understood that each of the ink jet heads 421 of each of the head devices 433 is in practice of approximately the same type, in other words, for example, may be a product made to a predetermined standard, or may be sorted to a predetermined quality, or the like. In concrete terms, each of these ink jet heads 421 comprises the same number of nozzles which will be described hereinafter, and it is desirable for the positions in which these nozzles are formed to be mutually the same, so that it is possible efficiently to perform the operation of assembling these ink jet heads 421 to the carriage 426, and so that, furthermore, it is possible to enhance the accuracy of that operation. Yet further, it is possible to reduce the cost if components are utilized which are produced via the same manufacturing and assembly process, since the requirement for manufacturing special components disappears.

Furthermore, connectors 441 for electrically connecting electrical connecting wires 442 to the ink jet head 421 are integrally fitted on the other surface side of the print substrate plate 435 (the upper side in FIG. 6), so as to be positioned approximately at the other end thereof (the left end in FIG. 6) in its longitudinal direction. As schematically shown in FIG. 1, electrical connecting wires 442 (including connecting wires from an electrical power source and connecting wires for carrying signals) which are connected to the widthwise scanning drive device 427 are connected to these connectors 441, so as not to exert any influence upon the shifting of the head unit 420. These connecting wires 442 are connected to a control device not shown in the figures, and to the head unit 420. In other words these electrical connecting wires 442, as schematically shown by the double dotted broken arrows in FIG. 2 and FIG. 5, are connected from the widthwise scanning drive device 427 to the connectors 441 which are connected to the outer peripheral sides of the head unit 420, which are on opposite sides of the direction (the longitudinal direction) in which the two rows of head device 433 of this head unit 420 are aligned, and thereby the generation of electrical noise is minimized.

Yet further, an ink supply section 443 is fitted to the other surface side of the print substrate plate 435 (the upper surface side in FIG. 6), approximately at one end thereof (the right end in FIG. 6) in its longitudinal direction, so as to correspond to the ink jet head 421. This ink supply section 443 comprises position determination tubular portions 445 of roughly cylindrical form which pass through the print substrate plate 435 and into which position determination pin portions 444 which are provided upon the fitting member 440 are fitted, and engagement claw portions 446 which engage with the print substrate plate 435.

Moreover a pair of connecting members 448 are provided so as to project from the ink supply section 443, and these members 448 are of approximately cylindrical form and have tapered ends. These connecting members 448 have through openings not shown in the figures which, at their base end portions which are presented towards the print substrate plate 435, connect in a substantially liquid tight manner to the flow conduits 438 of the print substrate plate 435, and their tip end portions (at their upper ends in FIG. 6) are provided with holes not shown in the figures through which flows of filter element material 13 may be conducted.

Still further, as shown in FIGS. 3 through 6, a sealing connecting member 450 is fitted to each to these connecting members 448, positioned at its tip. These sealing connecting members 450 are made in roughly cylindrical form, and their interior circumferences are fitted to the connecting members 448 in a substantially liquid tight fashion; and they are provided with seal members 449 at their tip end portions.

—Structure of the Ink Jet Head—

Figure 9:
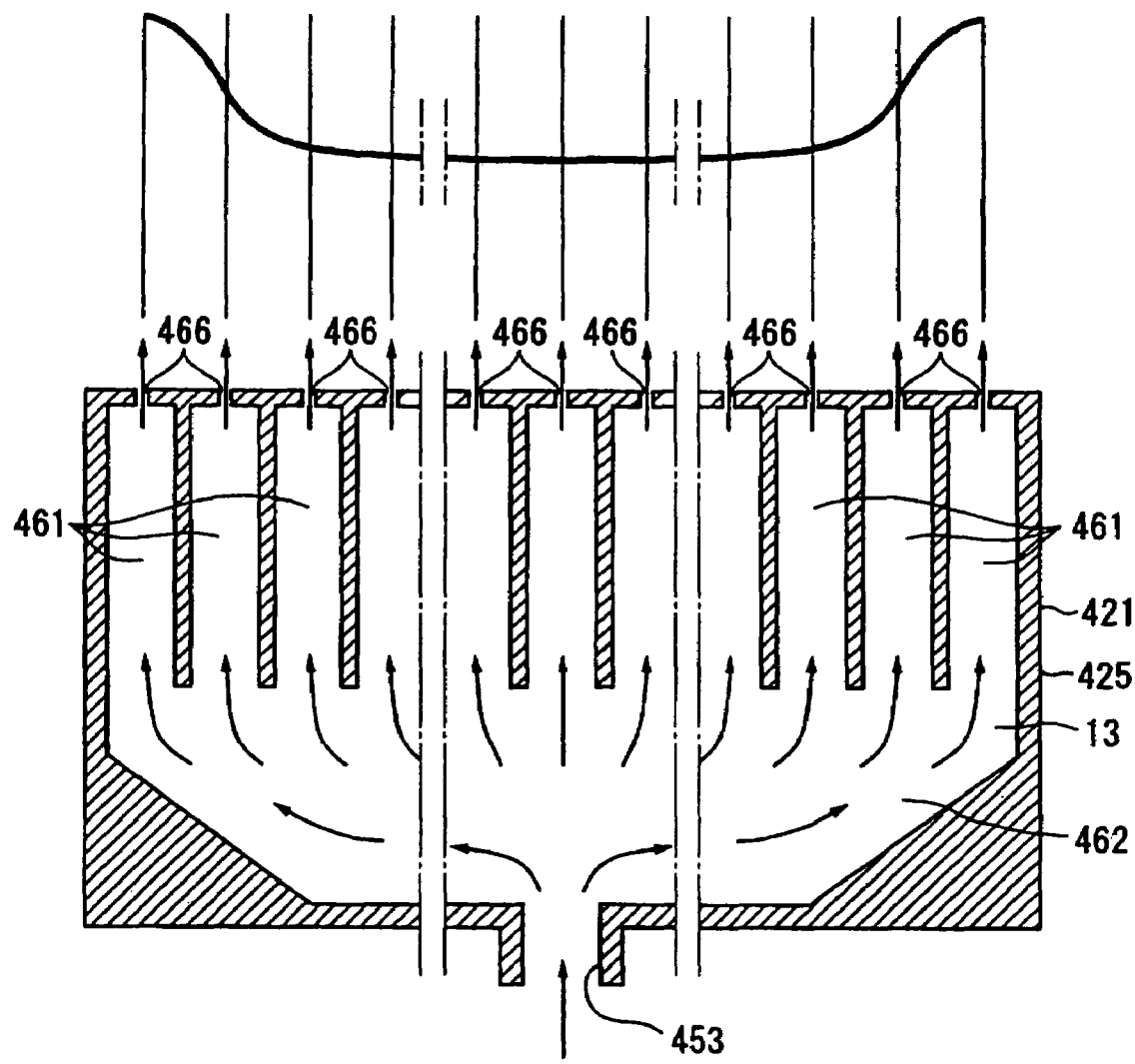
FIG. 9 is an explanatory view for explanation of the discharge amount of filter element material by the same ink jet head.
Figure 10:
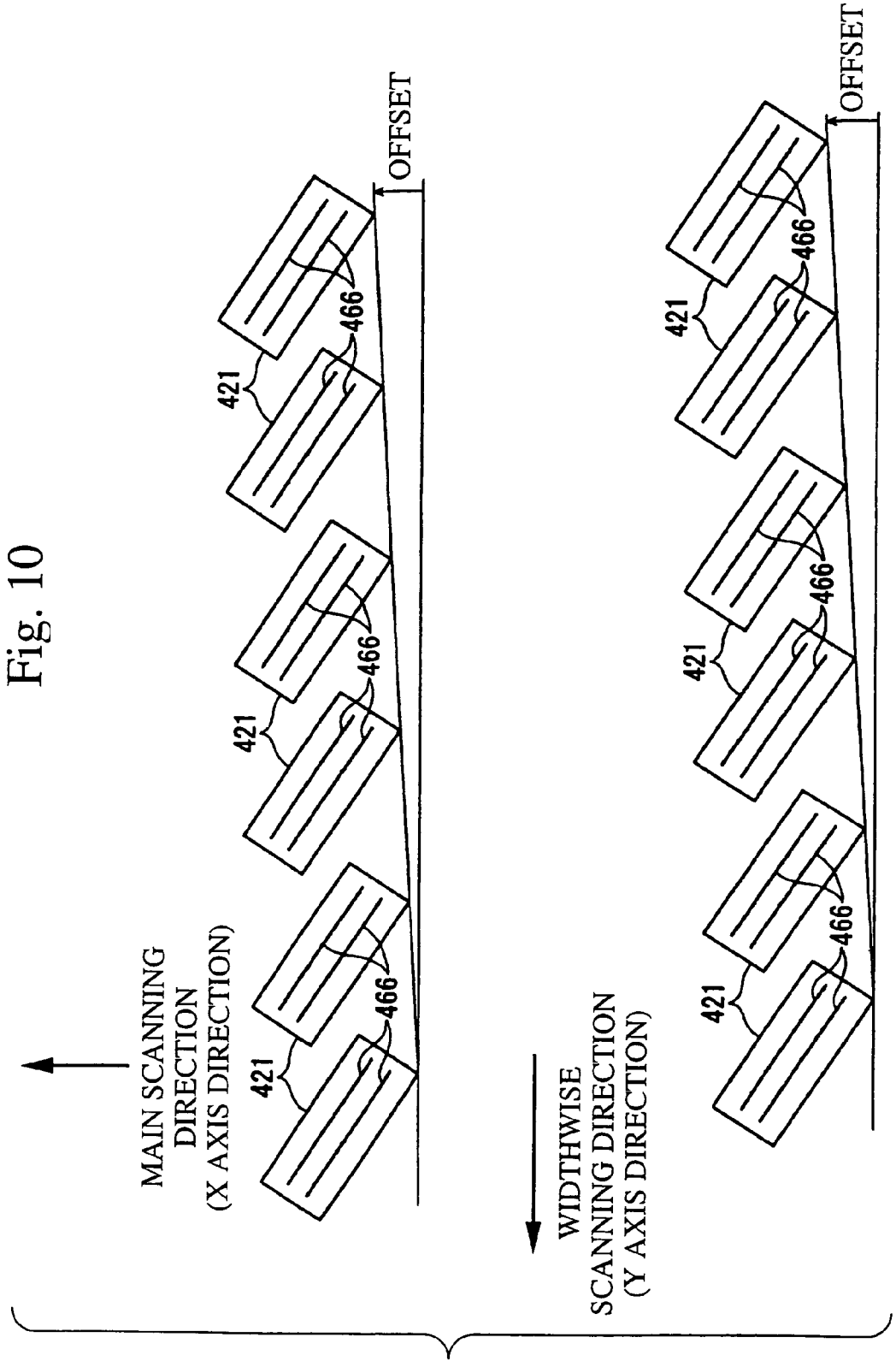
FIG. 10 is a schematic view for explanation of the way in which the same ink jet head is arranged.
Figure 11:
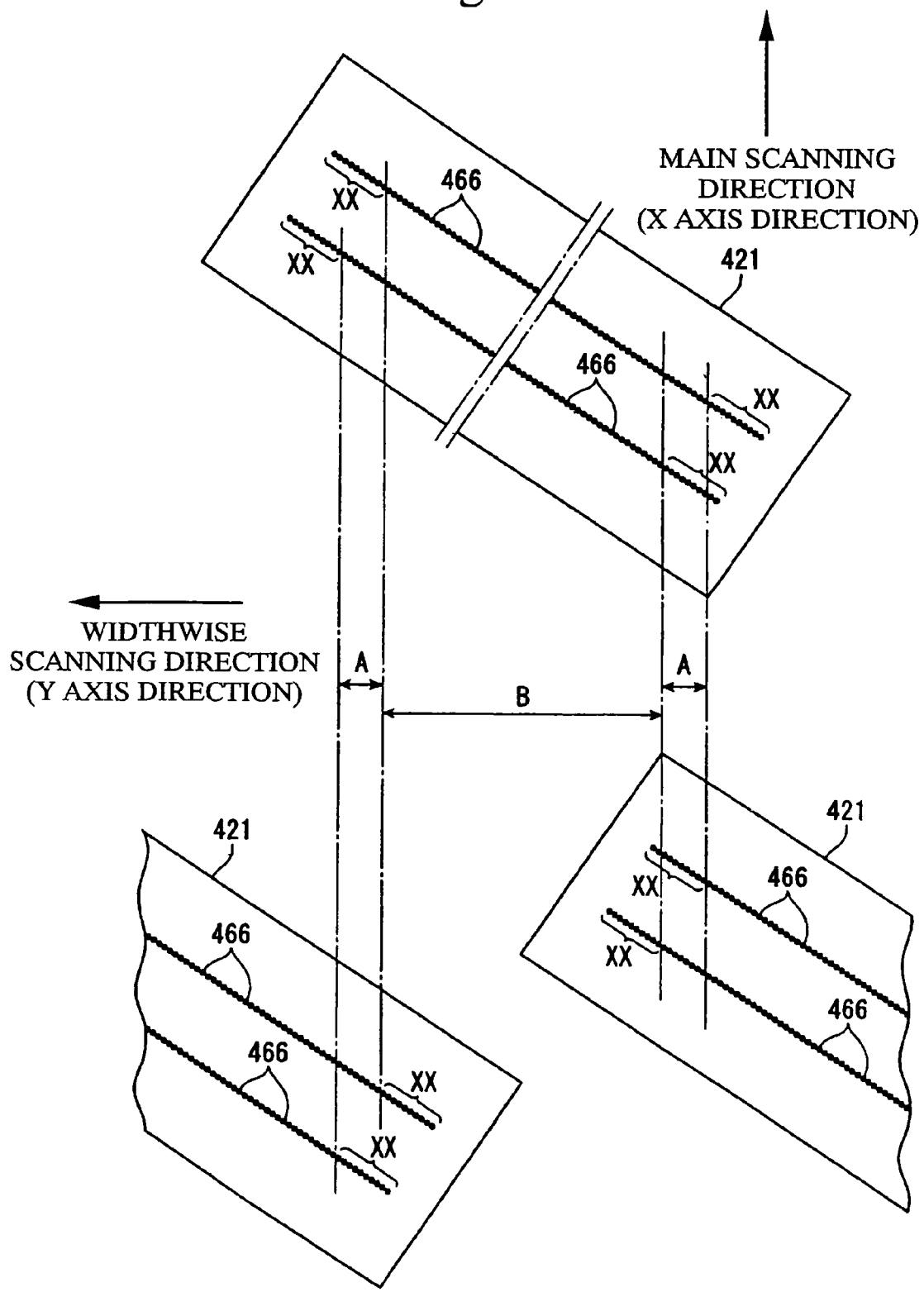
FIG. 11 is a partially magnified schematic view for explanation of the way in which the same ink jet head is arranged.
Figure 29A:
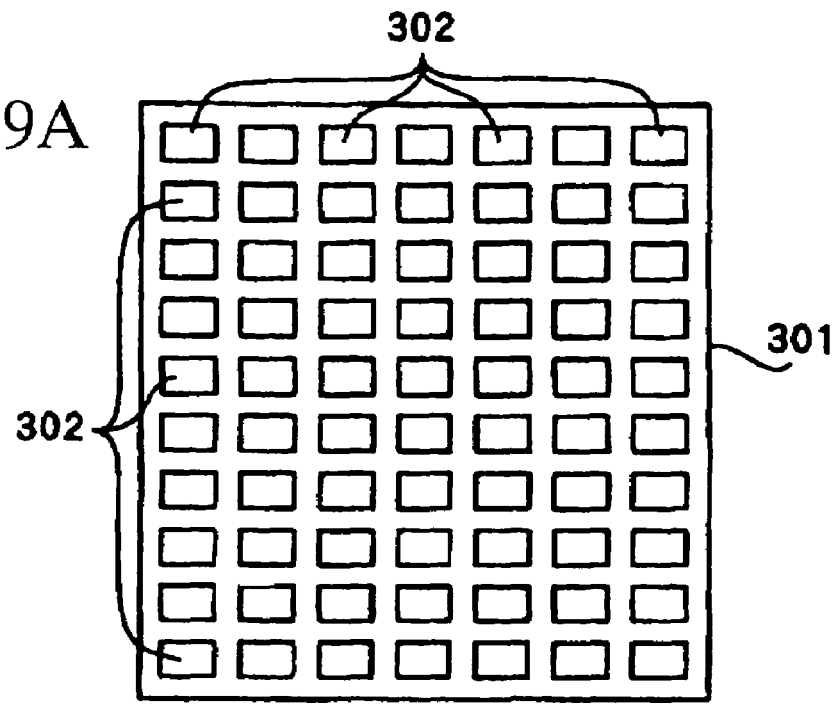
FIGS. 29(A) through 29(C) are figures showing one example of a method of manufacture of a prior art color filter.
Figure 29B:
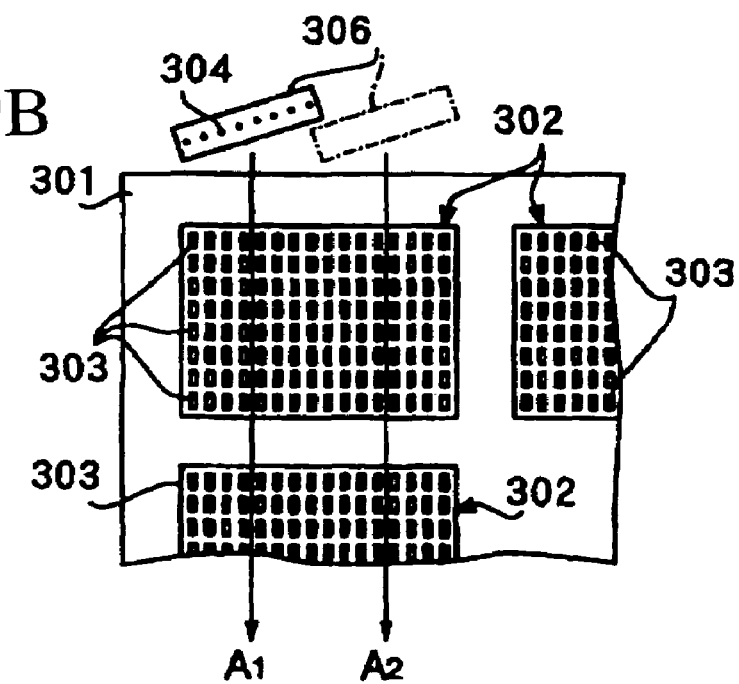
Figure 29C:
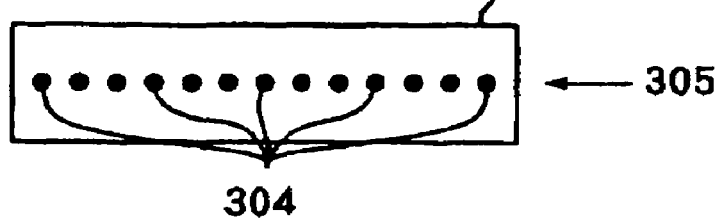

FIG. 29 is an exploded perspective view showing the ink jet head 421. FIG. 8 consists of schematic sectional views of the ink jet head 421 for explanation of the operation of the ink jet head 421 for discharge of filter element material 13, and, in detail, FIG. 8(A) shows the state of the ink jet head 421 before discharging filter element material 13, FIG. 8(B) shows its state when discharging filter element material 13 by contracting a piezoelectric drive element 452, and FIG. 8(C) shows its state directly after having discharged filter element material 13. FIG. 9 is an explanatory view for explanation of the discharge amount of filter element material by the ink jet head 421. And FIG. 10 is an overall schematic view for explanation of the situation of arrangement of the ink jet head 421. Moreover, FIG. 11 is a magnified view showing a portion of FIG. 10.

Figure 7:
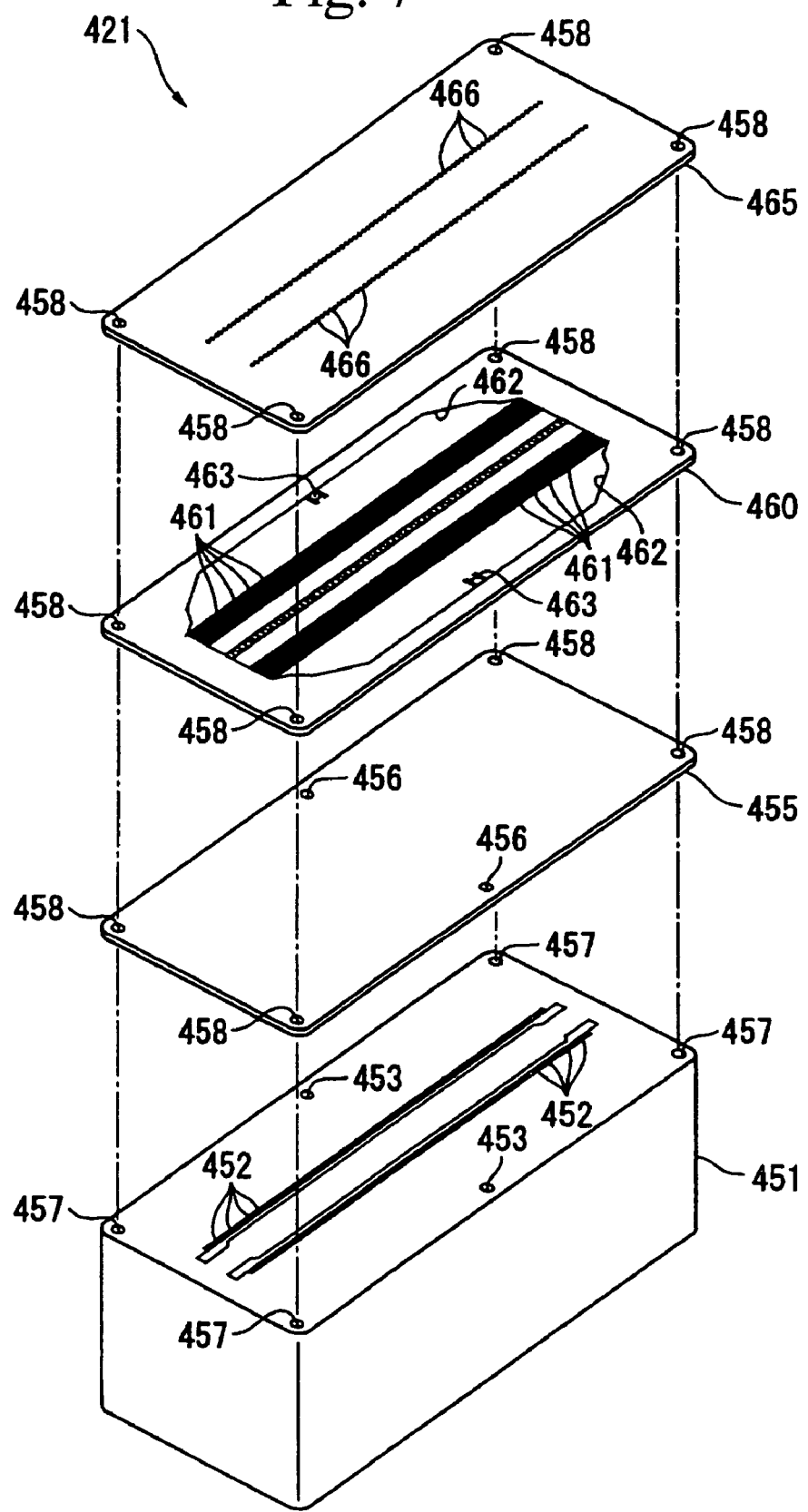
FIG. 7 is an exploded perspective view of the same ink jet head.

The ink jet head 421, as shown in FIG. 7, comprises a roughly rectangular shaped holder 451. In this holder 451 there are provided two rows of piezoelectric drive elements 452 which extend along the longitudinal direction, each including, for example, 180 individual piezo elements. Furthermore, through holes 453 are provided in the holder 451, roughly on both sides thereof in the center, for conducting flows of the filter element material 13, i.e. of the ink, and these through holes 453 connect to the flow conduits 438 of the print substrate plate 435.

Furthermore, as shown in FIG. 7, an elastic plate 455 which is made from composite resin in the form of a sheet is integrally provided upon the upper surface of the holder 451, which is the surface upon which the piezoelectric drive elements 452 are positioned. Communicating holes 456 which connect to the through holes 453 are provided upon this elastic plate 455. And engagement holes 458 are provided through this elastic plate 455 for engagement with position determination claw portions 457 which project from the upper surface of the holder 451, approximately at its four corners, so as to fix the position of the elastic plate 455 upon the upper surface of the holder 451 and to hold it integrally thereupon.

Furthermore, a planar flow conduit definition plate 460 is provided upon the upper surface of the elastic plate 455. In this flow conduit definition plate 460 there are provided: two rows of nozzle grooves 461, each formed as a line extending in the longitudinal direction of the holder 451 of 180 elements, elongated in the width direction of the holder 451, which correspond to the piezoelectric drive elements 452; two opening portions 462 which are provided in elongated form in the longitudinal direction of the holder on either side of these nozzle grooves 461; and two flow apertures 463 which connect to the communicating holes 456 of the elastic plate 455. And engagement holes 458 are provided in this planar flow conduit definition plate 460 for engagement with the position determination claw portions 457 which project from the upper surface of the holder 451 approximately at its four corners, and thereby the planar flow conduit definition plate 455 is fixed upon the upper surface of the holder 451 and is held integrally thereupon, along with the elastic plate 455.

Furthermore, a roughly planar nozzle plate 465 is provided upon the upper surface of the flow conduit definition plate 460. And two nozzle rows are provided in this nozzle plate 465 to extend in the longitudinal direction of the holder 451, each of these two rows, in this example, being about 25.4 mm (1 inch) long, and consisting of 180 roughly circular shaped nozzles 466 which correspond to the nozzle grooves 461 which are formed in the flow conduit definition plate 460. And engagement holes 458 are provided in the nozzle plate 465 for engagement with the position determination claw portions 457 which project from the upper surface of the holder 451 approximately at its four corners, and thereby this nozzle plate 465 is fixed upon the upper surface of the holder 451 and is held integrally thereupon, along with the elastic plate 455 and the planar flow conduit definition plate 460.

And, as schematically shown in FIG. 8, along with a liquid reservoir 467 being defined, by the elastic plate 455, the flow conduit definition plate 460 and the nozzle plate 465, as a compartment at the opening portions 462 of the flow conduit definition plate 460, this liquid reservoir 467 is connected via a liquid supply conduit 468 to each of the nozzle grooves 461. Due to this, the ink jet head 421 operates the piezoelectric drive elements 452 to magnify the pressure within the nozzle grooves 461, and discharges filter element material 13 from the nozzles 466 at a speed of 7±2 m/sec as liquid drops of mass 2-13 pl, for example about 10 pl. In other words, referring to FIG. 8, by supplying a predetermined supply voltage Vh in the form of pulses to the piezoelectric drive element 452, as shown in order in FIGS. 8(A), 8(B), and 8(C), the piezoelectric drive elements 452 are appropriately expanded and contracted along the direction of the arrow Q, and thereby pressure is applied to the filter element material 13, in other words to the ink, so as to discharge the filter element material from the nozzles 466 as liquid drops 8 of a predetermined mass.

Furthermore, with this ink jet head 421, as has also been explained with regard to the above described preferred embodiments, it may happen that the discharge amount at either or both of the end portions of the nozzle rows along the direction in which they extend may become great as shown in FIG. 9, so that undesirable deviations may occur in the amount of discharge. Due to this, control is exerted so as not to discharge filter element material 13 from the nozzles 466 for which the undesirable deviations of the discharge amounts are to be restrained within a range of, for example, 5%, in other words from about 10 of the nozzles 466 at each end of each row.

And, as shown in FIG. 1 through FIG. 5, the head main body portion 430 which is included in the head unit 420 comprises a plurality of head devices 433 which comprise ink jet heads 421, mutually arranged in a row. The arrangement of these head devices 433 upon the carriage 426 is that, as schematically shown in FIG. 10, they are arrayed generally along the Y axis direction which is the widthwise scanning direction, while being offset along a direction which is inclined with respect to the X axis direction, which is the main scanning direction and is perpendicular to the Y axis direction. In other words, for example, six such head devices 433 are arranged in a row in a direction which is somewhat inclined from the Y axis direction which is the widthwise scanning direction, and several such rows are provided, for example two rows. This is a method for arrangement which has been conceived of due to the circumstance that it is necessary for the rows of nozzles 466 to be arrayed in a continuous series along the Y axis direction, while on the other hand it is not possible to shorten the space left open between each ink jet head 421 and the next one neighboring it, since the width in the longer direction of the head devices 433 is greater than that of the ink jet heads 421.

Furthermore, in the head main body portion 430, the head devices 433 are arranged roughly in point symmetry, with the longitudinal directions of the ink jet heads 421 being inclined to the direction (the Y axis direction) which is perpendicular to the X axis direction, and moreover with the connectors 441 being positioned at the opposite side to the relatively opposing direction. These head devices 433 may be arranged so that the direction of provision of their nozzles 466, which is the longitudinal direction of the ink jet heads 421, is inclined at, for example, 57.1 degree with respect to the X axis direction.

Furthermore, the head devices 433 are arranged in roughly a staggered arrangement, in other words so that they are not positioned in a direct series along the direction in which they are arranged. In other words, as shown in FIGS. 2 through 5 and in FIG. 10, the ink jet heads 421 are arranged in two rows, with the nozzles 466 of the twelve (in this example) ink jet heads 421 being arranged continuously along the Y axis direction, and moreover with the orders in which they are arranged along their Y axis direction being arranged mutually differently, so that they alternate.

This matter will now be explained in concrete terms and in more detail, based upon FIG. 10 and FIG. 11. Therein, on the ink jet head 421, the direction in which the nozzles 466 are arrayed, which is the longitudinal direction, is tilted with respect to the X axis direction. Due to this, a region A (a region of non-discharging nozzles), which comes to be positioned within the ten nozzles which do not discharge on the other second row of the nozzles 466, is present (A in FIG. 11) upon the straight line in the X axis direction upon which the eleventh nozzle 466 in the first row among the two rows of nozzles 466 which are provided to the ink jet head 421, and which discharges filter element material 13, is positioned. In other words, with a single ink jet head 421, a region A occurs in which no two discharge nozzles 466 are present upon a straight line in the X axis direction.

Accordingly, as shown in FIG. 10 and FIG. 11, no other head devices 433 which form the row are positioned in a parallel state along the X axis direction over the region B (B in FIG. 11) in which two discharge nozzles 466 of a single ink jet head 421 are positioned upon a straight line in the X axis direction. Furthermore, the region A of a head device 433 which defines one row in which only one discharge nozzle 466 is positioned upon the straight line in the X axis direction, and the region A of a head device 433 which defines the other row in which only one discharge nozzle 466 is positioned upon the straight line in the X axis direction, are positioned in a state of being mutually parallel in the X axis direction, while, with an ink jet head 421 of one row, and an ink jet head 421 of the other row, the situation is that a total of two discharge nozzles 466 are positioned upon a straight line in the X axis direction.

In other words, over the region in which the ink jet heads 421 are arranged, they are arranged in a staggered manner (mutually differing) in two rows, so that, in whatever position, without any doubt, a total of two of the nozzles 466 are positioned upon any line in the X axis direction. It should be understood that the nozzles 466 in the regions XX in which the nozzles 466 do not discharge filter element material 13 are not counted as being included in the count of two nozzles 466 upon any straight line in the X axis direction.

In this manner, with regard to the X axis direction along which main scanning is performed, two of the nozzles 466 which actually discharge ink are positioned upon a fictitious straight line which extends along the scanning direction (the straight line itself is not something which actually exists); and, as will be described hereinafter, ink comes to be discharged upon a single spot from both of these two nozzles 466. If a single element is built up in this manner by discharge from several different ones of the nozzles 466, undesirable deviations of discharge between the various ones of the nozzles 466 are dispersed, and it becomes possible to anticipate an evening of the characteristic between the various elements and an enhancement of yield, since, when a single element is built up by discharge from only a single nozzle 466, undesirable deviations in the discharge amounts between different ones of the various nozzles 466 are linked with undesirable deviations in the characteristics of the elements and with a deterioration in the yield.

—Structure of the Ink Supply Section—

The ink supply section 431, as shown in FIGS. 2 through 5, comprises a pair of planar fitting plates 471 which are provided to correspond to the two rows of the head main body portions 430 respectively, and a plurality of supply main body portions 472 which are fitted to these fitting plates 471. And the supply main body portions 472 comprise reciprocating portions 474 which are generally shaped as thin cylinders. These reciprocating portions 474 are fitted with a fitting jig 473 so as to pass through the fitting plates 471 and so as to be shiftable along their axial directions. Furthermore, the reciprocating portions 474 of the supply main body portion 472 are fitted so as to be biased in the direction to shift away from the fitting plate 471 towards the head device 433 by, for example, coil springs 475 or the like. It should be understood that, in FIG. 2, only one of the two rows of head devices 433 is shown in the ink supply section 431, while the other of the rows of head devices 433 is omitted for the convenience of explanation.

Flange portions 476 are provided at the ends of these reciprocating portions 474 which oppose the head device 433. These flange portions 476 project like brims from the outer peripheral edges of the reciprocating portions 474, and their end surfaces contact against the seal members 449 of the ink supply section 443 of the head device 433, and are impelled by the biasing action of the coil springs 475 so that they form a substantially liquid tight seal thereagainst. Furthermore, joint portions 477 are provided at the opposite end portions of the reciprocating portions 474 to the ends where the flange portions 476 are provided. These joint portions 477 are connected to the one ends of supply conduits 478 which conduct flows of filter element material 13, as schematically shown in FIG. 1.

These supply conduits 478, as described above and as schematically shown in FIG. 1, are connected to the widthwise scanning drive device 427 so as not to influence the shifting of the head unit 420, and, as schematically shown by the single dotted broken lines in FIGS. 2 and 4, they are arranged from the widthwise scanning drive device 427 roughly centrally between the ink supply sections 431 which are arranged in two rows upon the head unit 420, and furthermore their tip ends radiate out from the pipe-work and are connected to the joint portions 477 of the ink supply sections 431.

And the ink supply sections 431 supply filter element material 13 which is conducted via the supply conduits 478 to the ink supply sections 443 of the head devices 433. Furthermore, the filter element material 13 which is supplied to the ink supply sections 443 is supplied to the ink jet heads 421, is discharged in the form of appropriate liquid drops from each of the nozzles 466 of the ink jet heads 421, according to electrical control.

—Operation of Manufacture of the Color Filter—

—Preparatory Processing—

Next, the operation of manufacturing a color filter 1 using the above described device for manufacture of a color filter according to the above described preferred embodiment of the present invention will be explained with reference to the drawings.

Figure 13:
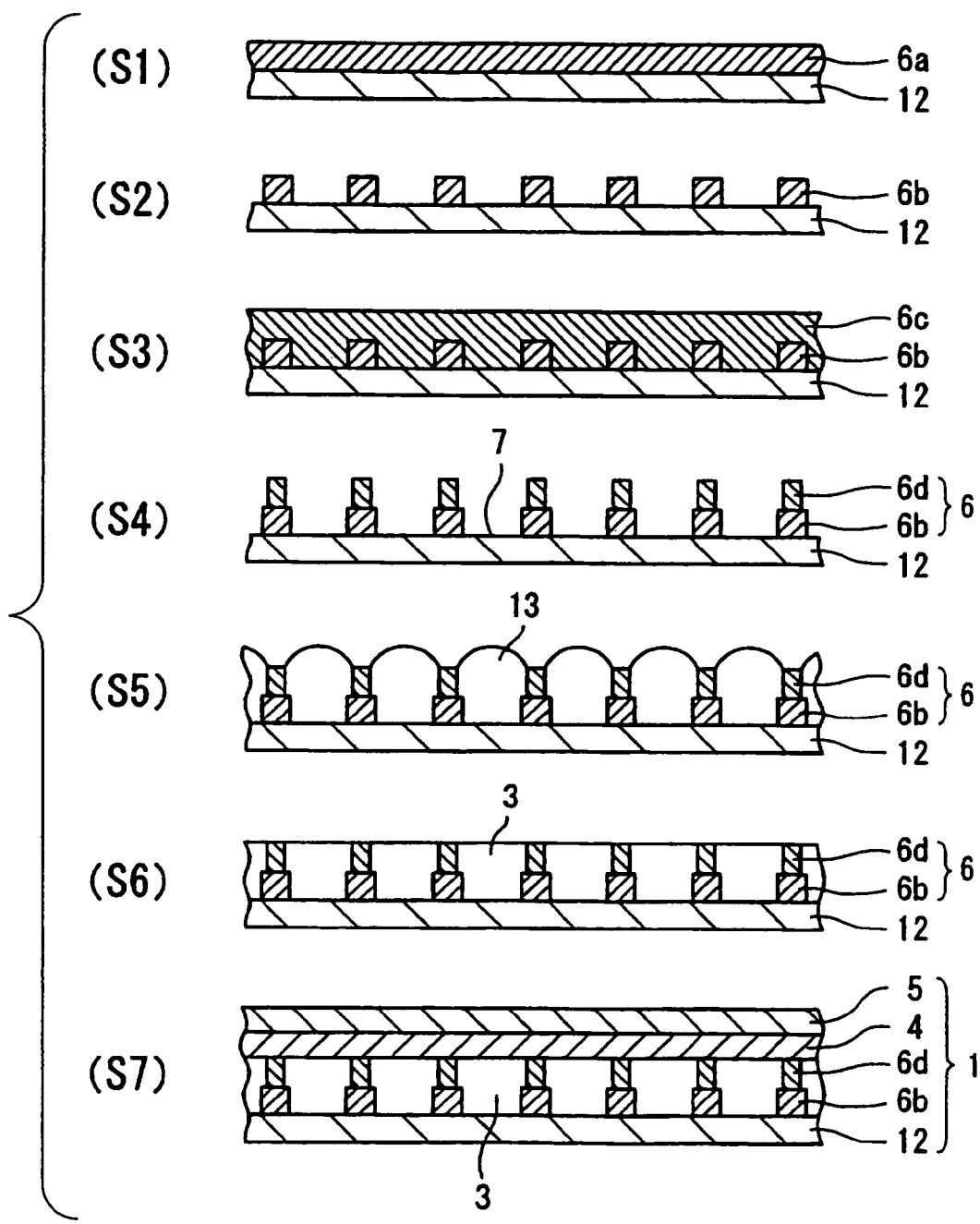
FIG. 13 is a manufacturing process sectional view for explanation of the procedure for manufacturing this color filter.

FIG. 13 is a manufacturing process sectional view for explanation of the procedure of manufacture of the color filter 1, using the above described device for manufacture of a color filter according to this preferred embodiment.

First the surface of a motherboard 12, which is a transparent substrate plate made from non-alkaline glass of dimensions, for example, 0.7 mm thick, 38 cm high, and 30 cm wide, is cleaned with a cleaning fluid which is 1% by mass of hydrogen peroxide added to hot sulfuric acid. After this cleaning, the plate is rinsed with water and dried in air, so that a clean surface is obtained. A chromium layer of average thickness 0.2 µm is formed upon the surface of this motherboard 12

(in a procedure S1 in FIG. 13) by, for example, a spattering method, so as to obtain a metallic layer 6a.

After drying this motherboard 12 upon a hot plate at a temperature of 80 degree Celsius is for five minutes, a layer of photo-resist not shown in the figures is formed upon the metallic layer 6a by, for example, spin coating. A mask film not shown in the figures upon which is painted, for example, a required matrix pattern is adhered upon the surface of this motherboard 12, and the whole is then exposed to ultraviolet light. Next, this motherboard 12 which has been thus exposed is immersed in, for example, an alkaline developing fluid which contains 8% by mass of potassium oxide, and the non-exposed portion of the photo-resist is thereby eliminated, so that the resist layer is patterned. Next, the exposed portion of the metallic layer 6a is removed by etching with an etching liquid of which, for example, the main component is hydrochloric acid. By doing this, a reticulated light interception layer 6b is obtained (in a procedure S2 in FIG. 13); this layer 6b is in the form of a black matrix having the predetermined matrix pattern. It should be understood that the thickness of this light interception layer 6b is about 0.2 μm, while the widthwise dimension of the strands which make up this light interception layer 6b is about 22 μm.

Next, a negative type transparent acrylic type light sensitive resin composition material layer 6c is formed upon the motherboard 12 equipped with this light interception layer 6b by, for example, a spin coating method or the like (in a procedure S3 in FIG. 13). After pre-baking the motherboard 12 equipped with this light sensitive resin composition material layer 6c at a temperature of 100 degree Celsius for a period of 20 minutes, it is exposed to ultraviolet light using a mask film not shown in the figures which is painted thereon in the form of a matrix pattern. And the non exposed portion of the resin is developed by, for example, an alkaline developing fluid like the type described above, and, after the work-piece has been rinsed with pure water, it is spin dried. After-baking is then performed at, for example, a temperature of 200 degree Celsius for a period of 30 minutes, and thereby, when the resin portion has been sufficiently cured, a reticulated bank layer 6d is formed. The thickness of this bank layer 6d may be, for example, an average of 2.7 μm, and the widthwise dimension of the strands which make it up may be, for example, about 14 μm. The division walls 6 are constituted (in a procedure S4 in FIG. 13) by this bank layer 6d and the light interception layer 6b.

Next the work-piece is processed with dry etching, in other words with plasma processing, in order to improve the wettability by ink of the filter element formation regions 7 (and particularly of the exposed surfaces of the motherboard 12), which are the regions, destined for adhesion of a color filter material layer, into which the motherboard has been compartmented by the light interception layer 6b and the bank layer 6d which have been produced as described above. In concrete terms, the preliminary processing process of the motherboard 12 is completed by forming a plasma processing etching spot in which a high voltage is applied in a mixture gas consisting, for example, of helium with a 20% admixture of oxygen, and by passing the motherboard 12 through this etching spot which has been formed and etching it.

—Discharge of the Filter Element Material—

Next, filter element material 13 of each of the colors red (R), green (G), and blue (B) is fed by an ink jet method into the filter element formation regions 7 which have been defined by the division walls 6 by dividing up the motherboard 12 by the above described preliminary processing which has been thus performed; in other words, ink is discharged into these regions 7 (in a procedure S5 in FIG. 13).

When discharging this filter element material 13 by this ink jet method, the head unit 420 comprising the predetermined nozzle plate 465 of the above described specification is made and assembled in advance. And, in the liquid drop discharge devices of each of the liquid drop discharge processing devices 405R, 405G, and 405B, the discharge amount of the filter element material 13 which is discharged from a single one of the nozzles 466 of each of the ink jet heads 421 is adjusted to a predetermined amount, for example approximately 10 pl. On the other hand, the division walls 6 are formed in advance upon the one surface of the motherboard 12 in a lattice pattern.

And, first, the motherboard 12 which has been subjected to the above described preliminary processing is transported by a transport robot not shown in the figures to the interior of the liquid drop discharge processing device 405R for R color ink, and is placed upon the pedestal portion within this liquid drop discharge processing device 405R. The motherboard 12 is then fixed in position upon this pedestal portion by, for example, suction, so that its position is positively determined. And the position of the motherboard 12 held upon the pedestal portion is checked with various cameras and the like, and it is shifted by the main scanning drive device 425 and is controlled so as to be regulated to a suitable predetermined position. Furthermore, the head unit is suitably shifted by the widthwise scanning drive device 427, and its position is detected. After this, the head unit 420 is shifted in the widthwise scanning direction, and the discharge state of from the nozzles 466 is detected with the dot missing detection unit 487, and if it is detected that no improper discharge state is occurring, the head unit 420 is shifted into its initial position.

After this, the motherboard 12 is scanned in the X direction by the main scanning drive device 425 while being held upon the movable pedestal portion, and appropriate filter element material 13 is discharged from predetermined ones of the nozzles 466 of suitable ones of the ink jet heads 421 while shifting the head unit 420 relative to the motherboard 12, and is filled into the concave portions into which the motherboard 12 has been compartmented by the division walls 6. This discharge from the nozzles 466 is controlled by a control device not shown in the figures, so as not to discharge filter element material 13 from the nozzles 466 which are positioned in a predetermined region X at both end portions in the direction in which the nozzles 466 shown in FIG. 11 are arranged, for example from the 10 nozzles 466 at each end of this row arrangement, while on the other hand a comparatively uniform amount of the filter element material 13 is discharged from the 160 nozzles 466 (for example) which are positioned at the central portion of this row arrangement.

Furthermore, since two of the discharges from the nozzles 466 are positioned upon a straight line in the scanning direction, in other words, since two of the nozzles 466 are positioned upon a single scanning line, and since, during shifting, two dots—in more detail, two liquid drops of filter material 13 as one dot from a single nozzle 466—are discharged into a single concave portion (a single filter element formation region 7), accordingly a total of eight liquid drops are thus discharged. The state of discharge during each single episode of shifting scanning is detected by the dot missing detection unit 487, and it is checked that no missing of dots is taking place.

If the occurrence of dot missing is detected, the head unit 420 is shifted by a predetermined amount in the widthwise scanning direction, and the operation of discharging filter element material 13 is again repeated while shifting the pedestal portion which is holding the motherboard 12, so as to form the filter elements 3 in the predetermined filter element formation regions 7 of the predetermined color filter formation regions 11.

—Drying and Curing—

And, the motherboard 12 upon which the R color filter element material 13 has been discharged is taken out from the liquid drop discharge processing device 405R by a transport robot not shown in the figures, and then is put into a multi stage baking furnace also not shown in the figures, in which the filter element material is dried by, for example, heating the motherboard 12 up to 120 degree Celsius for five minutes. After this drying, the motherboard 12 is taken out from the multi stage baking furnace by a transport robot, and is transported while it cools down. After this, the motherboard is transported from the liquid drop discharge processing device 405R in order to a liquid drop discharge processing device 405G for G color filter element material 13, and then to a liquid drop discharge processing device 405B for B color filter element material 13, and therein G colored and B colored filter element material 13 is discharged in order into the predetermined filter element formation regions 7, in the same manner as was done for making the R colored filter portions. And the motherboard 12 upon which these three colors of filter element material 13 have been discharged, and which has been dried, is recovered and is subjected to heat processing, in other words is heated up so that the filter element material 13 is hardened and is better adhered (in a procedure S6 in FIG. 13).

—Manufacture of the Color Filter—

After this, a protective layer 4 is formed over substantially the entire surface of the motherboard 12 upon which the filter element 3 has been formed as described above. Furthermore, an electrode layer 5 made from ITO (Indium Tin Oxide) is formed in an appropriate pattern upon the upper surface of this protective layer 4. After this the motherboard is broken apart into the individual separate color filter formation regions 11, so as to form a plurality of color filters 1 (in a procedure S7 in FIG. 13). As has been explained in connection with previously described embodiments of the present invention, each of these substrate plates upon which a color filter 1 has been formed is utilized as one of the substrate plates for a liquid crystal device.

—Effects of the Device for Manufacture of the Color Filter—

According to this preferred embodiment shown in FIGS. 1 through 13 further beneficial operational effects are experienced.

In detail, the ink jet heads 421, upon one surface of which are arranged the plurality of nozzles 466 from which the filter element material 13, for example ink, which is a liquid mass which has a certain flowability, is arranged on the one surface of the print substrate plate 435. The head device 433 which acts as the discharge means provides the connector 441 to be connected with a control means which controls the nozzle 466 to suitably discharge the filter element material 13 so as to extrude from the peripheral of the ink jet head 421. The head device 433 discharges the filter element material 13 to a predetermined portion of the motherboard 12 by using the carriage 426 which provides a portion on which a part of the connectors 441 of the print substrate plate 435 are aligned so as not to face another portion on which the other of the connectors 441 are aligned. The carriage 426 moves along the surface of the motherboard 12 relative to the motherboard 12 while one surface of the ink jet head 421 which comprises the nozzles 466 face to the surface of the motherboard with a predetermined distance. Because a plurality of the head device 433 which comprises the ink jet heads 421 and the connectors 441, which are mounted on the carriage 426 by a predetermined alignment, the discharge device is composed easier comparing with composing the plurality of ink jet heads 421 and the connectors 421 relative to the ink jet heads 421 without mounting on the carriage, and therefore it is possible to increase a product efficiency. The head devices 433 are held by the carriage 426 in a manner that the portion where the connectors 441, by which the control device which controls the discharge of filter element material 13 from the nozzles 466 of the ink jet head 421 are electrically connected, of one group of head device 433 is orientated not to face to the ink jet head 421 of the other group of head device 433, and the portion where the connectors 442 of one group are arranged is orientated to an outside which is oppose to the ink jet head 421 of the other group. Therefore, an efficiency of wiring to the connectors 441 becomes easier and an efficiency of composing increases. Further, in influence of an electrical noise from a portion where the connectors 441 are located to another portion decreases, and therefore, it is possible to stably discharge the filter element materials 13.

The print substrate plate 435 is formed like a shape of a rectangular card. The ink jet head 421 is arranged in one longitudinal end portion of the print substrate plate 435 and the connector 441 is arranged in another longitudinal end portion of the print substrate plate 435. It is possible to complete a layout in which the connectors 441 in one of the groups of the head device 433 is orientated so as not to face to the ink jet heads 421 of the other of the groups of the head device 433. Due to the above layout, it is possible to arrange the ink jet head 421 apart from the connector 441, and therefore, the wirings to the connectors 441 become to be easier and the efficiency of maintaining of the wiring also becomes to be easier.

Further, the ink jet heads 421 are arranged in one end of the print substrate plate 435 having a rectangular shape, and the connectors are arranged in the other end of the print substrate plate 435. Therefore, in a case where the head devices 433 are aligned along a single line, an interference between connectors 441 in one of the head devices 433 and connectors in the other of the head devices 433 will be prevented and minimize an outline of the head devices 433. A line through which necessity numbers of nozzles 466 are aligned is formed, therefore an area in which any nozzles 466 do not exist is minimized along the main scanning direction without using an ink jet head having a great number of nozzles which are aligned in a longitudinal direction.

Because the ink jet heads 421 in one of the groups are orientated point symmetrically to the ink jet heads 421 in the other of the groups, it is possible to simplify the alignment of the supply conduits 478 in a vicinity of the head unit 420 so as to easily compose and maintain the device.

Because, the connecting wires 442 for controlling the ink jet heads 421 are wired from the outer periphery of the head unit 420, namely from the outer periphery of the carriage 426, an influence of the electrical noise from the connecting wires 442 is omitted so that a fine printing pattern is obtained. The connecting wires 442 can be wired apart from the supply conduits 478, therefore it is possible to compose the head unit 420 in ease and damages on the connecting wires 442 and supply conduits 478 and a fluctuation in the discharge of the filter element material 13 due to an entanglement of the connecting wires 442 and supply conduits 478 are prevented.

Because the connectors 441 in one of the groups are aligned by a point symmetrical manner so as not to face to the connectors 441 in the other of the groups, the connectors 441 are protected from an electrical noise nearby the connectors 441 and a fine printing can be performed.

Furthermore, the ink jet heads 421 in which the nozzles 466 which discharge filter element material 13 which is a liquid having a certain flowability, for instance a ink, are provided on a single surface upon a plurality of substantially straight lines, and this surface is shifted relatively along the surface of the motherboard 12 while maintaining the state in which a predetermined gap is kept between the surface upon which these nozzles 466 of the ink jet heads 421 are arranged and the surface of the motherboard 12, which is the object against which the liquid drops are to be discharged, and the filter element material 13 is discharged against the surface of the motherboard 12 from the nozzles which are positioned in the central portions of the rows, excluding the predetermined regions XX, in other words without discharging any filter element material from, for example, those ten nozzles 466 (the non discharge nozzles), among all the nozzles 466 of the ink jet heads 421, which are positioned in the predetermined regions XX at both ends of the direction in which these nozzles 466 are arranged.

Since with this structure the filter element material 13 is discharged using the nozzles 466 in the central portion of each row where the discharge amounts are comparatively uniform, without discharging any liquid drops from the ten nozzles 466 at each end of each row, which are the predetermined regions positioned at both ends of the direction in which the nozzles 466 are arranged from which the discharge amounts would become particularly great, accordingly it is possible to discharge the filter element material against the surface of the motherboard 12 evenly and uniformly, and a uniform color filter 1 is obtained of an even quality, so that a desirable display is obtained from the resulting display device which is an electro optical device, using this color filter 1.

And, since no filter element material 13 is discharged from those nozzles 466 for which, if such discharge were to be performed, the discharge amounts would be more than about 10% greater than the average value of discharge amount of filter material, accordingly, even in the particular cases of using, as the liquid mass, a functional liquid mass of filter element material 13 for a color filter 1, or electro-luminescent material, or one including electrically charged grains for use in an electrical migration device or the like, no undesirable deviations occur in the performance characteristics, and it is possible reliably to obtain the desired characteristic for the electro optical device such as an electro-luminescent device or a liquid crystal device.

Furthermore, since the filter element material 13 is discharged from the various nozzles 466 in amounts which vary within ±10% of the average value, accordingly the discharge amounts are comparatively uniform, and the discharge upon the surface of the motherboard 12 is flat and uniform, so that it is possible to obtain an electro optical device whose characteristic is a desirable one.

And, by using ink jet heads 421 whose nozzles 466 are arranged upon a straight line at approximately equal intervals, it is possible easily to paint a structure upon the motherboard 12 according to any predetermined standard pattern, such as, for example, a stripe type pattern, a mosaic type pattern, a delta type pattern, or the like.

Furthermore since, with this structure of the ink jet heads 421 in which their nozzles 466 are arranged upon a straight line at approximately equal intervals, the nozzles 466 are provided at approximately equal intervals along the longitudinal directions of the ink jet heads 421 which are formed as elongated rectangles, accordingly it is possible to make the ink jet heads 421 more compact, and, since interference between adjacent portions of each ink jet head 421 and the neighboring ink jet head 421 is prevented, accordingly this size reduction can be performed easily.

Yet further, since the ink jet heads 421 are relatively shifted in a direction which intersects the direction in which the nozzles 466 are arranged in a state in which the direction of arrangement of the nozzles 466 is inclined to the shifting direction, accordingly the pitch between the elements, which is the interval at which the filter element material 13 is discharged, comes to be narrower than the pitch between the nozzles 466, so that, only by setting the state of inclination suitably, it is easily possible to make the pitch between the elements which is anticipated when discharging the filter element material 13 against the surface of the motherboard 12 in a dot pattern correspond to the desired such pitch, and it is no longer necessary to make the ink jet heads 421 in correspondence to the pitch between the elements, so that the general applicability is enhanced.

And, the plurality of ink jet heads 421 to which the plurality of nozzles 466 which discharge filter element material 13, for example ink, as a liquid mass which has a certain flowability are provided upon a single surface are relatively shifted along the surface of the motherboard 12 in a state in which the surface in which these nozzles 466 of the ink jet heads 421 are provided is opposed to the surface of the motherboard 12, which is the object against which liquid drops are to be discharged, with a predetermined gap being left therebetween, and the same filter element material 13 is discharged against the surface of the motherboard 12 from each of the nozzles 466 of the plurality of ink jet heads 421. Due to this, it becomes possible to discharge the filter element material 13 over a wide range by using ink jet heads 421 which have, for example, the same number of nozzles 466, and which are of the same specification, so that there is no requirement to use an ink jet head of a special longitudinal dimension, and accordingly it is possible to avoid using components of a plurality of different specifications, as was the case with the prior art, so that it is possible to lower the overall cost.

Furthermore, by for example appropriately setting the number of the ink jet heads 421 which are arranged along the direction in which they are provided, it becomes possible to make them correspond to the region over which the filter element material 13 is to be discharged, and accordingly it becomes possible to enhance the wideness of applicability.

Furthermore, since a plurality of ink jet heads 421 are provided, accordingly, even in the case, for example, that the region upon the motherboard 12 upon which the filter element material 13 is to be discharged is quite wide, or that it is necessary to discharge the filter material 13 several times upon the same spot in a superimposed manner, or the like, it is not necessary to shift the ink jet head 421 a plurality of times, and furthermore it is also not necessary to manufacture a special ink jet head, so that it is possible to discharge the filter element material 13 easily with a simple structure.

Even further, by utilizing components of the same format which have the same number of nozzles for the plurality of ink jet heads 421, by suitably arranging them, it becomes possible to make them correspond to the region over which the liquid mass is to be discharged, even though only a single type of ink jet head 421 is used, so that the structure is simplified, the manufacturability is enhanced, and also it is possible to reduce the cost.

Moreover, since the head unit 420 is made with the plurality of ink jet heads 421 arranged in the carriage 426 in the state in which all the respective arrangement directions of the nozzles 466 are roughly parallel to one another, accordingly, if for example the directions in which the nozzles 466 are arranged are substantially parallel, the region in which the nozzles 466 are arranged becomes wider, it becomes possible to discharge the filter element material 13 over a wider range, and the discharge efficiency is enhanced; and, further, if they are arranged so as to be parallel along the direction of shifting of the ink jet heads 421, it becomes possible to discharge the filter element material 13 from the different ink jet heads 421 upon a single spot in a superimposed manner, and it is possible easily to make the discharge amounts in the discharge region uniform, so that it is possible to obtain a desirably stabilized painting process.

And, because each of the plurality of ink jet heads 421 is inclined in a direction which intersects the main scanning direction, and moreover they are provided as being arranged in rows in a direction which is different from the longitudinal direction of the ink jet heads 421 so that the direction in which all of the nozzles 466 are arranged are mutually parallel, thereby the pitch between elements, in other words the interval between discharges of the filter element material 13, becomes shorter than the pitch between the nozzles, and, if for example the motherboard 12 against which the filter element material 13 is to be discharged is to be utilized as a display device or the like, it becomes possible to manufacture a finer display. Yet further, it is possible to prevent interference between neighboring ones of the ink jet heads 421, and accordingly a reduction in size can be anticipated. And, moreover, by suitably setting this inclination angle, it is possible suitably to set the pitch in which the dots are painted, so that it is possible to enhance the universality of applicability.

Furthermore, since the plurality of ink jet heads 421 are arranged in a plurality of rows, for example in two rows, which are mutually different (roughly in staggered form), accordingly it is not necessary to manufacture any special ink jet head having a special or a very long lengthwise dimension, and, even if ink jet heads 421 are used which are pre-existing components, not only do neighboring ink jet heads 421 not interfere with one another, but regions do not occur between ink jet heads 421 in which no filter element material 13 is discharged, and accordingly it becomes possible to discharge the filter element material continuously in a suitable manner, in other words to perform continuous painting.

In detail, the ink jet heads 421, upon one surface of which are arranged the plurality of nozzles 466 from which the filter element material 13, for example ink, which is a liquid mass which has a certain flowability, are shifted relatively to the motherboard 12, which constitutes an object against which liquid drops are to be discharged, so as to follow along its surface, in a state in which the surfaces of the ink jet heads 421 in which the nozzles 466 are provided are opposed to the surface of the motherboard 12 with a predetermined gap being present between them, and filter element material 13 is discharged from a plurality, for example from two, of the nozzles 466 which are positioned upon the same straight line which extends along this relative shifting direction. According to this, a structure is obtained which discharges filter element material 13 from two different nozzles in a superimposed manner, so that, even if hypothetically undesirable deviations are present in the discharge amounts between different ones of the plurality of nozzles 466, it is possible to average out the discharge amounts of the filter element material 13 which are discharged, and to prevent undesirable deviations of the total thereof, so that an even and uniform discharge in a plane to be discharged is obtained, and it is possible to obtain an electro optical device which has a uniform and desirable characteristic quality in a plane to be displayed.

Yet further, since the dot missing detection unit 487 is provided and detects the quality of the discharge of the filter element material 13 from the nozzles 466, accordingly it is possible to prevent uniformity in the discharge of the filter element material 13, and it becomes possible to discharge the filter element material accurately in a desirable manner, in other words to perform high quality painting.

And, since an optical sensor is provided to the dot missing detection unit 487, and the passage of the filter element material 13 in a direction which intersects the proper discharge direction for the filter element material 13 is detected by this optical sensor, accordingly it is possible to detect the state of discharge of the filter element material 13 accurately with a simple structure, and it becomes possible to prevent mura in the discharge of the filter element material 13, so that it becomes possible to discharge the filter element material accurately in a desirable manner, in other words to perform high quality painting.

Moreover, since the discharge situation is detected by the dot missing detection unit 487 both before and after the process of discharging the filter element material 13 from the nozzles 466 against the motherboard 12, accordingly it is possible to detect the state of discharge directly before and directly after the discharge of the filter element material 13 for painting, and thus the state of discharge is accurately detected, and it becomes possible to obtain a desirable quality of painting by accurately preventing the occurrence of dot missing. It should be understood that it would also, as an alternative, be acceptable to perform detection of the state of discharge only at a time point before, or only at a time point after, the actual discharge for painting the motherboard 12.

Furthermore, since the dot missing detection unit 487 is provided on the main scanning direction side of the head unit 420, accordingly it becomes possible to reduce the shifting distance of the head unit 420 due to the detection of the discharge state of the filter element material 13, and moreover it is possible to keep the shifting along the main scanning direction for discharge just as it is with a simple structure, and it is possible to detect dot missings at high efficiency with a simple structure.

Example of a Device which Utilises a Color Filter

Figure 50:
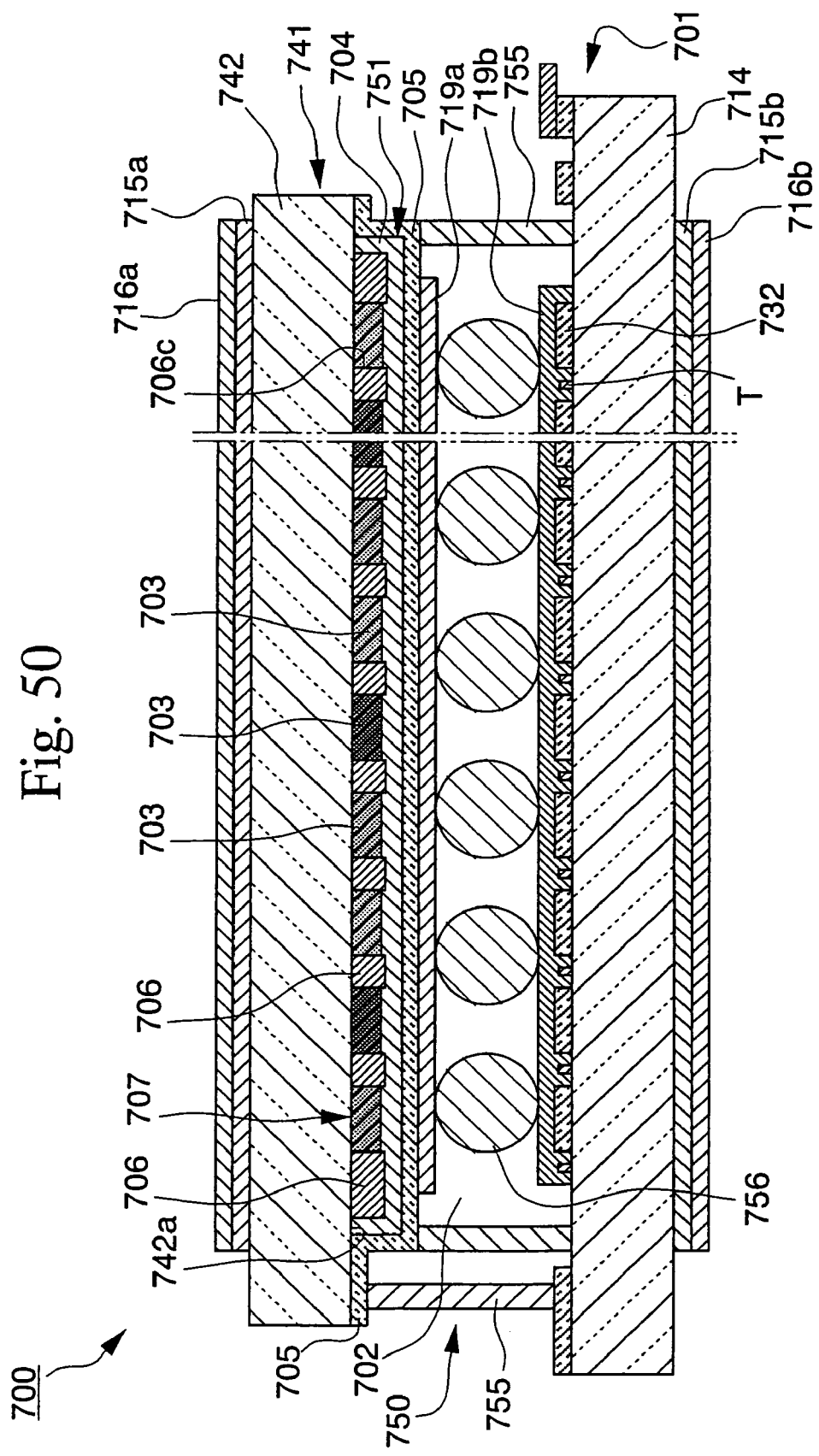
FIG. 50 is a figure showing the sectional structure of a liquid crystal device which is equipped with a color filter which is made by the manufacturing device according to the present invention.

Next, a color liquid crystal device of the active matrix type will be presented and explained below, as one example of an electro optical device which is fitted with a color filter according to the above described preferred embodiment of the present invention. FIG. 50 is a figure showing the sectional structure of a liquid crystal device which is equipped with a color filter according to this preferred embodiment.

The liquid crystal device 700 of this preferred embodiment of the present invention comprises, as its main element, a liquid crystal panel 750 which comprises a color filter substrate plate 741 and an active element substrate plate 701 which are arranged so as mutually to confront one another, a liquid crystal layer 702 which is sandwiched between these two substrate plates, a phase contrast plate 715a and a polarization plate 716a which are attached to the upper surface side (the observer's side) of the color filter substrate plate 741, and a phase contrast plate 715b and a polarization plate 716b which are attached to the lower surface side of the active element substrate plate 701. The liquid crystal device which is the final product is made by fitting peripheral devices such as driver chips for driving the liquid crystal material, various connecting wires for transmitting electrical signals a support member and the like to this liquid crystal panel 750.

The color filter substrate plate 741 is a display side substrate plate which is provided facing the side of the observer, and which has a light transparent substrate plate 742, while the active element substrate plate 701 is a substrate plate which is provided upon its opposite side, in other words upon its rear side.

This color filter substrate plate 741 principally comprises the light transparent substrate plate 742 which is made of a plastic film or a glass substrate plate of approximately 300 μm (0.3 mm) or the like, and a color filter 751 which is formed upon the lower side surface (in other words, upon the liquid crystal layer side surface) of this substrate plate 742.

The color filter 751 is made as a combination of division walls 706 which are formed upon the lower side surface (in other words, upon the liquid crystal layer side surface) of this substrate plate 742, filter elements 703 . . . , and a covering protective layer 704 which covers over the division walls 706 and the filter elements 703 . . . .

The division walls 706 are formed upon the one surface 742a of the substrate plate 742, and are built up in lattice form and are formed so as each to surround a filter element formation region 707, which is a region for formation of an adhered color layer which defines an individual filter element 703. These division walls 706 comprise a plurality of holes 706c . . . . Within each of the holes 706c, the surface of the substrate plate 742 is exposed. And the filter element formation regions 707 . . . are defined as compartments which are delimited by the inner walls of the division walls 706 (the wall surfaces of the holes 706c) and the surface of the substrate plate 742.

The division walls 706 are, for example, made from a black colored light sensitive resin layer, and, as such a black colored light sensitive resin layer, it is desirable for them to include, for example, at least one of a positive type or negative type light sensitive resin such as one which is used in a conventional photo-resist, and an black colored inorganic material such as carbon block or a black colored organic material. Since these division walls 706 include a black colored inorganic material or organic material, and are formed at all portions except those where the filter elements 703 are present, thus it is possible to intercept transmission of light between neighboring ones of the filter elements 703, and accordingly these division walls 706 are endowed with the function of serving as light interception layers.

The filter elements 703 are formed by injection according to an ink jet method, in other words by discharge, of filter element material of the various colors red (R), green (G), and blue (B) into the various filter element formation regions 707 which are defined across the substrate plate 742 between the inner surfaces of the division walls 706, and after this by drying out of this filter element material.

Furthermore an electrode layer 705 for liquid crystal drive, which is made from a transparent electrically conductive material such as ITO or the like, is formed upon the lower side (the liquid crystal layer side) of the protective layer 704, over substantially the entire surface of the protective layer 704. Moreover, an orientation layer 719a is provided to cover over this electrode layer 705 for liquid crystal drive upon its liquid crystal layer side, and also an orientation layer 719b is provided over a picture element electrode 732 upon the side of an opposite side active element substrate plate 701, which will be described hereinafter.

The active element substrate plate 701 is made by forming an insulating layer not shown in the figures upon a light transparent substrate plate 714, and by further forming, upon this insulating layer, a thin film transistor T which functions as a TFT type switching element and a picture element electrode 732. Furthermore, the structure includes a plurality of scan lines and a plurality of signal lines which are made, actually in the form of a matrix, upon the insulating layer which is formed upon the substrate plate 714; and one of the previously described picture element electrodes 732 is provided for each of the regions which are surrounded by these scan lines and signal lines, and a thin film transistor T is included at each position which electrically connects together each of the picture element electrodes 732 and its scan line and its signal line, so that, by applying an appropriate signal voltage to the scan line and the signal line, this thin film transistor T can be turned ON or OFF, thus performing control of the supply of electricity to its picture element electrode 732. Furthermore, the electrode layer 705 which is formed on the color filter substrate plate 741 upon the opposite side, in this preferred embodiment of the present invention, is made as a full surface electrode which covers the entire picture element region. It should be understood that various other possibilities for the connecting wire circuit for the TFTs, or for the picture element electrode configuration, may also be applied.

The active element substrate plate 701 and the color filter substrate plate (the opposing substrate plate) 741 are adhered together with a predetermined gap being maintained between them by the seal member 755 which is formed running around the outer peripheral edge of the color filter substrate plate 741. Furthermore, the reference symbol 756 denotes a spacer for holding the interval (the cell gap) between these two substrate plates fixed over the surfaces of the substrate plates. As a result, a rectangular liquid crystal enclosure region is defined as a compartment between the active element substrate plate 701 and the color filter substrate plate 741 by the seal member which, as seen in its plane, is roughly formed as a frame, and liquid crystal material is enclosed within this liquid crystal enclosure region.

As shown in FIG. 50, the color filter substrate plate 741 is smaller than the active element substrate plate 701, so that, in the adhered state, the peripheral portion of the active element substrate plate 701 projects outwards further than the outer peripheral edge of the color filter substrate plate 741. Accordingly, it is possible to form the thin film transistors T for picture element switching and at the same time the TFTs for the drive circuit upon the active element substrate plate 701 at the outer peripheral side region of the seal member 455, and thus it becomes possible to provide both a scan lines drive circuit and a data lines drive circuit.

With this liquid crystal panel 750, the above described polarization plates (polarization sheets) 716a and 716b are disposed in predetermined orientations upon the light incident side and the light emitting side of the active element substrate plate 701 and of the color filter substrate plate 741, according to whether the device will be required to operate in the normally white mode or in the normally black mode.

In the liquid crystal panel 750 made according to the above structure, with the active element substrate plate 701, the orientation state of the liquid crystal material present between the picture element electrode 732 and the opposing electrode 718 is controlled for each picture element individually by the display signals which are supplied to the picture element electrodes 732 via the data lines (not shown in the figures) and the thin film transistors T, and a predetermined display is performed in correspondence to the display signals. For example, if the liquid crystal panel 750 is structured in the TN mode, then, when the rubbing directions when performing rubbing processing for the orientation layers 719a and 719b which are respectively provided between the pair of substrate plates (the active element substrate plate 701 and the color filter substrate plate 741) are set to mutually perpendicular directions, the liquid crystal material is orientated with a twist between the substrate plates, having an angle of 90 degree. This type of twist orientation is released by applying an electric field to the liquid crystal layer 702 between the substrate plates. Thus it is possible to control the orientation state of the liquid crystal material for each region which is formed upon the picture element electrode 732 individually (for each picture element individually), according to whether or not an electric field is applied from the outside between the substrate plates.

Because of this, if the liquid crystal panel 750 is to be used as a transparent type liquid crystal panel, the light from an illumination device (not shown in the figures) which is disposed at the lower side of the active element substrate plate 701, after having been made uniform as light of a predetermined linear polarization by the polarization plate 716b upon the incident side, passes through the phase contrast plate 715b and the active element substrate plate 701 and is incident upon the liquid crystal material layer 702, and on the one hand in some of the regions thereof this linearly polarized light passes through and is emitted with its polarization axis having been twisted by this transmission, while on the other hand in other regions this directly polarized light which passes through is emitted without its polarization axis having been twisted at all by this transmission. Due to this, if the polarization plate 716b on the incident side and the polarization plate 716a on the emission side are disposed so that their transmission polarization axes are mutually perpendicular (the normally white mode), then the light which passes through the polarization plate 716a which is disposed upon the emission side of the liquid crystal panel 750 is only the linearly polarized light whose transmission polarization axis has been thus twisted by transmission through the liquid crystal. By contrast, if the polarization plate 716a on the emission side is disposed so that its transmission polarization axis is parallel to the transmission polarization axis of the polarization plate 716b on the incident side (the normally black mode), then the light which passes through the polarization plate 716a which is disposed upon the emission side of the liquid crystal panel 750 is only the linearly polarized light whose transmission polarization axis has not been twisted by transmission through the liquid crystal. Accordingly, if the orientation state of the liquid crystal 702 is controlled for each picture element individually, it is possible to display any desired information.

With the liquid crystal panel according to the above structure, because the filter elements 703 . . . of the color filter substrate plate 741 are made by a method utilizing an ink jet in which a discharging quantity is controlled in high accuracy, it is possible to perform a displaying which is uniform in a plane of display.

Although in the above description it was assumed, by way of example, that the color filter was to be applied to a liquid crystal device, the color filter according to the present invention can, of course, also be utilized for various applications other than the one described above. For example, this color filter could be applied to a white colored organic electro-luminescent device. In other words, a color filter manufactured as described above may be disposed upon the front surface (the light emitting side) of a white colored organic electro-luminescent device. By utilizing such a structure, it is possible to provide an organic electro-luminescent device which presents a color display, while basically utilizing a white colored electro-luminescent device.

It should be understood that the light is controlled in the manner described below. An organic electro-luminescent device is made so as to be a source of white colored light, and the amount of light emitted by each picture element is adjusted by control of transistors which are provided to each picture element individually, and moreover the desired color display is provided by passing this light through the above described color filter.

A Preferred Embodiment Related to a Method of Manufacture of an Electro Optical Device which Uses an Electroluminescent Element Next, a method of manufacture of an electro optical device according to the present invention will be explained with reference to the drawings. It should be understood that, as such an electro optical device, an active matrix type display device which utilizes an electro-luminescent display element will be explained. Moreover, before explaining the method of manufacture of this display device, the structure of the display device which is to be manufactured will be explained.

—Structure of the Display Device—

Figure 14:
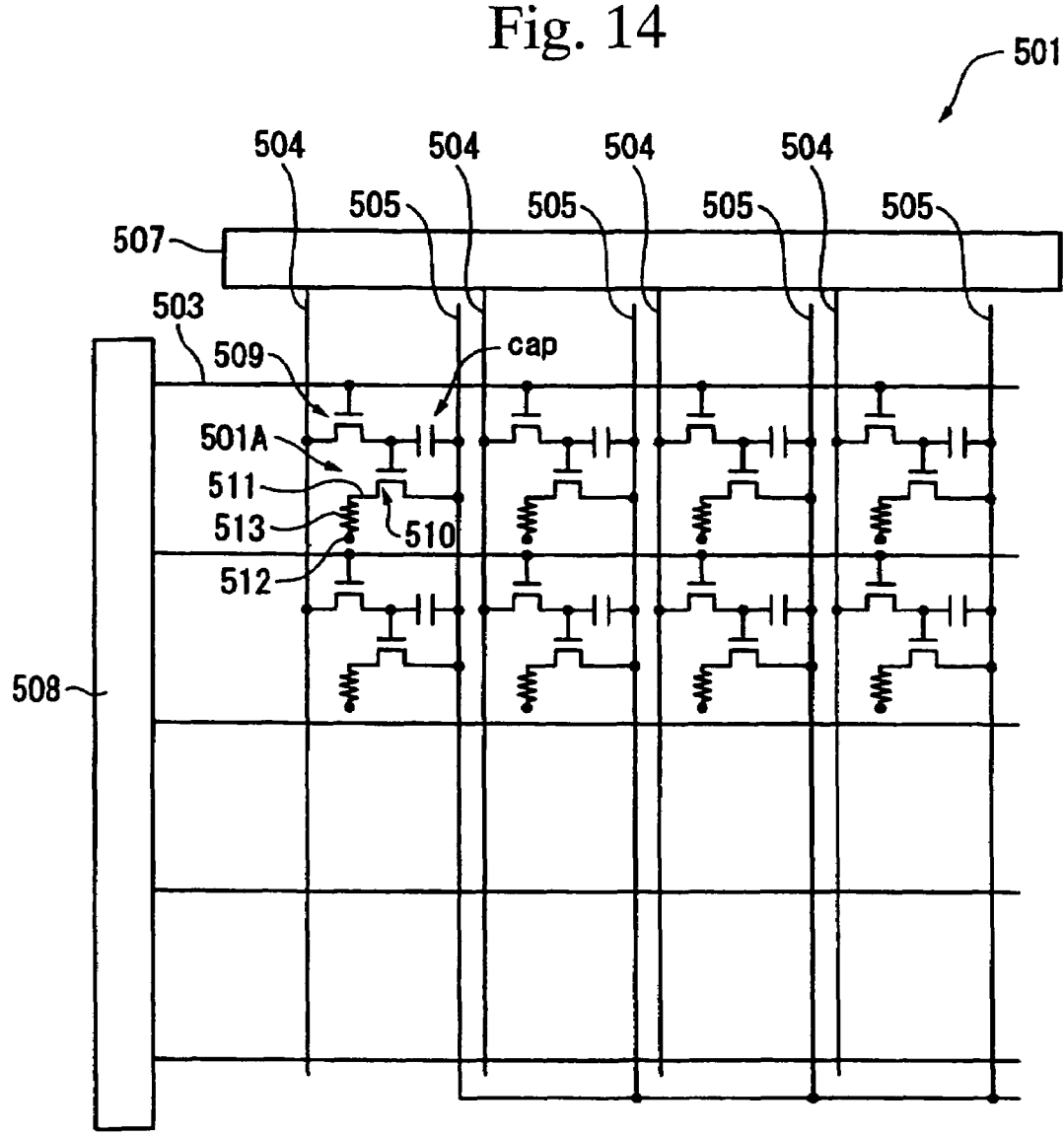
FIG. 14 is a circuit diagram showing one portion of a display device which employs an electro-luminescent display element which is an electro optical device according to the present invention.

FIG. 14 is a circuit diagram showing one portion of an organic electro-luminescent device made by a device for manufacturing an electro optical device according to the present invention. And FIG. 15 is a magnified plan view showing the planar structure of one picture element region of this display device.

In detail, referring to FIG. 14, the reference symbol 501 denotes a display device of the active matrix type which employs an electro-luminescent display element which is an organic electro-luminescent device; and this display device 501 comprises, upon a transparent display substrate plate 502 which functions as a substrate plate, a plurality of scan lines 503, a plurality of signal lines 504 which extend in a direction which is transverse to these scan lines 503, a plurality of common power supply lines 505 which extend parallel to these signal lines 504, and connecting wires for all these. And a picture element region 501A is provided at each of the points of intersection of the scan lines 503 and the signal lines 504.

A data side drive circuit 507 is provided for the signal lines 504, and comprises a shift register, a level shifter, a video line, and an analog switch. Furthermore, a scan side drive circuit 508 is provided for the scan lines 503, and comprises a shift register and a level shifter. And each of the picture element regions 501A is provided with a switching thin film transistor 509 which is supplied with a scan signal at its gate electrode via a scan line 503, a capacitor cap which accumulates and holds a picture signal which is supplied from a signal line 504 via this switching thin film transistor 509, a current thin film transistor 510 which is supplied at its gate electrode with the picture signal which has been held by this capacitor cap, a picture element electrode 511 into which drive electrical current flows from a common power supply line 505 when it is electrically connected to the common power supply line 505 via this current thin film transistor 510, and a light emitting element 513 which is sandwiched between this picture element electrode 511 and a reflecting electrode 512.

According to this structure, when the switching thin film transistor 509 which is driven by the scan line 503 is ON, the voltage at this time upon the signal line 504 is held in the capacitor cap. The ON or OFF state of the current thin film transistor 510 is determined according to the state of this capacitor cap. And electrical current flows to the picture element electrode 511 from the common power supply line 505 via the channel of the current thin film transistor 510, and furthermore electrical current flows through the light emitting element 513 to the reflecting electrode 512. By doing this, the light emitting element 513 emits light according to the magnitude of this flow of current.

As shown in FIG. 15 which is a magnified plan view showing the picture element region 501A in a state in which the reflecting electrode 512 and the light emitting element 513 have been removed, the four sides of the rectangular picture element electrode 511, as seen in a planar state, are arranged so as to be surrounded by the signal line 504, the common power supply line 505, the scan line 503, and the scan line 503 for another neighboring picture element electrode 511 not shown in the figure —Process of Manufacture of the Display Device—

Next, various procedures of a manufacturing process for manufacture of a display device of the active matrix type using the above described electro-luminescent display element will be explained. FIGS. 16 through 18 are manufacturing process sectional views showing various procedures of a manufacturing process for manufacture of a display device of the active matrix type using the above described electro-luminescent display element. It should be understood that, as a liquid drop discharge device and a scanning method for forming an electro-luminescent layer by the discharge of liquid drops, the same ones may be employed as have already been explained above with reference to other preferred embodiments of the present invention.

—Preliminary Processing—

Figure 16A:
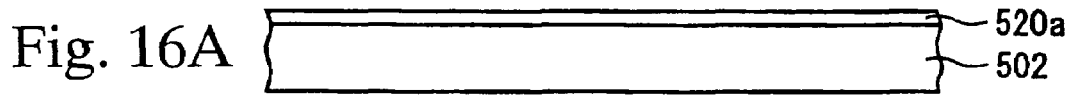
FIGS. 16(A) through 16(E) are a manufacturing process sectional view showing a procedure for preliminary processing of the process of manufacture of the same display device.

First, as shown in FIG. 16(A), according to requirements, a protective backing layer not shown in the drawings, which consists of a silicon oxide film of thickness dimension about 2000 to 5000 angstroms, is formed upon the transparent display substrate plate 502 by a plasma CVD (Chemical Vapor Deposition) process, using tetraethoxysilane (TEOS) or oxygen gas or the like as source gas. Next, the temperature of the display substrate plate 502 is set to about 350 degree Celsius, and a semiconductor film layer 502a, which is an amorphous silicon layer of thickness dimension about 300 to 700 angstroms, is formed upon the surface of the protective backing layer by a plasma CVD method. After this, a crystallization process of laser annealing or a solid growth method or the like is performed upon the semiconductor film 520a, so that the semiconductor film 520a is crystallized into a poly-silicon layer. Here by laser annealing is meant a process of utilizing, for example, an line beam from an excimer laser of wavelength about 400 nm at an output intensity of about 200 mJ/cm². With regard to this line beam, the line beam is scanned along its shorter direction so that, for each region, the portions which correspond to about 90% of the peak value of the laser intensity are superimposed.

Figure 16B:
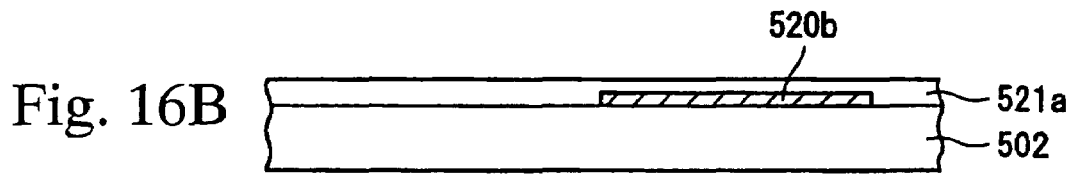

And, as shown in FIG. 16(B), the semiconductor film 520a is formed by patterning into a blob shaped semiconductor film 520b. A gate insulating layer 521a which is a silicon oxide film or a nitrate layer of thickness dimension of about 600 to 1500 angstroms is formed upon the display substrate plate 502 which is provided with this semiconductor film 520b by a plasma CVD method, using TEOS or oxygen gas or the like as source gas. It should be understood that, although this semiconductor film 520b is the one which will constitute the channel region and the source and drain regions for the current thin film transistor 510, in another sectional position there is also formed a semiconductor film not shown in the figures which will constitute the channel region and the source and drain regions for the switching thin film transistor 509. In other words, although the switching thin film transistor 509 and the current thin film transistor 510 which are of two types are formed at the same time in the manufacturing process shown in FIGS. 16 through 18, nevertheless, in the following explanation, only the formation of the current thin film transistor 510 will be explained, while the explanation of the switching thin film transistor 509 will be curtailed, since it is formed by the same procedure.

Figure 16C:
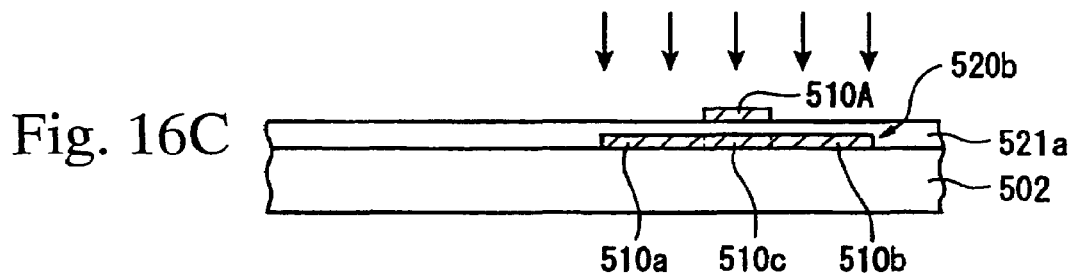

After this, as shown in FIG. 16(C), and after a conductive film, which is a metallic film made from aluminum, tantalum, molybdenum, titanium, tungsten or the like, has been formed by a spattering method, the gate electrode 510A shown in FIG. 15 is formed by patterning. In this state the work-piece is bombarded by phosphorus ions, so as to form upon the semiconductor film 520b the source and drain regions 510a and 510b which mutually match with the gate electrode 510A. It should be understood that the portion into which the impurities have not been introduced constitutes the channel region 510c.

Figure 16D:
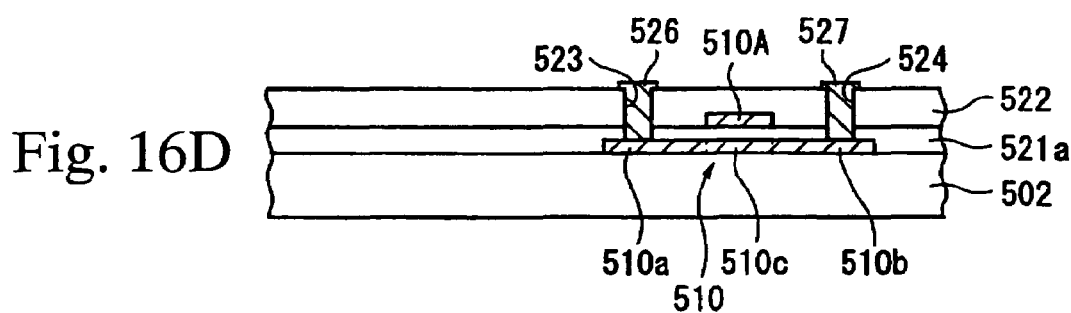

Next, as shown in FIG. 16(D), after an inter layer insulating layer 522 has been formed, contact holes 523 and 524 are formed therein, and junction electrodes 526 and 527 are embedded in these contact holes 523 and 524.

Figure 16E:
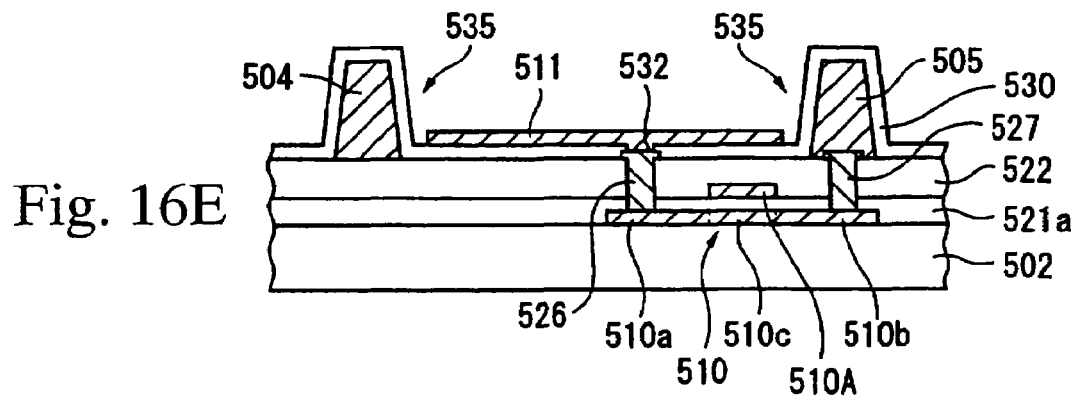

Furthermore, as shown in FIG. 16(E), a signal line 504, a common power supply line 505, and a scan line 503 (not shown in FIG. 16) are formed above the inter layer insulating layer 522.

At this time, the various lead wires for the signal line 504, the common power supply line 505, and the scan line 503 are formed of sufficient thickness, without being prejudiced by the necessary thickness dimension for lead wires. In concrete terms, it will be acceptable to form each of these lead wires, for example, with a thickness dimension of approximately 1 to 2 μm. Here, it will be acceptable to form the junction electrode 527 and the various lead wires by the same process. At this time, a junction electrode 526 is formed from an ITO layer which will be described hereinafter.

And an inter layer insulating layer 530 is formed to cover the upper surfaces of the various lead wires, and a contact hole 532 is formed in a position which corresponds to the junction electrode 526. An ITO layer is formed so as to fill in this contact hole 532, and this ITO layer is patterned, so as to form the picture element electrode 511 which is electrically connected to the source and drain region 510a in a predetermined position which is surrounded by the signal line 504, the common power supply line 505, and the scan line 503.

Here, in FIG. 16(E), the portion which is sandwiched between the signal line 504 and the common power supply line 505 is the one which corresponds to a predetermined position into which optical material is selectively to be provided. And steps 535 are formed by the signal line 504 and the common power supply line 505 between this predetermined position and its surroundings. In concrete terms, this predetermined position is lower than its surroundings, and is defined as a concave portion by the steps 535.

—Discharge of the Electro-Luminescent Material—

Figure 17A:
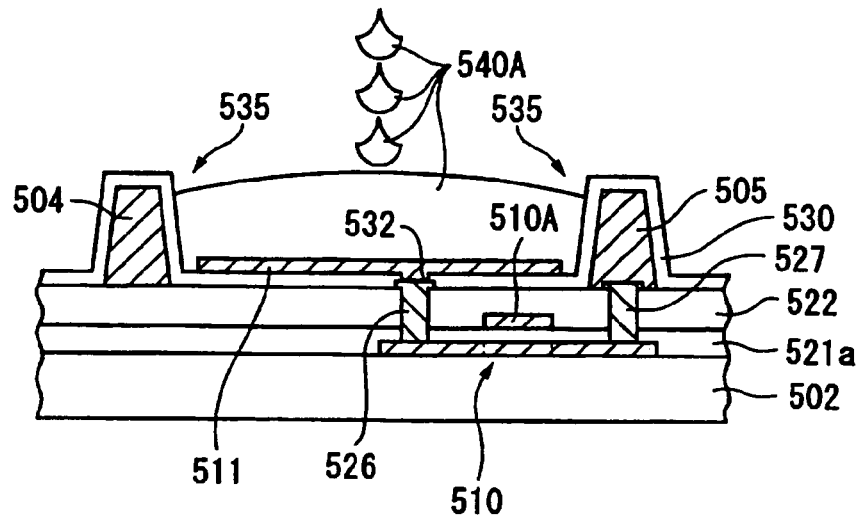
FIGS. 17(A) through 17(C) are a manufacturing process sectional view showing a procedure for discharge of electro-luminescent material in the process of manufacture of the same display device.

Next an electro-luminescent material, which is a functional liquid mass, is discharged by an ink jet method against the display substrate plate 502 upon which the above described preliminary processing has been performed. In other words, as shown in FIG. 17(A), in a state in which the upper surface of the display substrate plate 502 upon which the above described preliminary processing has been performed is facing upwards, an optical material mass 540A, which is a precursor in the form of a solution, dissolved in a solvent, and which serves as a functional liquid mass for forming a positive hole injection layer 513A which touches the lower layer portion of the light emitting element 140, is discharged by an ink jet method, in other words by using a device according to one of the preferred embodiments of the present invention described above, and thus is selectively applied to certain ones of the regions surrounded by the steps 535 which are located in certain predetermined positions.

As the optical material 540A which is to be discharged for forming this positive hole injection layer 513A, poliphenylenevinylene which polymer precursor is polytetrahydrothiophenylphenylen, 1,1-bis-(4-N,N-ditlylaminophenyl) cyclohexane, tris (8-hydroxyquinolinole) Aluminum or the like may be used.

It should be understood that, since during this discharge process the optical material 540A, which is a liquid mass which has a certain flowability, has a high flowability just as in the case of discharging the filter element material 13 against the division walls which was described above with reference to various other preferred embodiments, accordingly, even though this optical material 540A may attempt to spread out in the sideways direction, since the steps 535 are formed so as to surround the positions where this optical material 540A has been applied, it is possible to prevent the optical material 540A getting over the steps 535 and spreading to the outside of the predetermined positions where it is supposed to be applied, provided that the amount of discharge of the optical material 540A in one discharge episode is not extremely increased.

Figure 17B:
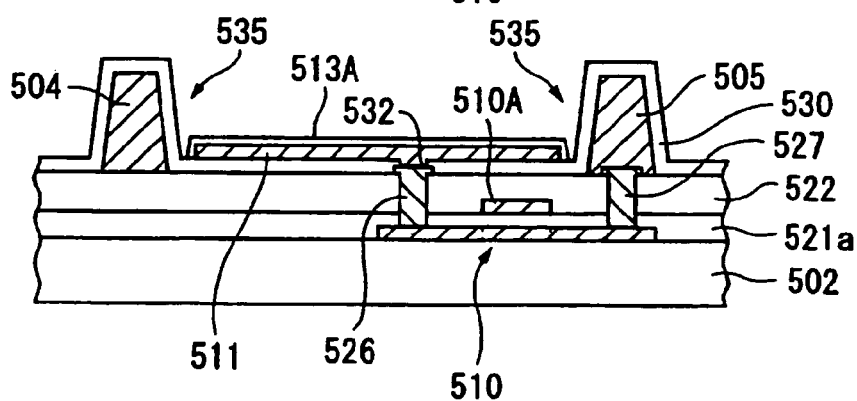
Figure 17C:
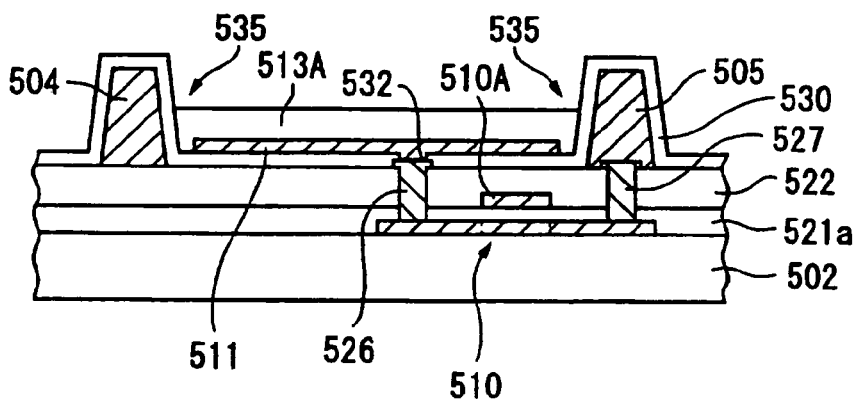

And, as shown in FIG. 17(B), the liquid in the optical material 540A is vaporized by being heated up or by being illuminated or the like, so as to form a thin solid positive hole injection layer upon the picture element electrode 511. The processes of FIGS. 17(A) and (B) are repeated for the necessary number of times, until, as shown in FIG. 17(C), a positive hole injection layer 513A of sufficient extent in the thickness dimension has been formed.

Figure 18A:
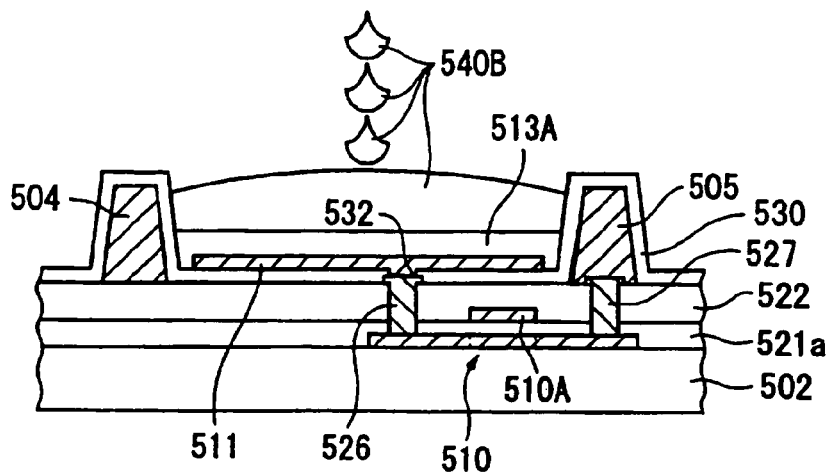
FIGS. 18(A) through 18(D) are another manufacturing process sectional view showing a procedure for discharge of electro-luminescent material in the process of manufacture of the same display device.

Next, as shown in FIG. 18(A), in the state in which the upper surface of the display substrate plate 502 is facing upwards, an optical material mass 540B, which is an organic fluorescent material in the form of a solution, dissolved in a solvent, and which serves as a functional liquid mass for forming an organic semiconductor film 513B as a layer above the light emitting element 513, is discharged by an ink jet method, in other words by using a device according to one of the preferred embodiments of the present invention described above, and thus is selectively applied to certain ones of the regions surrounded by the steps 535 which are located in certain predetermined positions. It should be understood that this optical material 540B is prevented from overflowing over the steps 535 and spreading to the outside of the predetermined positions in the same way as in the case of the discharge of the optical material 540A, as has been described above.

As the optical material 540B which is to be discharged for forming this organic semiconductor film 513B, cyanopolypheniyphenilenevinylene, polyphenylvinylene, polyalkylphenilene, 2,3,6,7-tetrahydro-11-oxo-1H.5H.11H(1)benzopyrano[6,7,8-ij]-quinolysine-10-carboxylicacid, 1,1-bis (4-N,N-ditolylaminophenyl)cyclohexane, 2-13.4'-dihydroxyphenil-3,5,7-trihydroxy-1-benzopyryliumperchlorate, tris(8-hydroxyquinoquinol) aluminum, 2,3.6.7-tetrahydro-9-methyl-11-oxo-1H.5H.11H (1)benzopyrano[6,7,8-ij]-quinolisine, aromaticdiaminederivative(TDP), oxydiazoledimer(OXD), oxydiazoloderivetive(PBD), distilarylenederivative(DSA), quinolinolmetallic-complex, beryllium-benzoquinolinolcomplex (Bebq), triphenylaminederivetive(MTDATA), distyllylderivative, pyrazolinedimer, rublene, quinacridone, triazolederivetive, polyphenylene, polyalkylfluorene, polyalkylthiophene, azomethynezinccomplex, polyphyrinzinccomplex, benzooxazolezinccomplex, phenanthrolineeuropiumcomplex or the like may be used.

Figure 18B:
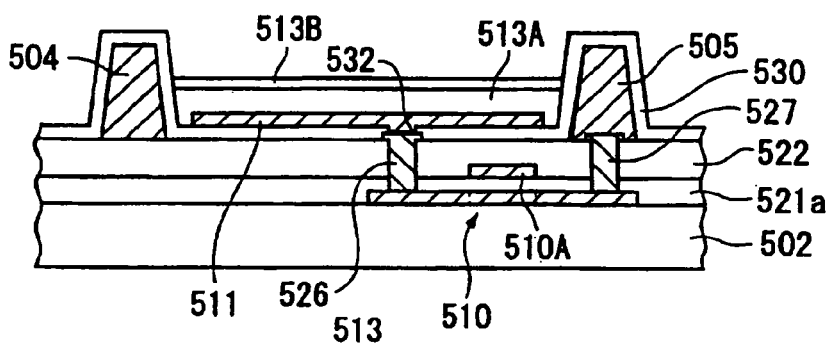
Figure 18C:
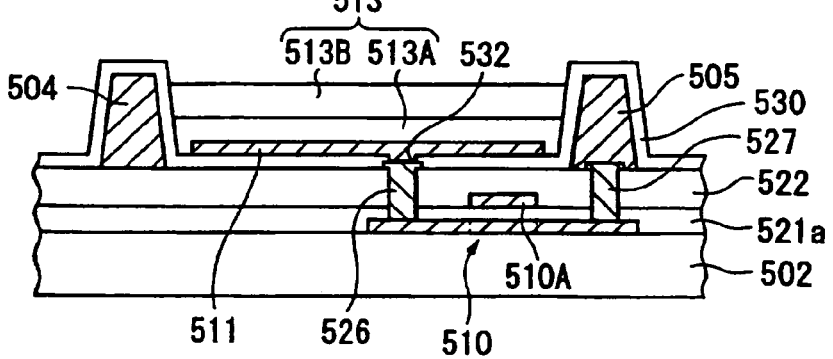
Figure 18D:
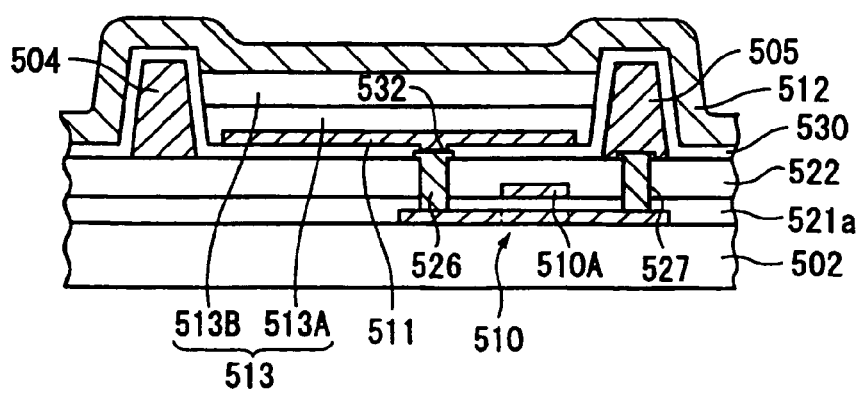

Next, as shown in FIG. 18(B), the solvent in the optical material 540B is vaporized by being heated up or by being illuminated or the like, so as to form a thin organic semiconductor film 513B above the positive hole injection layer 513A. The processes of FIGS. 18(A) and (B) are repeated for the necessary number of times, until, as shown in FIG. 18(C), an organic semiconductor film 513B of sufficient extent in the thickness dimension has been formed. The positive hole injection layer 513A and the organic semiconductor film 513B together constitute a light emitting element 513. Finally, as shown in FIG. 18(D), a reflecting electrode 512 is formed upon the entire surface of the display substrate plate 502, or in stripe form, and thereby the display device 501 is manufactured.

With this preferred embodiment shown in FIGS. 14 through 18 as well, it is possible to reap the same operational benefits as in the other preferred embodiments described earlier, by performing an ink jet method in the same manner. Furthermore, when selectively applying the functional liquid masses, it is possible to prevent them flowing out from the regions where they are supposed to be deposited, so that it is possible to perform patterning at high accuracy.

It should be understood that although the color display according to this preferred embodiment shown in FIGS. 14 through 18 has been explained in terms of its principal application to an active matrix type display device which uses an electro-luminescent display element, the structure shown in FIGS. 14 through 18 could also, for example, be applied to a display device which incorporates a monochrome display.

Figure 19:
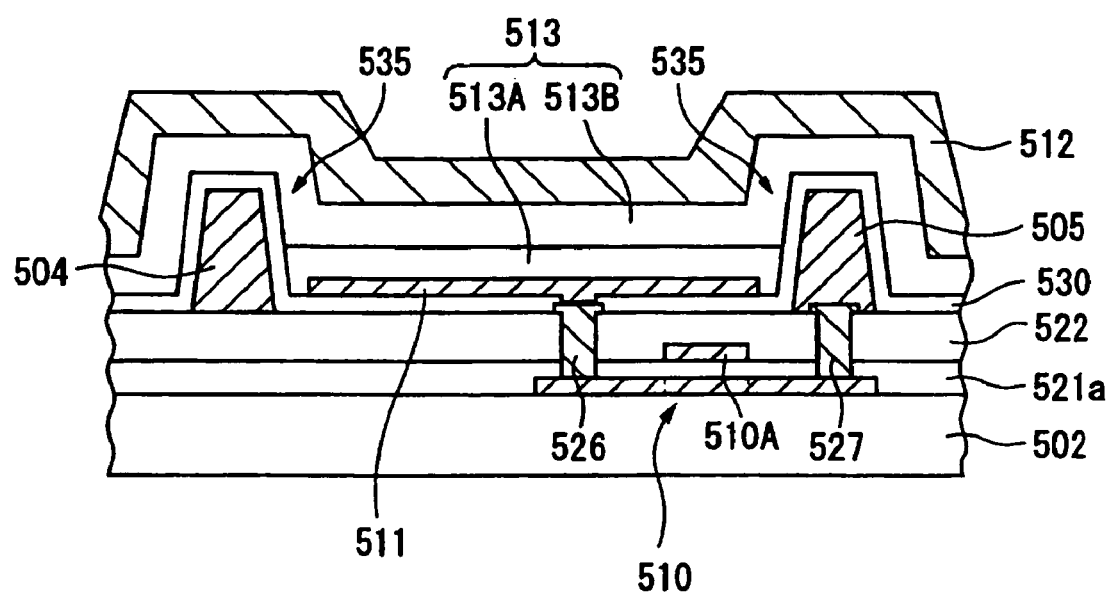
FIG. 19 is a sectional view showing a picture element region of a display device which employs an electro-luminescent display element which is an electro optical device according to the present invention.

In detail, it would also be acceptable to form the organic semiconductor film 513B uniformly over the entire surface of the display substrate plate 502. However even in this case it is extremely effective to take advantage of the steps 111, since it is necessary to provide the positive hole injection layer 513A selectively in each of the predetermined positions in order to prevent cross-talk. It should be understood that, in this FIG. 19, to structural elements which are the same as in the previous preferred embodiment shown in FIGS. 14 through 18, the same reference symbols are affixed.

Figure 20A:
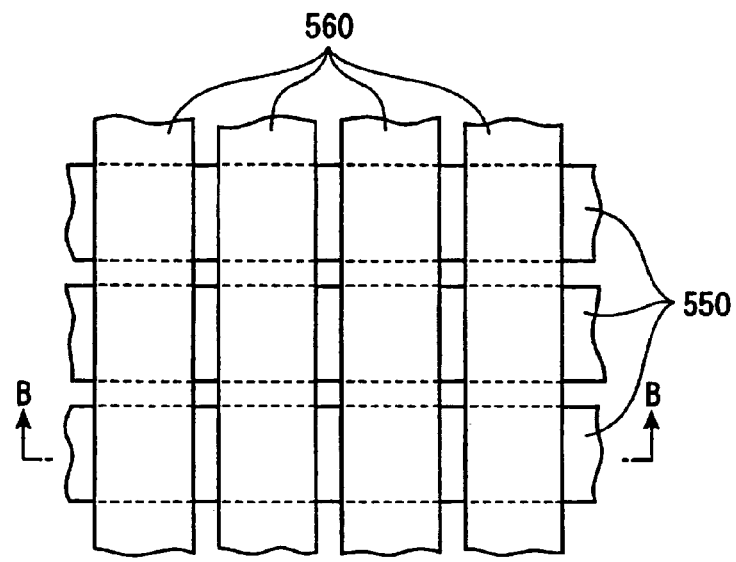
FIG. 20(A) is a magnified figure showing the structure of a picture element region of a display device which employs an electro-luminescent display element which is an electro optical device according to the present invention and shows the planar structure thereof.
Figure 20B:
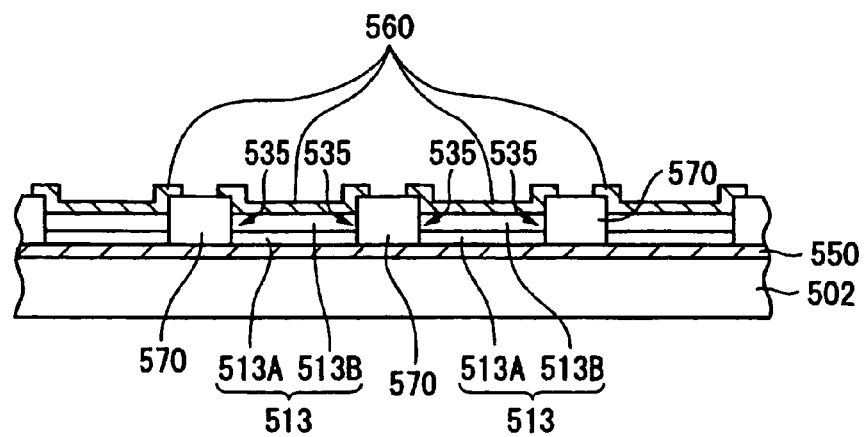
FIG. 20(B) is a sectional view taken in a plane shown by the arrows B-B in its view 20(A).

Furthermore, this type of display device which uses an electro-luminescent display element is not limited to the active matrix type; for example, it could also be a display device of the passive matrix type shown in FIG. 20. FIG. 20 shows an electro-luminescent device made by a device for manufacture of an electro optical device according to the present invention, and its FIG. 20(A) is a plan view showing the arrangement relationship of a plurality of first bus lead wires 550 and a plurality of second bus lead wires 560 which are arranged in the direction perpendicular to these first bus lead wires 550, while its FIG. 20(B) is a sectional view thereof taken in a plane shown by the arrows B-B in FIG. 20(A). In this FIG. 20, to structural elements which are the same as in the previous preferred embodiment shown in FIGS. 14 through 18, the same reference symbols are affixed, and the description thereof will herein be curtailed in the interests of brevity of description. Furthermore, since the details of the manufacturing process for this embodiment are the same, mutates mutandi, as those for the previous preferred embodiment shown in FIGS. 14 through 18, figures and description thereof will herein be curtailed.

This preferred embodiment display device shown in FIG. 20 is one in which an insulating layer 570 made of, for example, $SiO_2$ is provided so as to surround the predetermined positions in which the light emitting elements 513 are provided, and by doing this steps 535 are formed between these predetermined positions and their surroundings. Due to this, when selectively applying the functional liquid mass, it is possible to prevent it from flowing out of the areas where it is supposed to be deposited, and accordingly it is possible to perform patterning at high accuracy.

Furthermore, even in the case of an active matrix type display device, the present invention is not limited to the structure of the preferred embodiment shown in FIGS. 14 through 18. In other words, it would be possible to utilize a device of the structure shown in FIG. 21, of the structure shown in FIG. 22, of the structure shown in FIG. 23, of the structure shown in FIG. 24, of the structure shown in FIG. 25, of the structure shown in FIG. 26, or the like.

Figure 21:
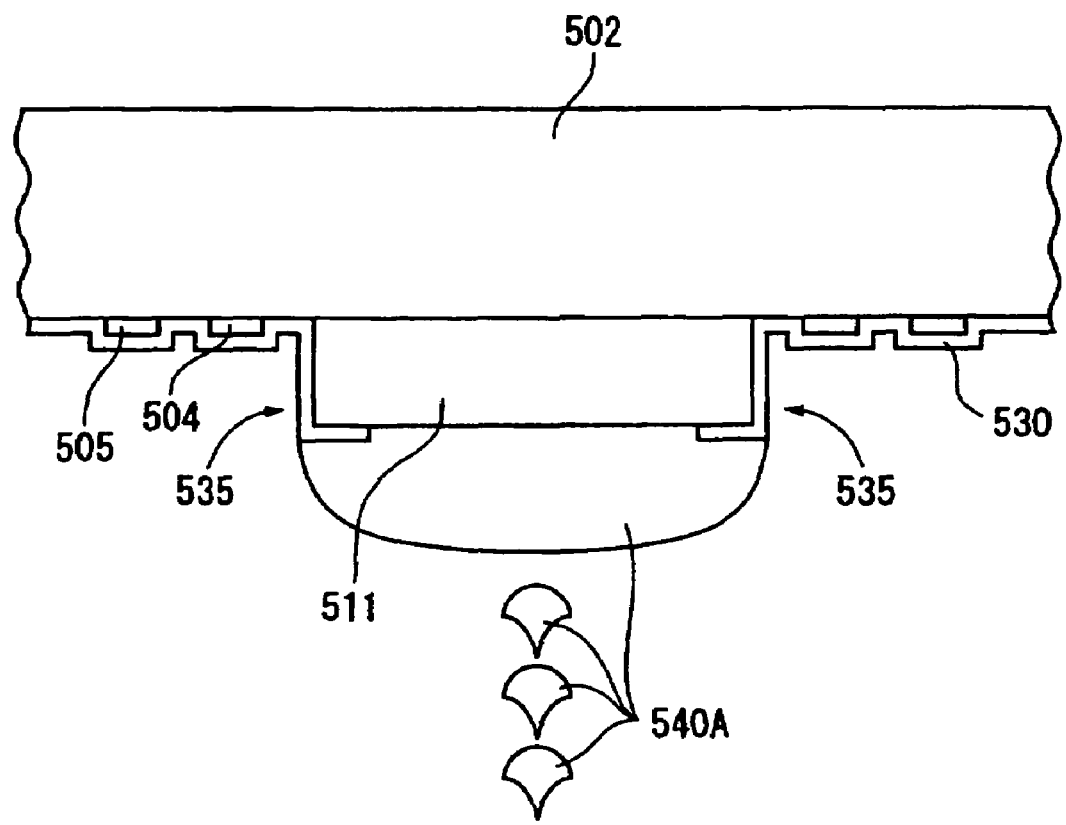
FIG. 21 is a manufacturing process sectional view showing a process of manufacture for manufacturing a display device which employs an electro-luminescent display element which is an electro optical device according to the present invention.

By forming the steps 535 by taking advantage of the picture element electrode 511, the display device shown in FIG. 21 is made so as to be capable of high accuracy patterning. FIG. 21 is a sectional view showing an intermediate stage in the manufacturing process for this display device, and, since the stages before and after this stage are substantially the same as in the case of the preferred embodiment shown in FIGS. 14 through 18, description thereof and figures illustrating the same will herein be curtailed.

With this display device shown in FIG. 21, the picture element electrode 511 is formed to be thicker than normal, and thereby the steps 535 are formed between it and its surroundings. In other words, with this display device shown in FIG. 21, the convex type steps are formed so that the picture element electrode 511, to which the optical material will be applied afterwards, becomes higher than its surroundings. And the optical material 540A, which is a precursor for forming the positive hole injection layer 513A, which touches the lower layer portion of the light emitting element 513, is discharged by an ink jet method in the same manner as in the case of the preferred embodiment described above with reference to FIGS. 14 through 18, and is thereby applied to the upper surface of the picture element electrode 511.

However, the difference from the case of the preferred embodiment described above and shown in FIGS. 14 through 18 is that the optical material 540A is discharged and is applied in a state in which the display substrate plate 502 is reversed in the vertical direction, in other words in a state in which the upper surface of the picture element electrode 511 to which the optical material 540A is applied is facing downwards. Because of this configuration, due to gravity and surface tension, the optical material 540A accumulates upon the upper surface of the picture element electrode 511 (its lower surface as seen in FIG. 21), and does not spread to the surroundings thereof. Accordingly, if it is solidified by being heated up or by being exposed to light or the like, it is possible to form a thin positive hole injection layer 513A in the same manner as in FIG. 17(B), and, if this is repeated, the positive hole injection layer 513A is formed. The organic semiconductor film 513B is formed by the same procedure. Due to this feature, it is possible to perform patterning at high accuracy while taking advantage of the convex form steps. It should be understood that this concept is not limited to the exploitation of gravity and surface tension; it would also be acceptable to adjust the amount of the optical materials 540A and 540B by taking advantage of inertial force such as centrifugal force.

Figure 22:
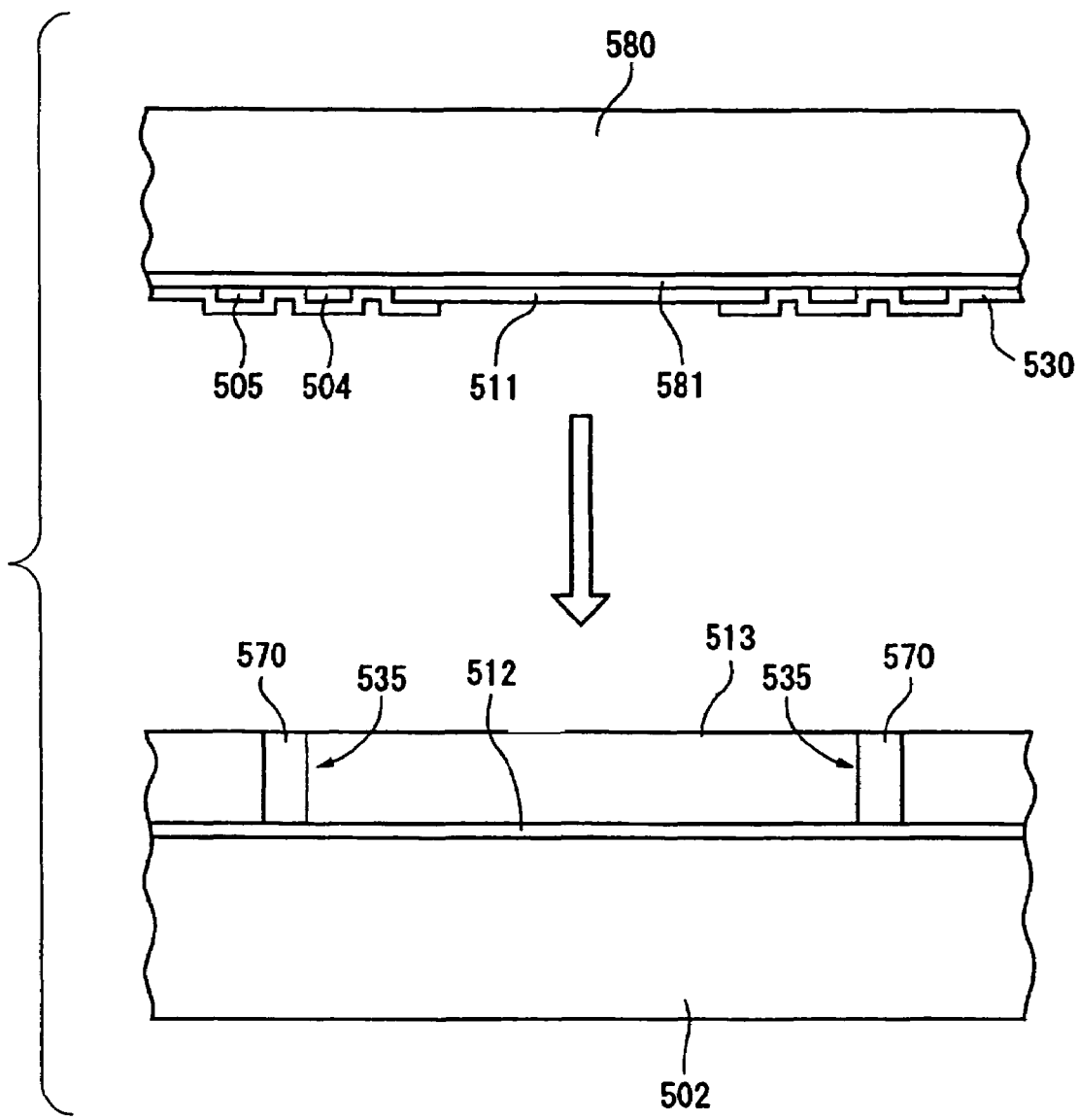
FIG. 22 is another manufacturing process sectional view showing a process of manufacture for manufacturing a display device which employs an electro-luminescent display element which is an electro optical device according to the present invention.

The display device shown in FIG. 22 is also a display device of the active matrix type. FIG. 22 is a sectional view showing an intermediate stage in the manufacturing process for this display device, and, since the stages before and after this stage are substantially the same as in the case of the preferred embodiment shown in FIGS. 14 through 18, description thereof and figures illustrating the same will herein be curtailed.

With this display device shown in FIG. 22, first, a reflecting electrode 512 is formed upon the display substrate plate 502, and then afterward an insulating layer 570 is formed upon this reflecting electrode 512 so as to surround the predetermined positions in which the light emitting elements 513 are to be provided, and, by doing this, concave type steps 535 are formed so that these predetermined positions become lower than their surroundings.

And, in the same manner as in the case of the preferred embodiment shown in FIGS. 14 through 18, the optical materials 540A and 540B are selectively discharged and applied to the regions surrounded by the steps 535 by an ink jet method as functional liquid masses, and thereby the light emitting elements 513 are formed.

On the other hand, a scan line 503, a signal line 504, a picture element electrode 511, a switching thin film transistor 509, a current thin film transistor 510, and an inter layer insulating layer 530 are formed upon a stripping layer 581 which is laid upon a substrate plate for stripping 580. Finally, the structure which has been stripped from the stripping layer 581 upon the substrate plate for stripping 580 is transferred to the surface of the display substrate plate 502.

With this preferred embodiment of FIG. 22 reduction of the damage due to application of the optical material 540A, 540B to the scan line 503, the signal line 504, the picture element electrode 511, the switching thin film transistor 509, the current thin film transistor 510, and the inter layer insulating layer 530 can be anticipated. It should be understood that this concept can also be applied to a passive matrix type display element.

Figure 23:
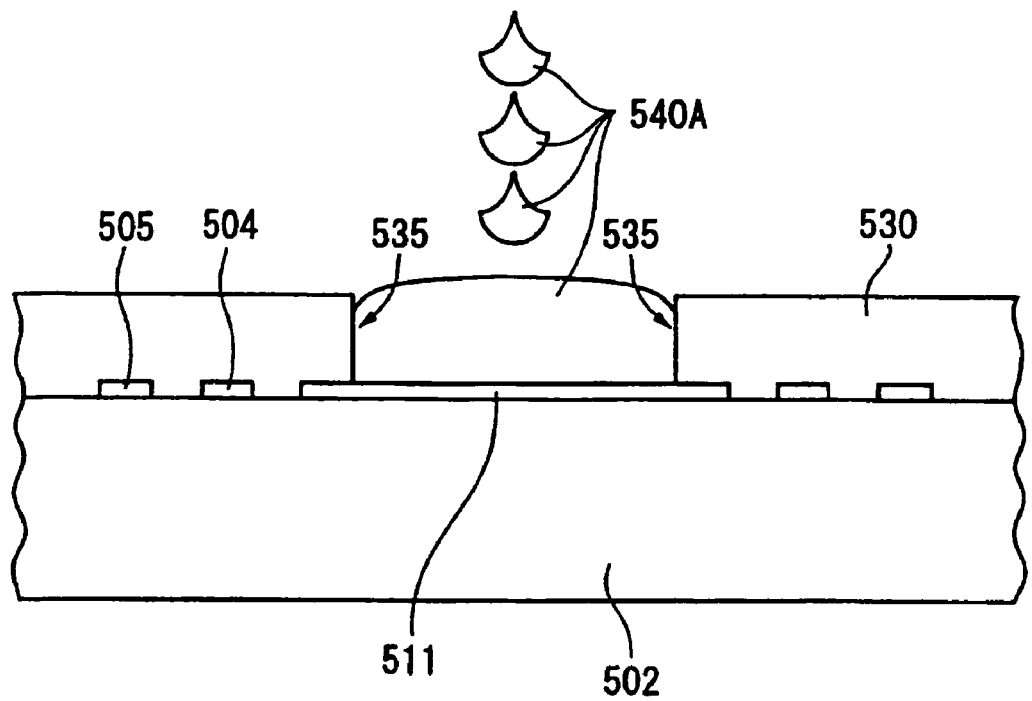
FIG. 23 is yet another manufacturing process sectional view showing a process of manufacture for manufacturing a display device which employs an electro-luminescent display element which is an electro optical device according to the present invention.

The display device shown in FIG. 23 is a display device of the active matrix type. FIG. 23 is a sectional view showing a stage partway through the manufacturing process for manufacture of this display device, and, since the stages before and after this stage are substantially the same as in the case of the preferred embodiment shown in FIGS. 14 through 18, description thereof and figures illustrating the same will herein be curtailed.

This display device shown in FIG. 23 is one in which the concave formed steps 535 are made by taking advantage of the inter layer insulating layer 530. Due to this, there is no requirement to add any further special process, and it is possible to take advantage of the inter layer insulating layer 530, so that it is possible to prevent great further complication of the process of manufacture. It should be understood that, along with forming the inter layer insulating layer 530 from $SiO_2$, it would also be acceptable to irradiate its surface with ultraviolet light or with a plasma such as $O_2$, $CF_3$, Ar or the like, and thereafter to expose the surface of the picture element electrode 511, and selectively to apply the optical material liquid 540A, 540B by discharging it. By doing this a strong distribution of liquid repulsion is formed along the surface of the inter layer insulating layer 530, and it becomes easy to accumulate the optical material liquid 540A, 540B in the predetermined positions by the liquid repulsion operation both of the surface level differential portion 535 and also of the inter layer insulating layer 530.

Figure 24:
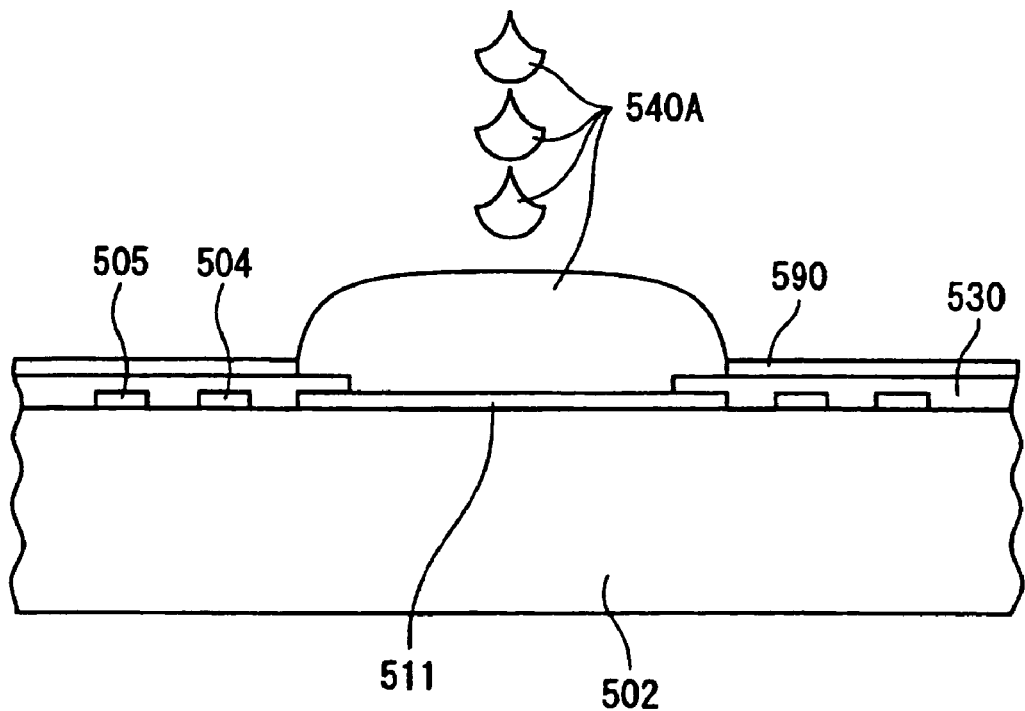
FIG. 24 is still yet another manufacturing process sectional view showing a process of manufacture for manufacturing a display device which employs an electro-luminescent display element which is an electro optical device according to the present invention.

With the display device shown in FIG. 24, it is arranged to prevent the optical material 540A, 540B which is applied from spreading to its surroundings, by making the hydrophilic characteristic of the predetermined positions to which this optical material 540A, 540B, which is a liquid mass, is applied to be relatively stronger than the hydrophilic characteristic of their surroundings. FIG. 24 is a sectional view showing an intermediate stage in the manufacturing process for this display device, and, since the stages before and after this stage are substantially the same as in the case of the preferred embodiment shown in FIGS. 14 through 18, description thereof and figures illustrating the same will herein be curtailed.

With this display device shown in FIG. 24, after forming the inter layer insulating layer 530, an amorphous silicon layer 590 is formed upon its upper surface. Since the hydrophobic characteristic of this amorphous silicon layer 590 is stronger than that of the ITO from which the picture element electrode 511 is made, accordingly, here, a distinctly defined distribution of hydrophobic characteristics and hydrophilic characteristics is created, with the hydrophilic characteristic of the surface of the picture element electrode 511 being relatively stronger than the hydrophilic characteristic of its surroundings. And then, in the same manner as in the case of the preferred embodiment shown in FIGS. 14 through 18, the light emitting element 513 is formed by selectively discharging the optical material liquid 540A, 540B by an ink jet method and applying it against the upper surface of the picture element electrode 511; and finally the reflecting electrode 512 is made.

Moreover, it is also possible to apply this preferred embodiment shown in FIG. 24 to a display element of the passive matrix type. Furthermore, as in the preferred embodiment shown in FIG. 22, it would also be acceptable to include a process of transferring a structure which has been formed with a stripping layer 581 upon a substrate plate for stripping 580 to the display substrate plate 502.

And, with regard to the hydrophilic and hydrophobic distribution, it would also be acceptable to form the insulating layer of metal, anodized oxide film, or polyimide or silicon oxide or the like from some different material. It should also be understood that in the case of a display element of the passive matrix type it would be acceptable to form it from the first bus connecting wires 550, while in the case of a display element of the active matrix type, it would be acceptable to form it from the scan line 503, the signal line 504, the picture element electrode 511, the insulating layer 530, or the light interception layer 6b.

Figure 25:
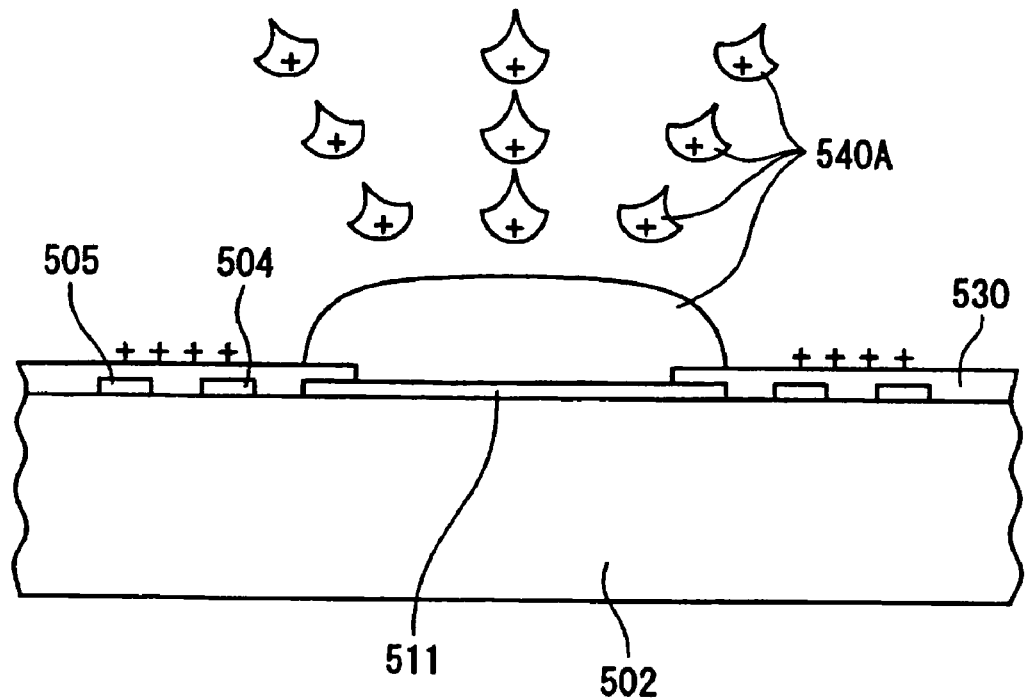
FIG. 25 is yet a further manufacturing process sectional view showing a process of manufacture for manufacturing a display device which employs an electro-luminescent display element which is an electro optical device according to the present invention.
Figure 26:
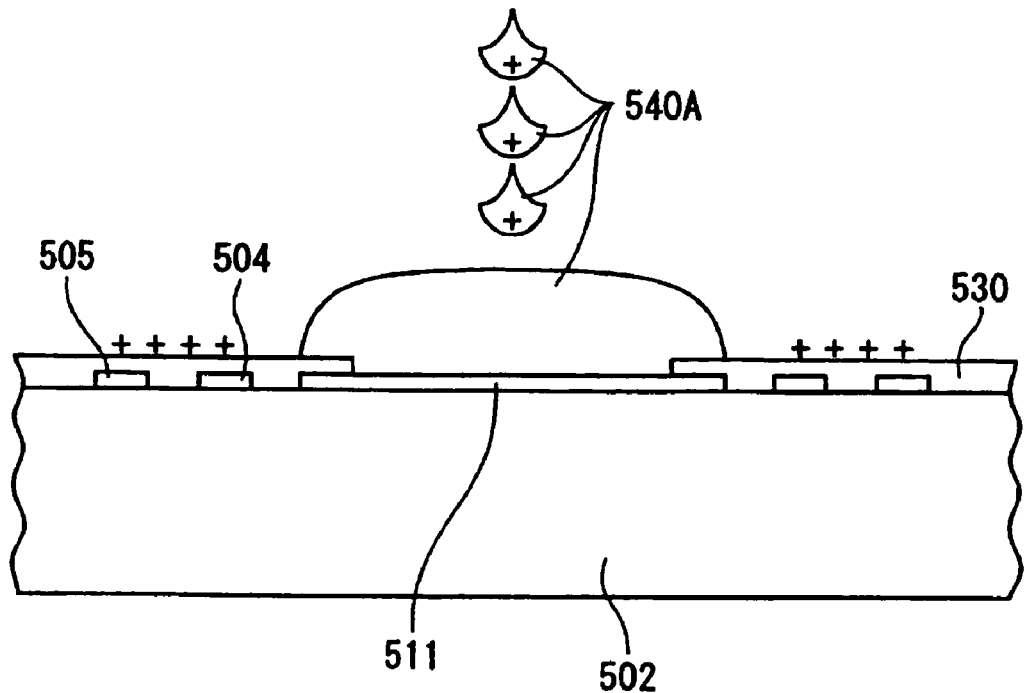
FIG. 26 is a still yet further manufacturing process sectional view showing a process of manufacture for manufacturing a display device which employs an electro-luminescent display element which is an electro optical device according to the present invention.

The display device shown in FIG. 25 is one in which it is contemplated, not to enhance the accuracy of the patterning by taking advantage of the steps 535 or the distribution of hydrophobic and hydrophilic characteristics or the like, but, rather, to enhance the accuracy of the patterning by taking advantage of attraction and repulsion and the like due to electrical potential. FIG. 25 is a sectional view showing a stage partway through the manufacturing process for manufacture of this display device, and, since the stages before and after this stage are substantially the same as in the case of the preferred embodiment shown in FIGS. 14 through 18, description thereof and figures illustrating the same will herein be curtailed.

With this display device shown in FIG. 25, along with driving the signal line 504 and the common power supply line 505, an electrical potential distribution is formed by suitably turning ON and OFF a transistor not shown in the figures, so as to bring the picture element electrode 511 to a minus electrical potential, and so as to bring the inter layer insulating layer 530 to a plus electrical potential. And the optical material liquid 540A, 540B which is charged to a positive electrical potential is selectively discharged by an ink jet method, so as to be applied in the predetermined position. By doing this, since the optical material 540A, 540B is charged up, it is also possible to take advantage of static electrical charging rather than spontaneous electrical polarization, and accordingly it is possible to enhance the accuracy by which the patterning is performed.

It should be understood that this preferred embodiment shown in FIG. 25 can also be applied to a passive matrix type display element. Furthermore, just like the preferred embodiment shown in FIG. 22, it would also be acceptable to include a process of transferring a structure formed via a stripping layer 581 upon a substrate plate for stripping 580 to the display substrate plate 502

Figure 49:
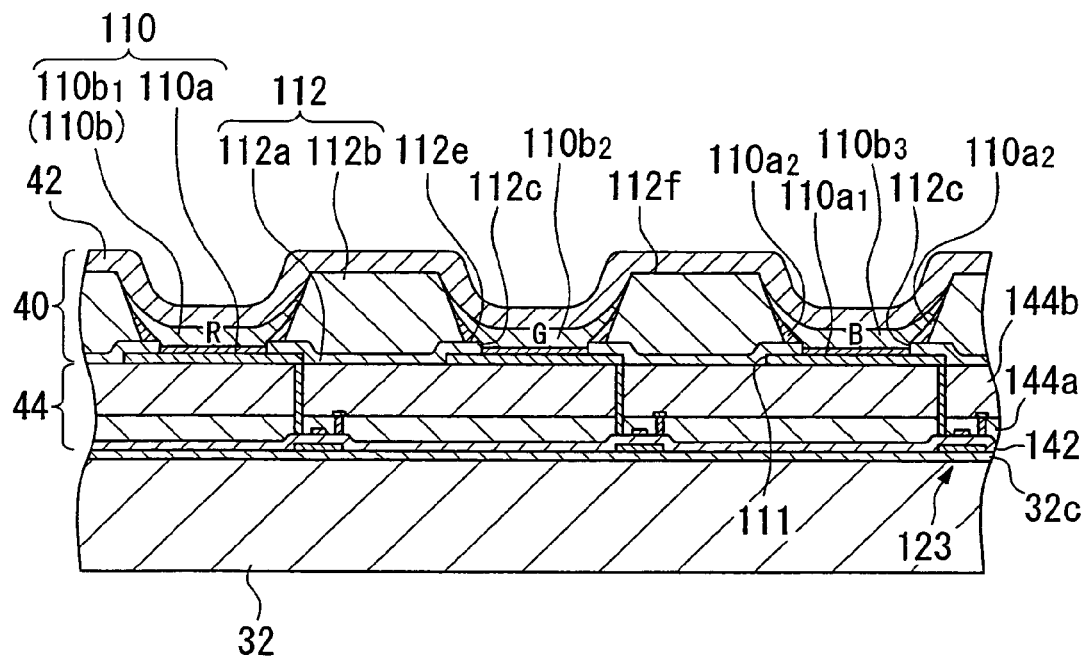
FIG. 49 is still yet another process diagram for explanation of the method of manufacture of the same display device.

Furthermore, although voltage is supplied to both the picture element electrode 511 and the inter layer insulating layer 530 which surrounds it, the present invention is not to be considered as being limited by this feature; for example, as shown in FIG. 49, it would also be acceptable, without supplying any voltage to the picture element electrode 511, to supply a positive voltage only to the inter layer insulating layer 530, and to thus bring the optical material liquid 540A to a positive electrical potential by induction. Since, according to this structure shown in FIG. 49, the optical material liquid 540A can reliably be maintained in this state at a positive induced potential even after application, accordingly it is possible more reliably to prevent the optical material liquid 540A flowing out to the surrounding portions, due to the repulsive force between it and the surrounding inter layer insulating layer 530.

Another Preferred Embodiment Related to a Method of Manufacture of an Electro Optical Device which Uses an Electroluminescent Element Next, another preferred embodiment of the method of manufacture of an electro optical device according to the present invention will be explained with reference to the drawings. In the following, the fact that this invention is applied to an electro optical device which is a display device of the active matrix type and which employs an electroluminescent display element is the same as in the case of the above described preferred embodiment, and also its circuit structure is the same as that of the previous preferred embodiment described above and shown in FIG. 14.

—Structure of the Display Device—

Figures 30A, 30B:
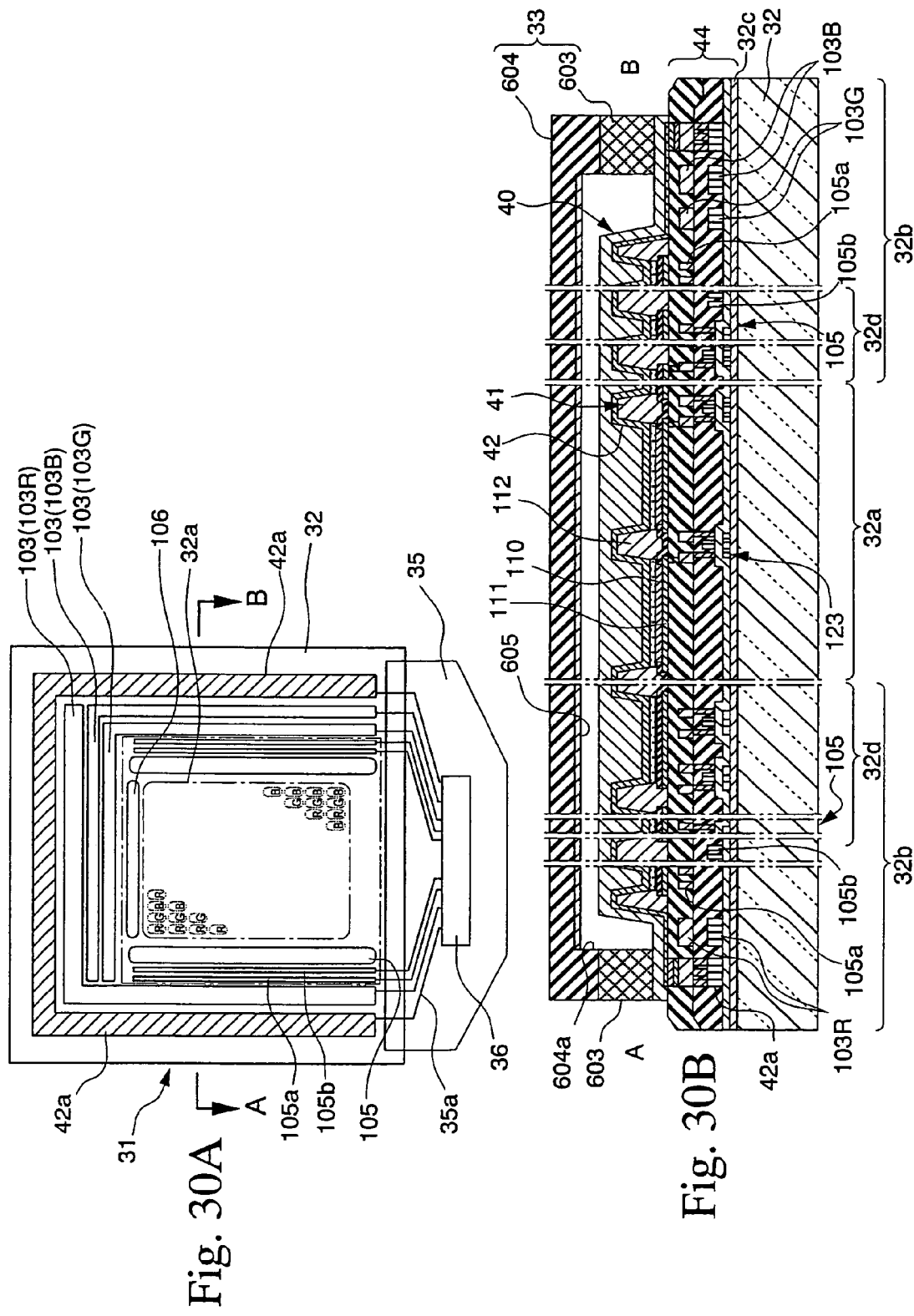
FIG. 30(A) is a view showing a display device according to another preferred embodiment of the electro optical device according to the present invention, and is a schematic plan view.
FIG. 30(B) is a sectional schematic figure taken in a plane shown by the arrows AB in its view FIG. 30(A).

FIG. 30(a) is a schematic plan view of the display device of this preferred embodiment, while FIG. 30(b) is a schematic sectional view taken in a plane shown by the arrows A-B in FIG. 30(a). As shown in these figures, the display device 31 according to this preferred embodiment of the present invention comprises a transparent base plate 32 which is made from glass or the like, a set of light emitting elements which are arranged in the form of a matrix, and a sealing substrate plate. The light emitting elements which are formed upon the base plate 32 are constituted by a picture element electrode, a functional layer, and a negative electrode 42.

The base plate 32 is a transparent substrate plate made of, for example, glass or the like, and is compartmented into a display region 32a which is positioned centrally upon the base plate 32, and a non display region 32b which is positioned around the peripheral edge of the base plate 32, disposed on the outside of the display region 32a.

The display region 32a is a region which is made up from light emitting elements which are arranged in the form of a matrix, i.e. is a so called available for display region. Furthermore, the non display region 32b is formed on the outside of the display region 32a. And a dummy display region 32d is formed in this non display region 32b, adjacent to the display region 32a.

Furthermore, as shown in FIG. 30(b), a circuit element portion 44 is provided between light emitting element portions 41, which are made up from light emitting elements and bank portions, and the base plate 32; and the previously mentioned scan lines, signal lines, hold capacity, switching thin film transistors, and thin film transistors 123 for drive and the like are provided to this circuit element portion 44.

Furthermore, one end of the negative electrode 42 is connected to a negative electrode connecting wire 42a which is formed upon the base plate 32, and the one tip portion of this connecting wire 42a is connected to a connecting wire 35a upon a flexible substrate plate 35. Furthermore, the connecting wire 35a is connected to a drive IC (drive circuit) 36 which is provided upon the flexible substrate plate 35.

Yet further, as shown in FIG. 30(a) and FIG. 30(b), electrical power supply lines 103 (103R, 103G, and 103B) are connected to the non display region 32b of the circuit element portion 44.

Furthermore, the previously mentioned scanning side drive circuits 105, 105 are provided at both sides as seen in FIG. 30(a) of the display region 32a. These scanning side drive circuits 105, 105 are provided within the circuit element portion 844 of the lower side of the dummy region 32d. Moreover, drive circuit control signal lead wires 105a which are connected to the scanning side drive circuits 105, 105 and drive circuit electric power source lead wires 105b are provided within the circuit element portion 44.

And furthermore, a checking circuit 106 is provided at the upper side of the display region 32a as seen in FIG. 30(a). By the use of this checking circuit 106, it is possible to perform checking of the quality of the display device during manufacture and before shipping, and to detect any defects in it.

Furthermore, as shown in FIG. 30(b), a sealing portion 33 is provided over the light emitting element portions 41. This sealing portion 33 is made up from a sealing resin 603a which is applied upon the base plate 32, and a covering and sealing substrate plate 604. The sealing resin 603 may consist of a heat curing resin or an ultraviolet light curing resin or the like, and in particular, it is desirable for it to be an epoxy resin, which is one type of heat curing resin.

This sealing resin 603 is applied in the form of a ring around the periphery of the base plate 32; for example, it may be applied by using a micro dispenser or the like (not shown in the figures). Since this sealing resin 603 bonds the base plate 32 and the covering and sealing cover plate 604 together, the entry of water or oxygen into the internal portion under the covering and sealing substrate plate 604, between it and the base plate 32, is positively prohibited, and accordingly oxidization of the negative electrode 42 or of a light emission layer, not shown in the figures, which is formed in the light emitting element portions 41 is prevented.

Since the covering and sealing substrate plate 604 is made from glass or a metallic material, and it is adhered to the base plate 32 with the sealing resin 603, accordingly a concave portion 604a is defined, in the inside of which the display element 40 is received. Furthermore, a getter element 605 which absorbs water or oxygen or the like is provided within this concave portion 604a, and accordingly it becomes possible to absorb any water or oxygen or the like which has penetrated to the internal portion of the device, below the sealing substrate plate 604. It should be understood that this getter material may be omitted, without departing from the scope of the present invention.

Figure 31:
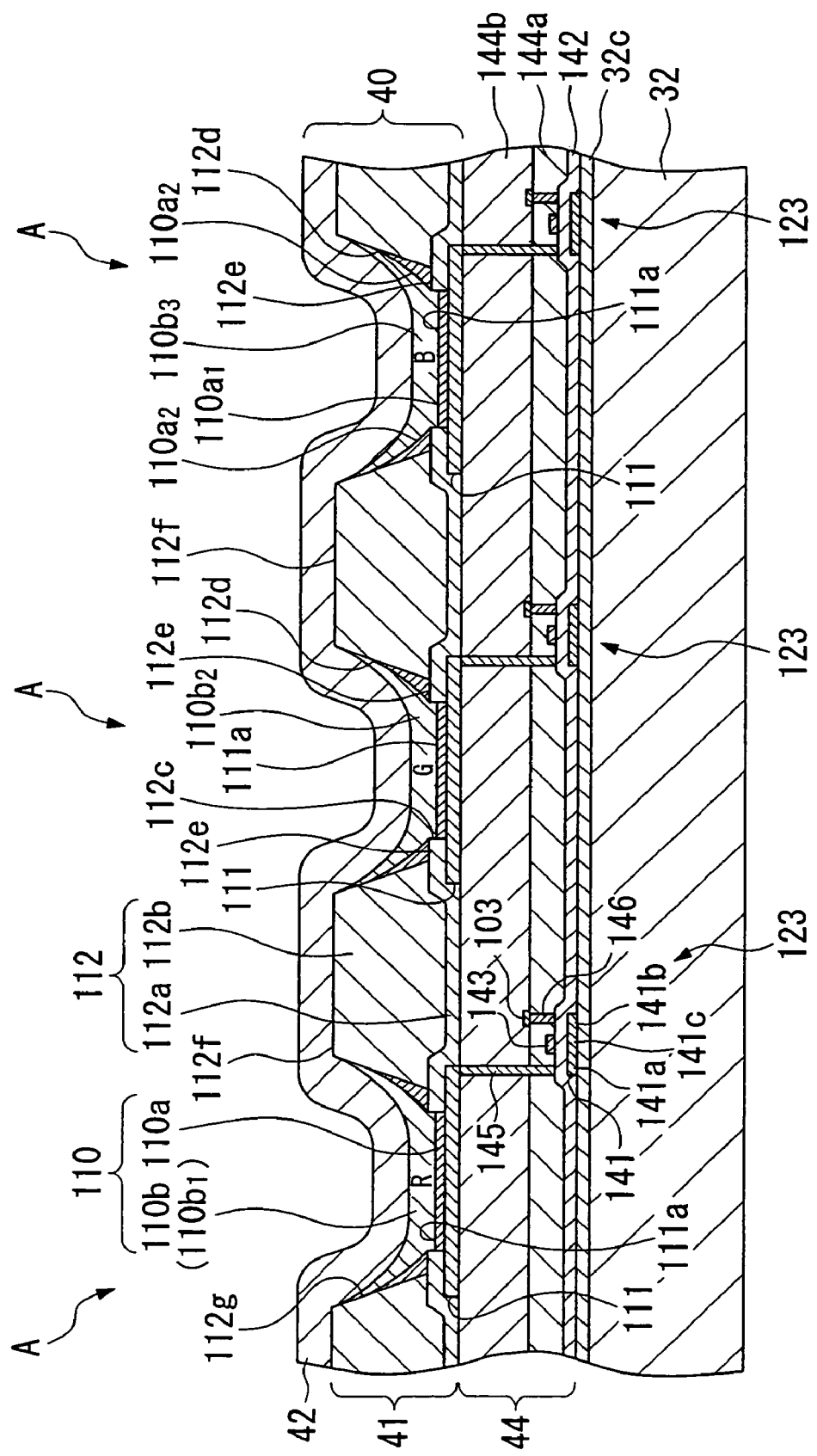
FIG. 31 is a view showing an essential portion of the same display device.

Next, a magnified view of the sectional structure of the display region of this display device is shown in FIG. 31. This figure includes three of the picture element regions A. This display device 31 comprises a circuit element portion 44 which is made of a circuit such as TFT or the like, and a light emitting portion 41 within which a functional layer 110 is formed, superimposed in order as layers upon the base plate 32.

With this display device 31, light which has been emitted from the functional layer 110 towards the side of the base plate 32 passes through the circuit element portion 44 and the base plate 32 and is emitted on the lower side of the base plate 32 (the observer side), and also the light which has been emitted from the functional layer 110 towards the side which is opposite to the base plate 32 is reflected by the negative electrode 42, and then passes through the circuit element portion 44 and the base plate 32, thus also coming to be emitted on the lower side of the base plate 32 (the observer side).

It should be understood that it would be possible for light to be emitted from the negative electrode side of the display device by using a transparent material for the negative electrode 42. It would be possible to use, as this transparent material, ITO, Pt, Ir, Ni, or Pd. It is desirable to make the film thickness be about 75 nm; or, alternatively, it may be desirable to make the film thickness even thinner.

In the circuit element portion 44, upon the base plate 32, there is formed a protective backing layer 32c which is made from silicon oxide film, and islands (blobs) of semiconductor film 141 which are made from polycrystalline silicon are formed upon this protective backing layer 32c. It should be understood that source regions 141a and drain regions 141b are formed in the semiconductor films 141 by high concentration P ion bombardment. Furthermore, a portion into which P has not been injected constitutes a channel region.

Furthermore, a transparent gate insulating layer 142 which covers over the protective backing layer 32c and the semiconductor films 141 is formed in the circuit element portion 44, gate electrodes 143 (the scan lines 101) made from Al, Mo, Ta, Ti, W or the like are formed over this gate insulating layer 142, and a transparent first inter layer insulating layer 144a and a transparent second inter layer insulating layer 144b are formed over the gate electrodes 143 and the gate insulating layer 142. The gate electrodes 143 are provided in positions which correspond to the channel regions 141c of the semiconductor films 141.

Furthermore, contact holes 145 and 146 for respectively connecting to the source and the drain regions 141a and 141b of the semiconductor films 141 re pierced through the first and the second inter layer insulating layers 144a and 144b.

And transparent picture element electrodes 111 which are made from ITO or the like are formed upon the second inter layer insulating layer 144b by patterning in a predetermined pattern, and the one set of contact holes 145 are connected to these picture element electrodes 111.

Furthermore, the other set of contact holes 146 are connected to the electric power source leads 103.

By this construction, in the circuit element portion 44, a thin film transistor 123 is connected to each of the picture element electrodes 111 for driving it.

It should be understood that, although thin film transistors 112 for the above described hold capacity and switching are also formed in the circuit element portion 44, they are not shown in FIG. 31, and their description will herein be curtailed.

Next, as shown in FIG. 31, the light emitting element portions 41 principally comprise functional layers 110 which are superimposed as layers over each of the plurality of picture element electrodes 111 . . . , bank portions 112 which are provided between each of the picture element electrodes 111 and the functional layers 110 and which compartment up the various functional layers 110, and the negative electrode 42 which is formed over these functional layers 110. These picture element electrodes (first electrodes) 111, functional layers 110, and the negative electrode 42 (the opposing electrode) together constitute the light emitting element.

Here, the picture element 111 is formed in a substantially rectangular pattern as seen in plan view by, for example, being formed from ITO. It is desirable for the thickness of this picture element region 111 to be from 50 to 200 nm, and more particularly it may be about 150 nm. The bank portions 112 are provided between each of these picture element electrodes 111 . . . .

The bank portions 112, as shown in FIG. 31, are each made by the superposition of an inorganic material bank layer 112a (the first bank layer) which is positioned on the side towards the base plate 32, and an organic material bank layer 112b (the second bank layer) which is positioned further from the base plate 32.

The inorganic material bank layers 112a and the organic material bank layers 112b are formed so as to ride up over the edge portions of the picture element electrodes 111. As seen in plan view, the structure is such that the surroundings of the picture element electrodes 111 and the inorganic material bank layers 112a are arranged so as to be superimposed upon one another. Furthermore, in the same manner, the organic material bank layers 112b are also, in plan view, superimposed over the one portions of the picture element electrodes 111. Furthermore, the inorganic material bank layers 112a are formed so that edge portions 112e thereof extend more towards the centers of the picture element electrodes 111 than do the organic material bank layers 112b. According to this construction, by these edge portions 112e of the inorganic material bank layers 112a being formed so as to extend more towards the centers of the picture element electrodes 111, lower opening portions 112c are formed which correspond to the positions where the picture element electrodes 111 are formed.

Furthermore, upper opening portions 112d are formed in the organic material bank layers 112b. These upper opening portions 112d are provided so as to correspond to the positions in which the picture element electrodes 111 are formed, and to the lower opening portions 112c. The upper opening portions 112d, as shown in FIG. 31, are made to be wider than the lower opening portions 112c and narrower than the picture element electrodes 111. Furthermore, it may be the case that the positions of the tops of the upper openings 112d and of the tip portions of the picture element electrodes 111 are made to be almost in the same position. In this case, as shown in FIG. 31, the sections of the upper openings 112d of the organic material bank layer 112b are formed so as to be inclined.

And, by connecting together the lower opening portions 112c and the upper opening portions 112d in the bank portions 112, opening portions 112g are defined which are pierced through the inorganic material bank layers 112a and the organic material bank layers 112b.

Furthermore, it is desirable to make the inorganic material bank layers 112a from an inorganic material such as, for example, $SiO_2$, $TiO_2$, or the like. The film thickness of this inorganic material bank layer 112a is desirably in the range from 50 to 200 nm, and in particular may be 150 nm. If the film thickness is less than 50 nm, the inorganic material bank layers 112a becomes thinner than a positive hole injection/transport layer which will be described hereinafter, which is not desirable, since it becomes impossible to ensure the flatness of the positive hole injection/transport layer. On the other hand, if the film thickness is greater than 200 nm, then the steps due to the lower opening portions 112c become large, and this is not desirable, because it becomes impossible to ensure the flatness of a light emission layer which will be described hereinafter which is superimposed over the positive hole injection/transport layer.

Furthermore, the organic material bank layers 112b are formed of a material which is heat resistant and solvent resistant, such as acrylic resin, polyimide resin, or the like. The thickness of these organic material bank layers 112b is desirably in the range of from 0.1 to 3.5 µm, and in particular may be about 2 µm. If their thicknesses are less than 0.1 µm, then the organic material bank layers 112b become thinner than the total thickness of the positive hole injection/transport layer and the light emission layer which will be described hereinafter, and this is not desirable, because there is a danger that the light emission layer might overflow from the upper opening portions 112d. On the other hand, if the thicknesses of the organic material bank layers 112b are less than 0.1 µm, then the steps due to the upper opening portions 112d become large, and this is not desirable, because it becomes impossible to ensure the step coverage of the negative electrode 42 which is formed upon the organic material bank layer 112b. Furthermore, if the thicknesses of the organic material bank layers 112b are greater than 0.2 µm, this is desirable from the point of view that it becomes possible to enhance the insulation with respect to the thin film transistors for drive 123.

Furthermore, both regions which exhibit hydrophilic characteristics and regions which exhibit hydrophobic characteristics are formed upon the bank portions 112.

The regions which exhibit hydrophilic characteristics are the first layered portions of the inorganic material bank layers 112a and the electrode surfaces 111a of the picture element electrodes 111, and these regions are surface processed so as to have hydrophilic characteristics by plasma processing using oxygen as the processing gas. On the other hand, the regions which exhibit hydrophobic characteristics are the wall surfaces of the upper opening portions 112d and the upper surfaces 112f of the organic material bank layers 112, and these regions are surface processed so as to have hydrophobic characteristics by plasma processing using Tetrafluoromethane or Tetrafluorocarbon as the processing gas. It should be understood that it would also be acceptable to make the organic material bank layers from a material which included a fluorinated polymer.

Next, as shown in FIG. 31, the functional layer 110 is made from a positive hole injection/transport layer 110a which is superimposed over the picture 1 element electrode 111, and a light emission layer 110b which is formed adjacent to and over this positive hole injection/transport layer 110a. It should be understood that it would also be acceptable to form yet another functional layer, adjacent to the light emission layer 110b, which was endowed with the function of acting as an electron injection/transport layer and the like.

The positive hole injection/transport layer 110a, along with being endowed with the function of injecting positive holes into the light emission layer 110b, also is endowed with the function of transporting these positive holes within the internal portion of this positive hole injection/transport layer 110a. By providing this type of positive hole injection/transport layer 110a between the picture element electrode 111 and the light emission layer 110b, the light emission efficiency of the light emission layer 110b, and the characteristics of this display component such as its service lifetime and the like, are enhanced. Furthermore, in the light emission layer 110b, the positive holes which have been injected from the positive hole injection/transport layer 110a and the electrons which have been injected from the negative electrode 42 are united with one another, and thereby light emission is obtained.

The positive hole injection/transport layer 110*a* is made up from flat portions 110*a*1 which are formed over the picture element electrode surfaces 111*a* which are positioned within the lower opening portions 112*c*, and peripheral edge portions 110*a*2 which are formed over the first superimposed layer portions 112*e* of the inorganic material bank layers which are positioned within the upper opening portions 112*d*. Furthermore, due to its structure, the positive hole injection/transport layer 110*a* is positioned over the picture element electrodes 111, and moreover it is only formed between the inorganic material bank layers 112*a*, i.e. the lower opening portions 110*c* (there are also possible embodiments in which it is only made in the flat portions which have been previously described).

The thickness of these flat portions 110*a*1 is made to be constant, and to fall, for example, in the range from 50 to 70 nm.

If the peripheral edge portions 110*a*2 are formed, these peripheral edge portions 110*a*2, along with being positioned over the first superimposed portions 112*e*, are tightly adhered to the wall surfaces of the upper openings 112*d*, in other words to the organic material bank layers 112*b*.

Furthermore, the thickness of the peripheral edge portions 110*a*2 is thinner at their sides closer to the electrode surfaces 111*a*, and increases along the direction away from the electrode surfaces 111*a*, and is at its thickest near to the wall surfaces of the lower opening portions 112*d*.

The reason that the peripheral edge portions 110*a*2 exhibit the above type of shape, is because the positive hole injection/transport layer 110*a* is formed by discharging a first mixture material containing the source material for the positive hole injection/transport layer and a polar solvent, into the opening portions 112, and then by eliminating the polar solvent by vaporization, and this vaporization of the polar solvent principally takes place over the first superimposed layer portions 112*e* of the inorganic material bank layers 112*a*, so that the source material for the positive hole injection/transport layer is thickened and deposited over these first superimposed layer portions 112*e*, so as to be concentrated therein.

Furthermore, the light emission layers 110*b* are formed over the surfaces of the flat portions 110*a*1 and the peripheral edge portions 110*a*2 of the positive hole injection/transport layer 110*a*, and their thicknesses over the flat portions 112*a*1 are in the range of from 50 to 80 nm.

The light emission layers 110*b* are of three types—a red colored light emission layer 110*b*1 which emits red (R) colored light, a green colored light emission layer 110*b*2 which emits green (G) colored light, and a blue colored light emission layer 110*b*3 which emits blue (B) colored light; and these various light emission layers 110*b*1 through 110*b*3 are, in this embodiment, arranged in stripe form.

As has been described above, since the peripheral edge portions 110*a*2 of the positive hole injection/transport layers 110*a* are tightly contacted against the wall surfaces of the upper opening portions 112*d* (the organic material bank layers 112*b*), thus the light emission layers 110*b* do not directly contact against the organic material bank layers 112*b*. Accordingly, the possibility of water which is included as an impurity in the organic material bank layers 112*b* shifting to the side of the light emission layers 110*b* can be positively blocked by the peripheral edge portions 110*a*2, and thus it is possible to prevent oxidization of the light emission layers 110*b* by such percolating water.

Furthermore, since the peripheral edge portions 110*a*2 are formed in uneven thickness over the first superimposed layer portions 112*e* of the inorganic material bank layers, accordingly the peripheral edge portions 110*a*2 come to be in the state of being insulated from the picture element electrodes 111 by the first superimposed layer portions 112*e*, and thus positive holes are not injected from the peripheral edge portions 110*a*2 into the light emission layers 110*b*. Due to this, the electric current only flows from the picture element electrodes 111 into the flat portions 112*a*, and it is possible to ensure that the transport of positive holes from the flat portions 112*a*1 into the light emission layers 110*b* is even, so that, along with light only being emitted from the central portions of the light emission layers 110*b*, also it is possible to make the amount of light which is generated by the light emission layers 10*b* to be constant.

Yet further, since the inorganic material bank layers 112*a* are extended yet further towards the centers of the picture element electrodes 111 than the organic material bank layers 112*b*, accordingly it is possible to perform trimming of the shapes of the portions where the picture element electrodes 111 and the flat portions 110*a*1 are connected together by these inorganic material bank layers 112*a*, and thus it is possible to repress deviation in light generation strength between the various light emission layers 110*b*.

Even further, since the electrode faces 111*a* of the picture element electrodes 111 and the first superimposed layer portions 112*e* of the inorganic material bank layers both exhibit hydrophilic characteristics, accordingly the functional layers 110 are uniformly sealed against the picture element electrodes 111 and the inorganic material bank layers 912*a*, and the functional layer 110 does not become extremely thin over the inorganic material bank layers 112*a*, so that it is possible to prevent short circuiting between the picture element electrodes 111 and the negative electrode 42.

Again, since the upper surfaces 112*f* of the organic material bank layers 112*b* and the wall surfaces of the upper opening portions 112*d* both exhibit hydrophobic characteristics, the tightness of contact between the functional layers 110 and the organic material bank layers 112*b* becomes low, and it does not happen that the functional layers 110 are made to overflow from the opening portions 112*g*.

Moreover, as the material for making the positive hole injection/transport layer, for example, dispersion liquid of a mixture of polythiophenederivetive etc., for instance polyethylenedioxythiophene, and polystilenesuofonic acid etc. (PEDOT/PSS) may be used. Furthermore, as the material for making the light emission layer 110*b*, for example, polyfluorenederivative, polyphenylenederivative, polyvinylcarbazole, polythiophenederivative, or doped materials by doping perylene group pigments, coumaline group pigments, rhodamine group pigments, for instance, rublene, perylene, 9,10-diphenylanthracene, tetraphenylbutadiene, neilred, coumalin 6, quinacridone with the above polymers may be used.

Next, the negative electrode 42 is formed over the entire surface of the light emitting element portions 41, and, as a pair with the picture element electrodes 111, it fulfils the function of conducting electrical current to the functional layers 110. This negative electrode 42 may be made, for example, as a superposition of a calcium layer and an aluminum layer. At this time, it is desirable to provide the one whose work function is the lower to the negative electrode on the side which is closer to the light emission layer, and in particular, in this embodiment, to directly contact it to the light emission layer 110*b*, so as to fulfill the function of injecting electrons into the light emission layer 110*b*. Furthermore, it sometimes is the case that it is desirable to provide LiF between the light emission layer 110 and the negative electrode 42, since lithium fluoride is efficient at causing light to be emitted from the material for the light emission layer.

Furthermore, the material for the red colored (R) and the green colored (G) light emission layers 110b1 and 110b2 is not limited to being lithium fluoride; it would be acceptable to employ some other material. Accordingly, in this case, it would be acceptable to make only the blue colored (B) light emission layer 110b3 from lithium fluoride, and to superimpose thereupon the other red colored (R) and the green colored (G) light emission layers 110b1 and 110b2 which were made from some other material than lithium fluoride. Furthermore, it would also be acceptable not to form any lithium fluoride over the red colored (R) and the green colored (G) light emission layers 110b1 and 110b2, but to make them only from calcium.

Moreover, the thickness of the lithium fluoride is desirably in the range of, for example, 2 to 5 nm, and in particular it may be approximately 2 nm. Furthermore, the thickness of the calcium is desirably in the range of, for example, 2 to 50 nm, and in particular it may be approximately 20 nm.

Furthermore, since the aluminum of which the negative electrode 42 is made reflects light which is emitted from the light emission layer 110b towards the side of the base plate 32, it is desirable for it to include some layer other than aluminum, such as an Ag layer or a superimposed combination of Al and Ag, or the like. Furthermore, it is desirable for the thickness of this layer to be within the range of, for example, 100 to 1000 nm, and in particular it is desirable for it to be approximately 200 nm.

Yet further, it would also be acceptable to provide a protective layer for preventing oxidization made from SiO, $SiO_2$, SiN or the like upon the aluminum negative electrode 42.

Moreover, the sealing cover plate 604 may be provided over this light emitting element which has been made in the above manner. As shown in FIG. 30(b), this sealing cover plate 604 may be adhered with the sealing resin 603, so as to form the display device 31.

—Method of Manufacture of the Display Device—

Next, a method of manufacture of this display device according to this preferred embodiment of the present invention will be explained with reference to the figures.

A method of manufacture of the display device 31 of this preferred embodiment, for example, may consist of (1) a process of formation of the bank portions; (2) a process of plasma processing (which may include a process of hydrophilization or water repellentation); (3) a process of forming the positive hole injection/transport layer (a process of forming the functional layer); (4) a process of formation of the light emission layer (a process of forming the functional layer); (5) a process of formation of the opposing electrode (the negative electrode); and (6) a process of sealing. It should be understood that the method of manufacture of the display device 831 is not necessarily limited to the combination of the above processes performed in the above order; according to requirements, various ones of these processes could be omitted, or some others could be added.

(1) The Process of Formation of the Bank Portions

The process of formation of the bank portions is a process of forming the bank portions 112 in predetermined positions upon the base plate 32. In these bank portions 112, the inorganic material bank layers 112a are formed as first bank layers, and the organic material bank layers 112b are formed as second bank layers. The method of formation of these bank layers will now be explained.

(1)-1 The Process of Forming the Inorganic Material Bank Layers 112a

Figure 32:
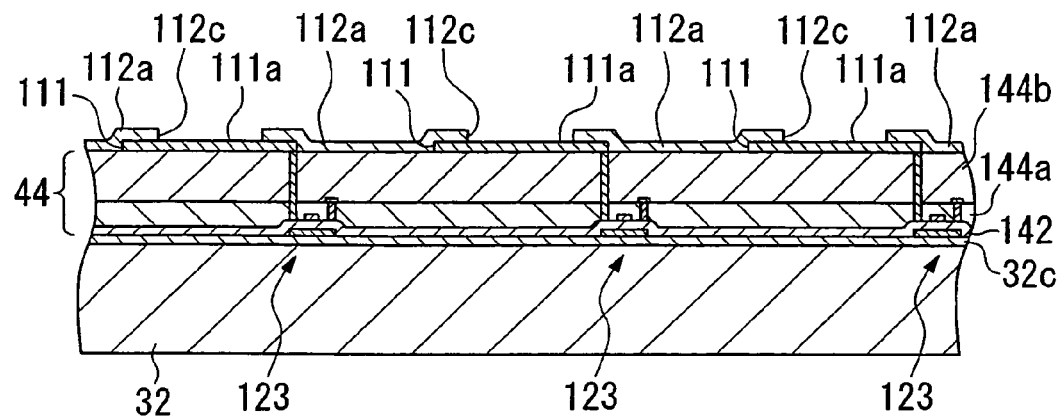
FIG. 32 is a process diagram for explanation of the method of manufacture of the same display device.

First, as shown in FIG. 32, the inorganic material bank layers 112a are formed upon the substrate in the predetermined positions. These positions in which the inorganic material bank layers 112a are formed are upon the second inter layer insulating layer 144b and upon the electrode (here, the picture element electrode) 111. It should be understood that the second inter layer insulating layer 144b is formed on top of the circuit element portion 44 in which the various components such as the thin film transistors, the scan lines, the signal lines, and on are provided.

The inorganic material bank layers 112a, for example, may be made as inorganic material layers using $SiO_2$, $TiO_2$ or the like. These materials may be formed, for example, using a CVD method, a coating method, a spattering method, a vacuum evaporation method, or the like.

Furthermore, it is desirable for the film thickness of the inorganic material bank layers 112a to be in the range from 50 to 200 nm, and in particular it may be 150 nm.

First, the inorganic material bank layers 112a are formed as an inorganic material layer over the entire surfaces of the inter layer insulating layer 114 and the picture element electrode 111, and, after this, the inorganic material bank layers 112a are formed by patterning this inorganic material layer by a photolithographic method or the like, so as to create opening portions. These opening portions are located in positions corresponding to the positions of formation of the electrode surfaces 111a of the picture element electrodes 111, and accordingly, as shown in FIG. 32, are provided as the lower opening portions 112c.

At this time, the inorganic material bank layers 112a are formed so as to overlay the peripheral edge portions (the one portions) of the picture element electrodes 111. As shown in FIG. 32, it is possible to control the light emission region of the light emission layer 110 by thus forming the inorganic material bank layers 112a so that the one portions of the picture element electrodes 111 and the inorganic material bank layers 112a overlap.

(1)-2 The Process of Forming the Organic Material Bank Layers 112b

Next, the organic material bank layers 112b are formed as second bank layers.

Figure 33:
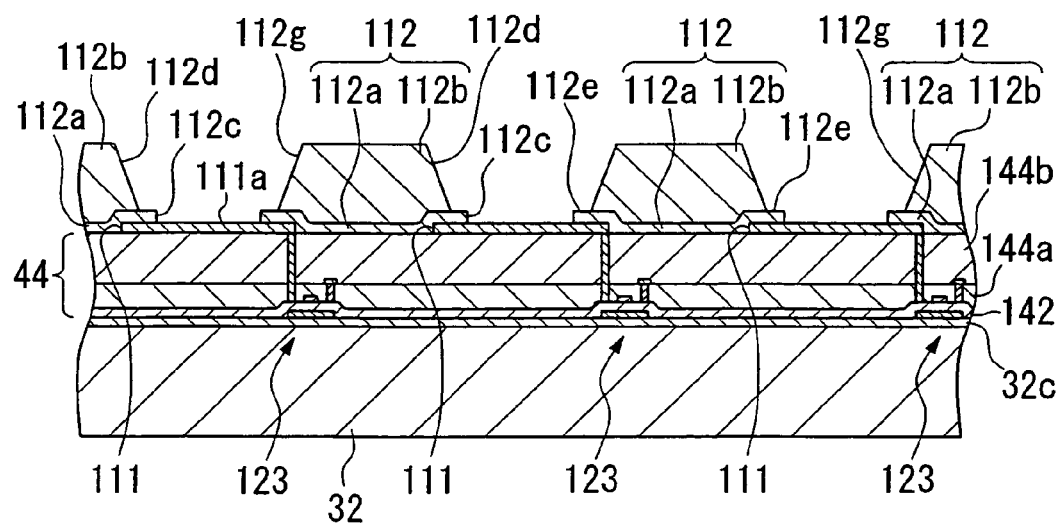
FIG. 33 is another process diagram for explanation of the method of manufacture of the same display device.

As shown in FIG. 33, the organic material bank layers 112b are formed upon the inorganic material bank layers 112a. These organic material bank layers 112b should be made from a material which is heat resistant and solvent resistant, such as, for example, acrylic resin, polyimide resin or the like. Using such a material, the organic material bank layers 112b are formed by patterning employing a technique such as photolithography or the like. It should be understood that the upper opening portions 112d are formed in these organic material bank layers 112b during this patterning. These upper opening portions 112d are provided in positions which correspond to the positions of the electrode faces 111a and the lower opening portions 112c.

It is desirable for the upper opening portions 112d to be made, as shown in FIG. 33, wider than the lower opening portions 112c which were formed in the inorganic material bank layer 112a. Furthermore, it is desirable for the organic material bank layer 112b to be formed as tapered, in other words, it is desirable for the opening portions of the organic material bank layers to be formed narrower than the width of the picture element electrodes 111, while, at the uppermost surface of the organic material bank layers 112b, these organic material bank layers 112b are formed so as to have almost the same widths as the widths of the picture element electrodes 111. According to this, the first layer superimposed portions 112e which surround the lower opening portions 112c of the inorganic material bank layers 112a come to be formed so as to extend further towards the centers of the picture element electrodes 111 than the organic material bank layers 112b.

By juxtaposing together the upper opening portions 112d which are formed in the organic material bank layers 112b and the lower opening portions 112c which are formed in the inorganic material bank layers 112a in this manner, the opening portions 112g are formed so as to pierce through the inorganic material bank layers 112a and the organic material bank layers 112b.

Furthermore, it is desirable for the film thickness of the organic material bank layers 112b to be in the range from 0.1 to 3.5 µm, and in particular it may be about 2 µm. The reason why this range is employed will now be explained.

That is to say, if the thickness of the organic material bank layers 112b is less than 0.1 µm, the inorganic material bank layers 112b become thinner than the total of the thicknesses of the positive hole injection/transport layer and the light emission layers which will be described hereinafter, and there is a danger that the light emission layers 110b will overflow from the upper opening portions 112d, which would be most undesirable.

Furthermore, if the thickness of the organic material bank layers 112b is greater than 3.5 µm, the steps become bigger than the upper opening portions 112d, and this is not desirable, since it becomes impossible to guarantee the step coverage of the negative electrode 42 at the upper opening portions 112d. Furthermore, it is desirable for the thickness of the organic material bank layers to be made to be greater than 2 µm, from the point of view of being able to enhance the degree of insulation between the negative electrode 42 and the thin film transistors 123 for driving.

(2) The Plasma Processing Process

The following plasma processing process is performed with the objective of activating the surfaces of the picture element electrodes 111, and also with the objective of performing surface processing of the surfaces of the bank portions 112. In particular, the activation process is performed with the principal objectives of cleaning the surface of the picture element electrodes 111 (ITO), and also of adjusting the work function thereof. Furthermore, a process of making the surfaces of the picture element electrodes to be hydrophilic (a hydrophilization process) and a process of making the surfaces of the bank portions 912 to be hydrophobic (a water repellentation process) are performed.

This plasma processing process can generally, for example, be separated into the following processes: (2)-1 a preliminary heating up process; (2)-2 an activation processing process (a process of hydrophilization); (2)-3 a hydrophobic processing process (a process of water repellentation); and (2)-4 a process of cooling. It should be understood that the plasma processing process is not necessarily limited to the combination of the above processes performed in the above order; according to requirements, various ones of these processes could be omitted, or some others could be added.

Figure 34:
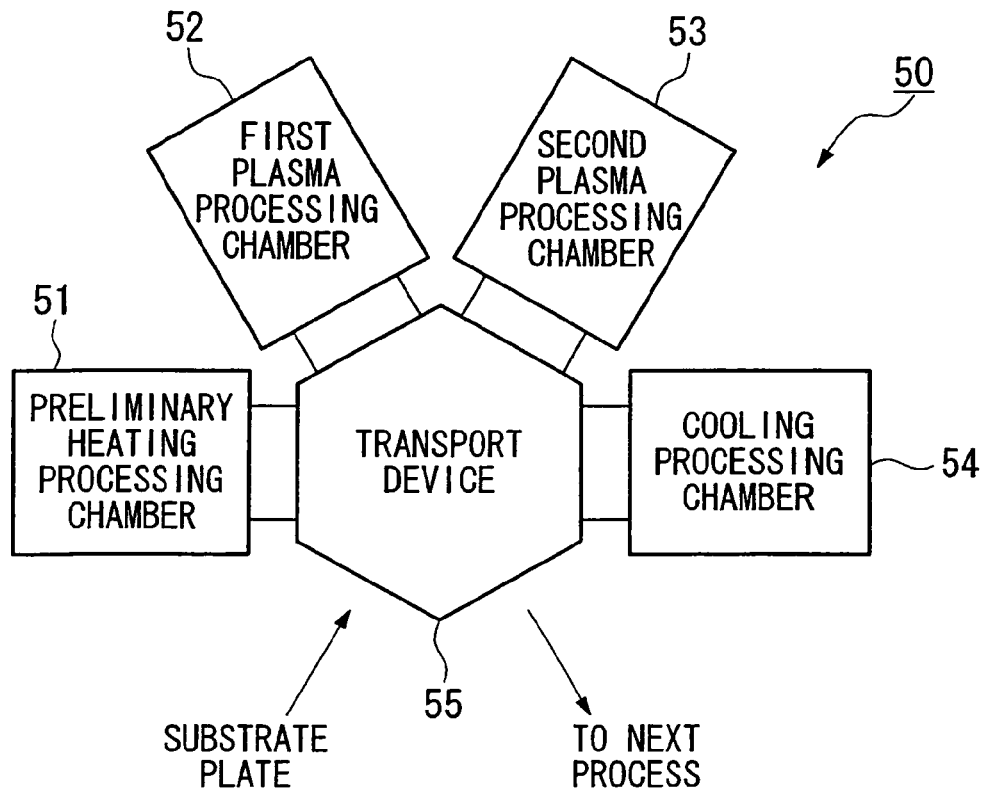
FIG. 34 is a schematic plan view showing one example of a plasma processing device which is utilized in the manufacture of the same display device.

First, FIG. 34 shows a plasma processing device which is used for this plasma processing process.

The plasma processing device 50 shown in FIG. 34 comprises a preliminary heating processing chamber 51, a first plasma processing chamber 52, a second plasma processing chamber 53, a cooling processing chamber 54, and a transport device 55 which transports the base plate 32 into each of these processing chambers 51 through 54. These processing chambers 51 through 54 are arranged radially around the transport device 55, which is at the center.

First, the overall process which employs these devices will be explained.

The preliminary heating up process is performed in the preliminary heating processing chamber 51 shown in FIG. 34. And the base plate 32 which has been transported from the previous bank portion formation process is heated up to a predetermined temperature in this preliminary heating processing chamber 51.

After the preliminary heating up process, a hydrophilization processing process and a water repellentation processing process are performed. That is to say, the work-piece is transported in order to the first plasma processing chamber 52 and then to the second plasma processing chamber 53, and plasma processing is performed upon the bank portions 112 in each of these plasma processing chambers 52 and 53, so as to subject them to hydrophilization. After this hydrophilization process, water repellentation processing is performed. After this water repellentation process, the work-piece is transported to the cooling processing chamber 54, and in this cooling processing chamber 54 the work-piece is cooled to room temperature. After this cooling process, the work-piece is transported by the transport device to the positive hole injection/transport layer formation process, which is the next major process in order to be performed.

In the following, these various processes will be explained in detail.

(2)-1 The Preliminary Heating Up Process

This preliminary heating up process is performed by the preliminary heating processing chamber 51. In this processing chamber 51, the base plate 832 which includes the bank portions 112 is heated up to a predetermined temperature.

As a method of heating up the base plate 32, for example, the means may be employed of fitting a heater upon a stage upon which the base plate 32 is mounted in the processing chamber 51, and of heating up the base plate 32 together with the stage by this heater. It should be understood that it would also be possible to utilize various other methods, as appropriate.

The base plate 32 is heated up in the preliminary heating processing chamber 51 to, for example, a temperature of 70 degree Celsius to 80 degree Celsius. This temperature is the processing temperature for the plasma processing which is the next process, and the base plate 32 is heated up as a preparation for this next process, with the objective of eliminating variations in the temperature of the base plate 32.

If hypothetically this preliminary heating up process were not to be applied, then, during the plasma processing process, the processing would be performed while the temperature was always varying from the start of the process to the end of the process, as the base plate 32 was heated up from room temperature to the above type of temperature. Accordingly, due to performing the plasma processing while the work-piece temperature was varying, there would be a possibility that the characteristic of the resulting organic electro-luminescent display element might be uneven. Therefore the preliminary heating up process is performed, in order to maintain constant processing conditions, and in order to obtain a uniform characteristic for the resultant product.

In this connection, when, in the plasma processing process, a hydrophilization process or a water repellentation process is performed in the state in which the base plate 32 is held upon the stage within the first and second plasma processing devices 52 and 53, it is desirable for the preliminary heating up temperature to be almost the same temperature as the temperature of the sample stage 56 upon which the hydrophilization process or the water repellentation process is continuously performed.

Thus, by raising the temperature of the sample stage within the first and second plasma processing devices 52 and 53 so as to perform preliminary heating up of the base plate 32 in advance to a temperature of, for example, 70 degree Celsius to 80 degree Celsius, it is possible to keep the plasma processing conditions almost constant from directly after the start of the processing until just before the end of the processing, even in the case that plasma processing is being performed continuously upon a large number of work-pieces. Due to this, the processing conditions upon the surface of the base plate 832 are made constant, and it is possible to keep the dampness of the material of which the bank portions 112 are composed more uniform, so that it becomes possible to manufacture a display device which is of constant quality.

Furthermore, by thus performing preliminary heating up of the base plate 32 in advance, it becomes possible to shorten the processing time period which is required for the subsequent plasma processing.

(2)-2 The First Activation Processing Process (the Process of Hydrophilization)

Next, activation processing is performed in the first plasma processing chamber 52. This activation processing includes adjusting and controlling the work function of the picture element electrodes 111, cleaning the surfaces of the picture element electrodes 111, and performing hydrophilization processing of the surfaces of the picture element electrodes 111.

Figure 35:
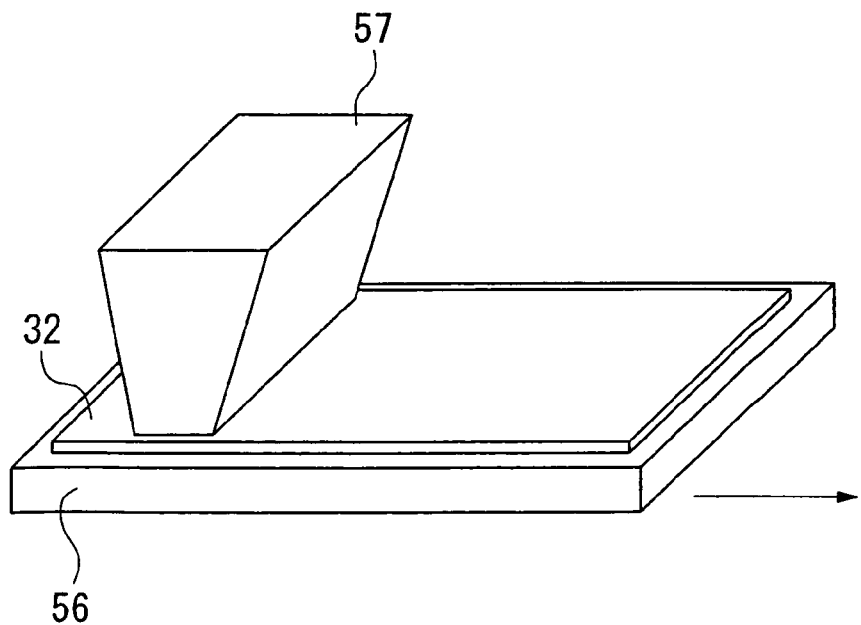
FIG. 35 is a schematic view showing an internal structure of a first plasma processing chamber of the plasma processing device shown in FIG. 34.

As a hydrophilization process, plasma processing is performed in an ambient atmosphere using oxygen as the processing gas (so called $O_2$ plasma processing). In FIG. 35, this first plasma processing process is schematically shown. As shown in FIG. 35, the base plate 32 including the bank portions 112 is loaded upon the sample stage 56 which includes a heater, and a plasma electrical discharge electrode 57 is arranged to oppose the base plate 32 at a distance or gap interval of approximately 0.5 to 2 mm from the upper side of the base plate 832. The base plate 832 is transported by the sample stage 56 at a predetermined transport speed in the direction of the arrow in the figure while being heated up by the sample stage 56, and during this transportation the base plate 32 is irradiated with oxygen in the plasma state.

The conditions of this $O_2$ plasma processing, for example, may be: plasma power 100 to 800 kW, oxygen gas flow rate 50 to 100 ml/min, base plate transport speed 0.5 to 10 mm/sec, and work-piece temperature 70 degree Celsius to 90 degree Celsius. It should be understood that the heating up by the sample stage 56 is principally performed in order to maintain the temperature of the base plate 32 which has been previously subjected to preliminary heating up, as explained above.

Figure 36:
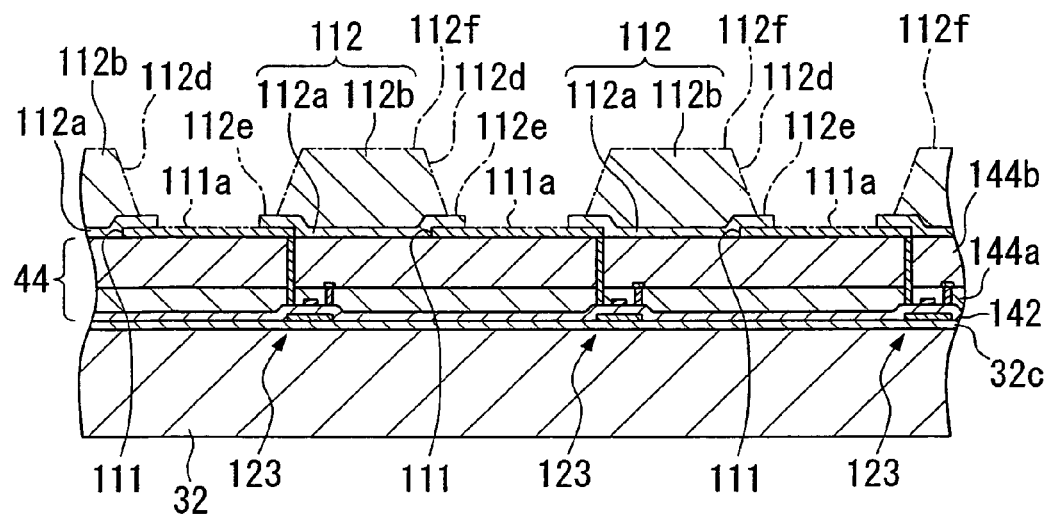
FIG. 36 is a process diagram for explanation of the method of manufacture of the same display device.

By this $O_2$ plasma processing, as shown in FIG. 36, the electrode surfaces 111*a* of the picture element electrodes 111, the first superimposed layer portions 121*e* of the inorganic material bank layers 112*a*, and the wall surfaces of the upper opening portions 112*d* and the upper surfaces 112*f* of the organic material bank layers 912*b* are processed to be hydrophilic.

Hydroxyl groups are introduced into these various surfaces by this hydrophilization processing, so as to endow them with hydrophilic characteristics.

The portions which have been subjected to hydrophilization processing are shown in FIG. 36 by the single dotted broken lines.

It should be understood that this $O_2$ plasma processing does not only impart a hydrophilic characteristic to the subject surfaces; by the above described processing, it also serves to clean the ITO which constitutes the picture element electrodes, and also to adjust its work function.

(2)-3 The Second Hydrophobic Processing Process (the Process of Water Repellentation)

Next, as a water repellentation process, plasma processing is performed in the second plasma processing chamber 53 in an ambient atmosphere, using tetrafluoromethane as the processing gas (so called $CF_4$ plasma processing). The internal structure of the second plasma processing chamber 53 is the same as the internal structure of the first plasma processing chamber 52 shown in FIG. 35. In other words, the base plate 32 is transported by the sample stage at a predetermined transport speed while being heated up by the sample stage 56, and during this transportation the base plate 32 is irradiated with tetrafluoromethane ($CF_4$) in the plasma state.

The conditions of this $CF_4$ plasma processing, for example, may be: plasma power 100 to 800 kW, $CF_4$ gas flow rate 50 to 100 ml/min, work-piece transport speed 0.5 to 1020 mm/sec, and work-piece temperature 70 degree Celsius to 90 degree Celsius. It should be understood that, just as was the case in the first plasma processing chamber 52, the heating up by the sample stage is principally performed in order to maintain the temperature of the base plate 32 which has been previously subjected to preliminary heating up, as explained above.

Moreover, it should be understood that the processing gas is not limited to being tetrafluoromethane; it would also be possible to utilize some other fluorocarbon type gas.

Figure 37:
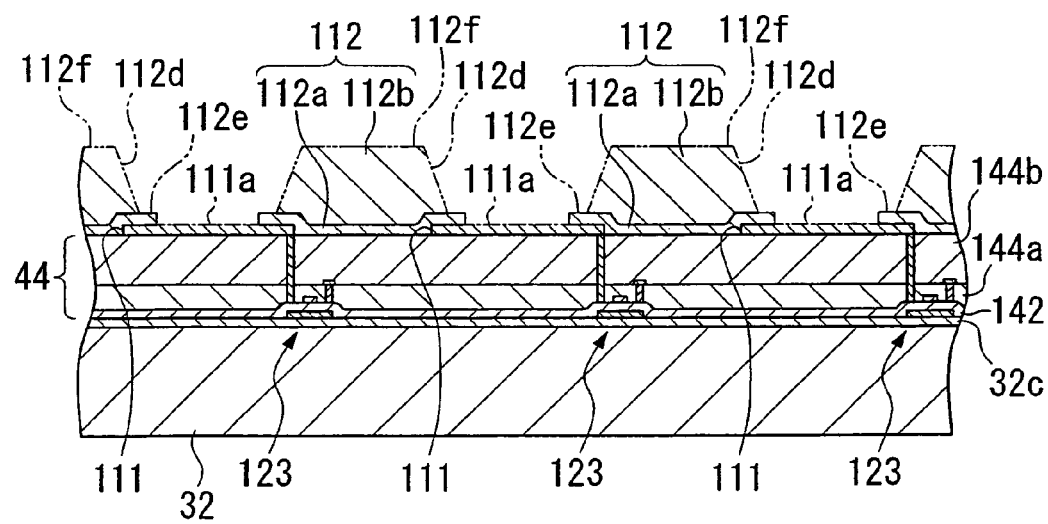
FIG. 37 is another process diagram for explanation of the method of manufacture of the same display device.

By this $CF_4$ plasma processing, as shown in FIG. 37, the wall surfaces of the upper opening portions 112*d* and the upper surfaces 112*f* of the organic material bank layers are processed to be hydrophobic. Fluorine groups are introduced into these various surfaces by this water repellentation processing, so as to endow them with hydrophilic characteristics. The portions which have been subjected to water repellentation processing are shown in FIG. 37 by the double dotted broken lines. The organic material such as acrylic resin, polyimide resin or the like of which the organic material bank layers 112*b* are composed can be easily hydrophobized by irradiation with fluorocarbon in the plasma state. Furthermore, this preferred embodiment of the present invention is particularly effective, because the particular characteristic is exhibited that the portions which have been subjected to preliminary processing with $O_2$ plasma can more easily be fluoridized.

It should be noted that, although the electrode surfaces 111*a* of the picture element electrodes 111 and the first superimposed layer portions 112*e* of the inorganic material bank layers 112*a* are also subjected to the influence of this $CF_4$ plasma processing to a greater or lesser extent, very little influence is exerted upon their dampness. In FIG. 37, The portions which exhibit hydrophilic characteristics are shown by the single dotted broken lines.

(2)-4 The Process of Cooling

Next, as a cooling process, the base plate 32 which was heated up for the plasma processing processes is cooled to a controlled temperature using the cooling processing chamber 54. In other words, this process is performed for cooling the work-piece to the suitable operating temperature for a liquid drop discharge process (a functional layer formation process) which is the subsequent process.

This cooling processing chamber 54 comprises a plate for holding the base plate 32, and this plate is made to include a water cooling device, so as to cool the base plate 32.

Furthermore, by cooling the base plate 32 after the plasma processing to room temperature or to a predetermined temperature (for example, the operating temperature for the liquid drop discharge process), the temperature of the base plate 32 becomes constant in the subsequent process of formation of the positive hole injection/transport layer, and it is possible to perform the subsequent processes at an even temperature with the base plate 32 not being subject to temperature variations. Accordingly, by adding this type of cooling process, it is possible to form uniformly the material which is discharged by the discharge means such as a liquid drop discharge method or the like.

For example, when discharging a first composite material which includes a material for forming the positive hole injection/transport layer, it is possible to discharge this first composite material continuously at a constant volume, so that it is possible to form a uniform positive hole injection/transport layer.

In the above described plasma processing processes, it is possible easily to provide the desired regions of hydrophilic characteristics and the regions of hydrophobic characteristics upon the bank portions 112, by processing the organic material bank layers 112b and the inorganic material bank layers 112a by $O_2$ plasma processing and $CF_4$ plasma processing in sequence.

Figure 38:
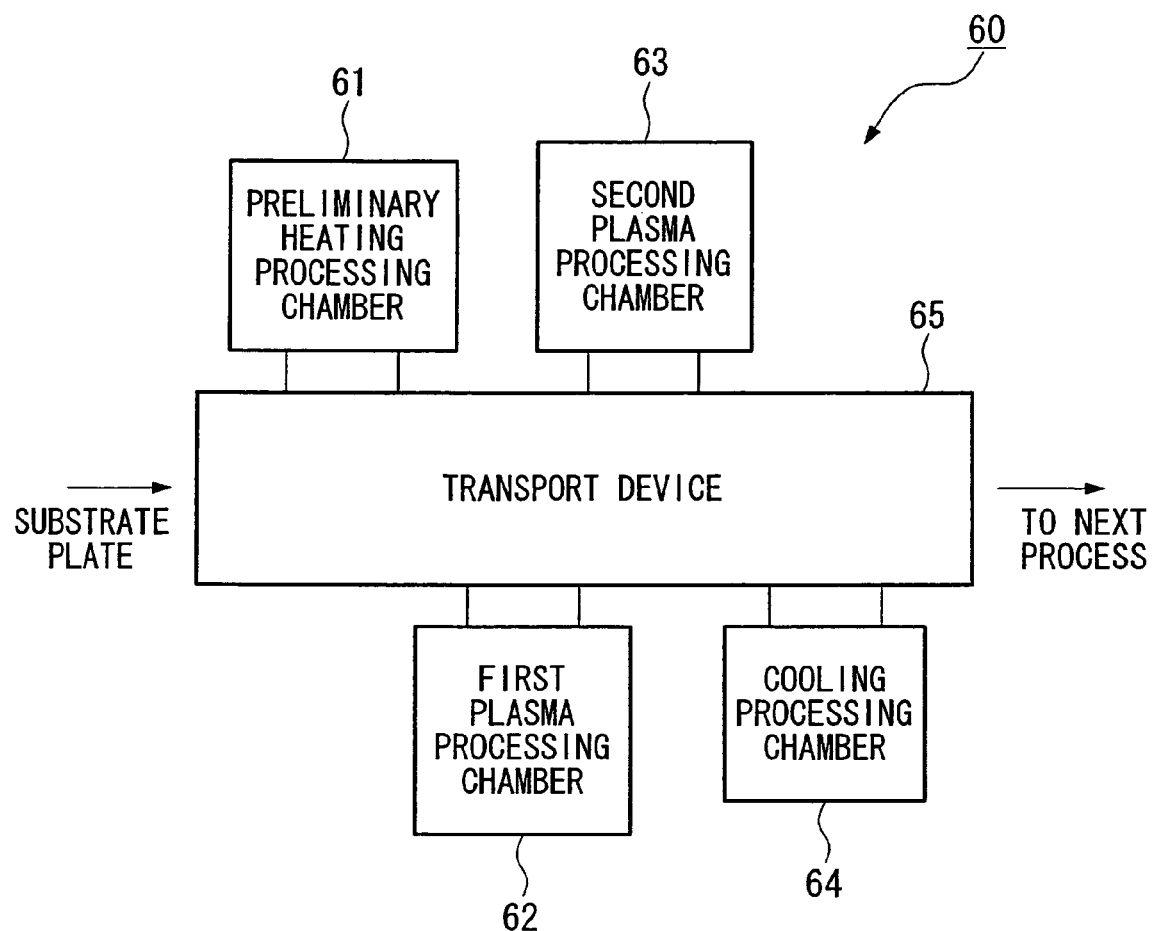
FIG. 38 is a schematic plan view showing another example of a plasma processing device which is utilized in the manufacture of the same display device.

It should be understood that the plasma processing device which is to be used for the plasma processing processes is not to be considered as being limited to the device shown in FIG. 34; for example, it would also be possible to utilize the plasma processing device 60 shown in FIG. 38.

The plasma processing device 60 shown in FIG. 38 comprises a preliminary heating processing chamber 61, a first plasma processing chamber 62, a second plasma processing chamber 63, a cooling processing chamber 64, and a transport device 65 which transports the base plate 32 into each of these processing chambers 61 through 64; and these processing chambers 61 through 64 are arranged linearly upon both sides of the transport direction of the transport device 65 (i.e. on both sides of the direction shown by the arrow in the figure).

With this plasma processing device 60, in the same manner as with the plasma processing device 50 which was shown in FIG. 34, the base plate 32 which has been transported from the bank portion formation process is transported in order to the preliminary heating processing chamber 61, the first plasma processing chamber 62, the second plasma processing chamber 63, and the cooling processing chamber 64, and, after the same processes have been performed by these various processing chambers in the same manner as described above, the base plate 32 is transported to the subsequent positive hole injection/transport layer formation process.

Furthermore, for the above described plasma device, rather than a device which operated in the ambient atmosphere, a plasma processing device could also be utilized which operated in a vacuum.

(3) The Process of Forming the Positive Hole Injection/Transport Layer (the Process of Forming the Functional Layer)

In the process of formation of the positive hole injection/transport layer, a first composite material which includes a material for forming the positive hole injection/transport layer is discharged over the picture electrode surfaces 111a by utilizing, for example, a liquid drop discharge device for liquid drop discharge. Drying processing and heat processing are performed after this discharge process, and thereby the positive hole injection/transport layer 110a is formed over the picture element electrodes 111 and the inorganic material bank layers 112a. It should be understood that the inorganic material bank layers 112a upon which this positive hole injection/transport layer 110a has been formed are termed the first superimposed layer portions 112e.

It is desirable for the following processes, which include this positive hole injection/transport layer formation process, to be performed in an atmosphere which contains no water or oxygen. For example, it is desirable for them to be performed in an inert gas atmosphere such as a nitrogen atmosphere, an argon atmosphere, or the like.

It should be understood that the positive hole injection/transport layer may not be formed over the first superimposed layer portions 112e. In other words, there are some embodiments of the present invention in which the positive hole injection/transport layer is only formed over the picture element electrodes 111.

The method of manufacture by liquid drop discharge is as follows.

As a desirable type of liquid drop discharge head for use in the method of manufacture of a display device according to this preferred embodiment of the present invention, a head unit 120 (refer to FIG. 39) which has almost the same basic structure as the head unit according to the previous preferred embodiment shown in FIG. 2 may be used. Furthermore, with regard to the arrangement of the work-piece and the above described head unit, the arrangement shown in FIG. 39 is desirable.

Figure 39:
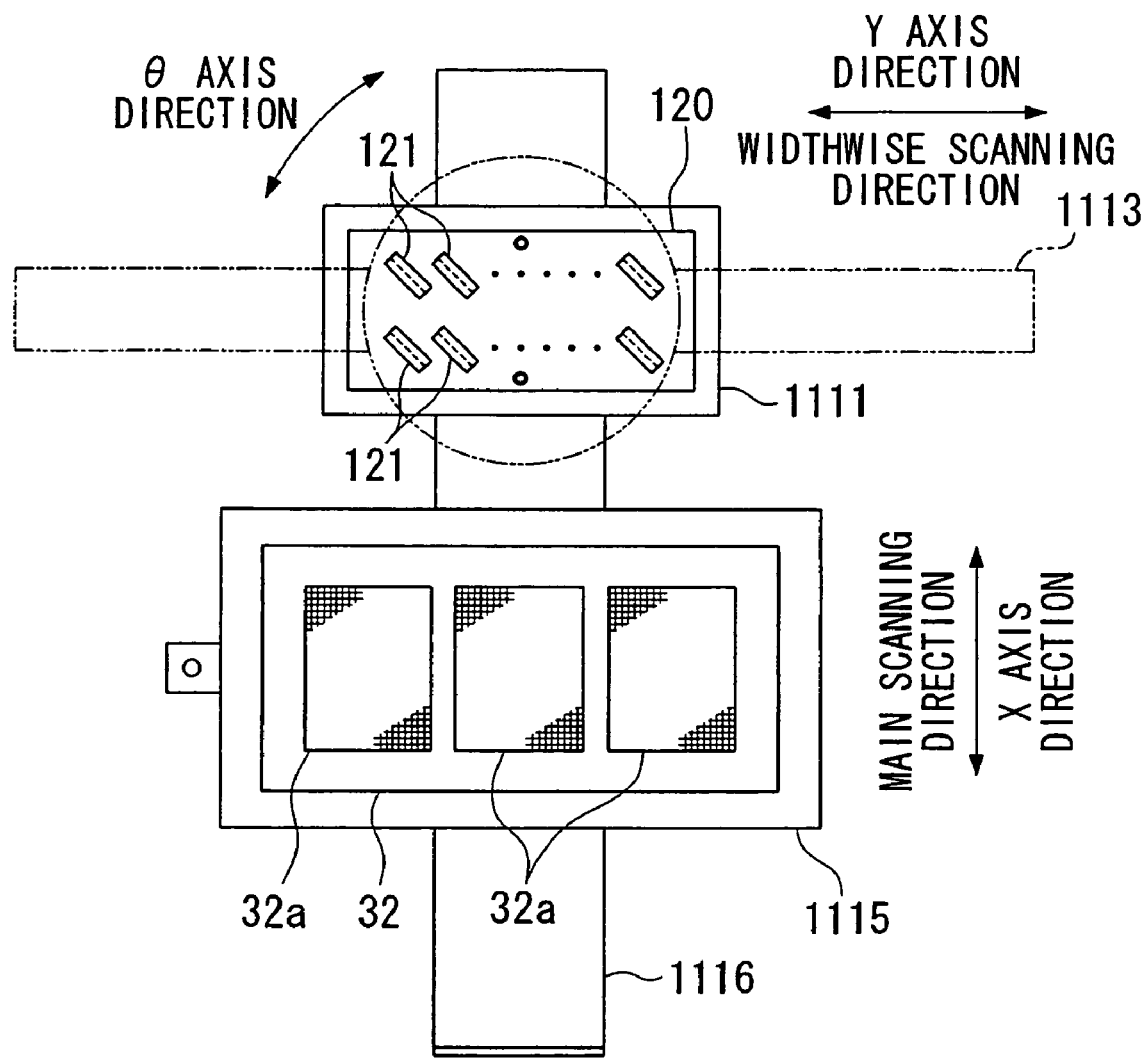
FIG. 39 is a plan view showing a liquid drop discharge device which is utilized in the manufacture of the same display device.

In the liquid drop discharge device shown in FIG. 39, there is included a head unit 120 which has almost the same structure as the one shown in FIG. 2. Furthermore, the reference symbol 1115 denotes a stage upon which the base plate 32 is mounted, while the reference symbol 1116 denotes a pair of guide rails which guide the stage 1115 along the X axis direction in the figure (the main scanning direction). And the head unit 120 is arranged to be capable of being shifted, via a support member 1111, in the Y axis direction in the figure (the widthwise scanning direction) along guide rails 1113, and moreover this head unit 120 is arranged to be rotatable around the θ axis direction as shown in the figure, so that ink jet heads 121 may be inclined to a predetermined angle with respect to the main scanning direction.

The base plate 32 shown in FIG. 39 is made as a plurality of chips disposed upon a motherboard. In other words, a single region containing chips corresponds to a single display device. Although in the figure it is shown that three display regions 32a have been formed, this is not to be considered as being limitative of the present invention. For example, when applying the composite material upon the left side display region 32a upon the base plate 32, along with shifting the heads 121 along the guide rails 1113 to the left side in the figure, they are also shifted along the guide rails 1116 to the upper side in the figure, and the composite material is applied while scanning the base plate 32. Next the heads 121 are shifted to the central position in the figure, and the composite material is applied to the central display region 32a of the work-piece. The same procedure, mutatis mutandis, is applied for applying the composite material to the right side display region 32a in the figure.

It should be understood that the head unit and the liquid drop discharge device shown in FIG. 39 are not limited to use in the positive hole injection/transport layer formation process; they may also be used for the light emission layer formation process.

Figure 40:
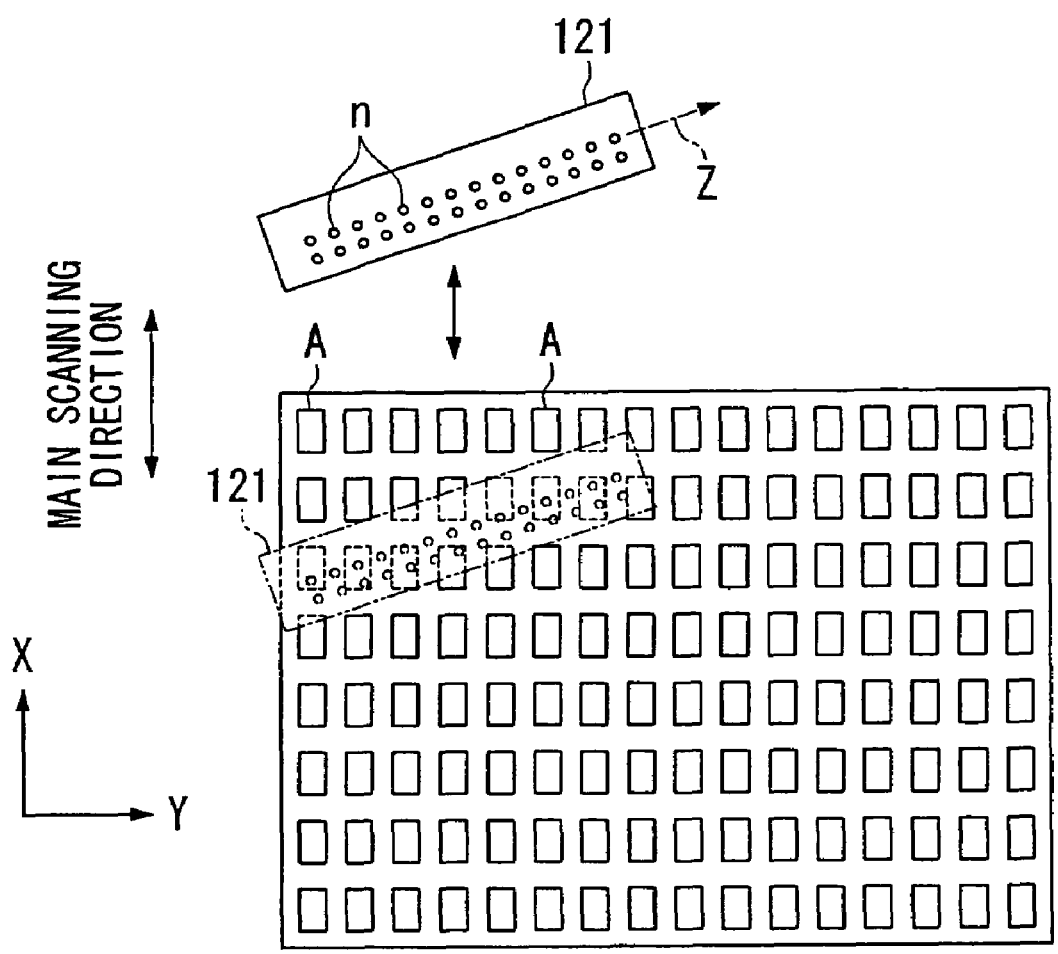
FIG. 40 is a plan view showing the state in which an ink jet head is arranged upon a base member.

FIG. 40 shows the state in which a ink jet head 121 is being scanned with respect to the base plate 32. As shown in this figure, although the first composite material is discharged while relatively shifting the ink jet heads 121 along the X direction in the figure, at this time, the direction Z of arrangement of the nozzles is in the state of being inclined with respect to the main scanning direction (along the X direction). By arranging the direction of arrangement of the nozzles n of the ink jet head 121 to be inclined with respect to the main scanning direction in this manner, it is possible to make the pitch of the nozzles correspond to the pitch of the picture element regions A. Furthermore, by adjusting the angle of inclination, it is possible to make the pitch of the nozzles correspond to the pitch of any type of picture element regions A.

Next, the process of forming the positive hole injection/transport layer 110a in each of the picture element regions A by scanning the ink jet head 121 will be explained. For this process there are three possibilities: (1) a method which is performed with a single scanning episode of the ink jet head 121; (2) a method which is performed with a plurality of scanning episodes of the ink jet head 121, and moreover by using a plurality of nozzles during those scanning episodes; and (3) a method which is performed with a plurality of scanning episodes of the ink jet head 121, and moreover by using a separate nozzle in each of those scanning episodes. In the following, each of these three methods (1) through (3) will be explained in order.

(1) A Method Performed with a Single Scan of the Ink Jet Head 121

Figure 41A:
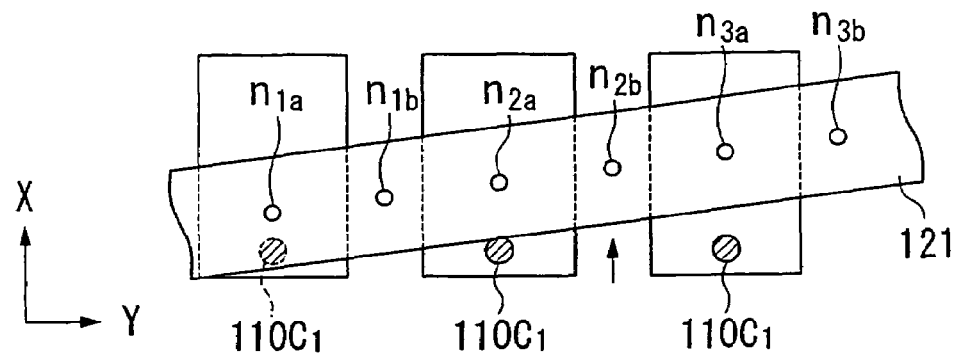
FIGS. 41(A) through 41(C) are process diagrams for explanation of a process when forming a positive hole injection and transport layer with a first scan of an ink jet head.
Figure 41B:
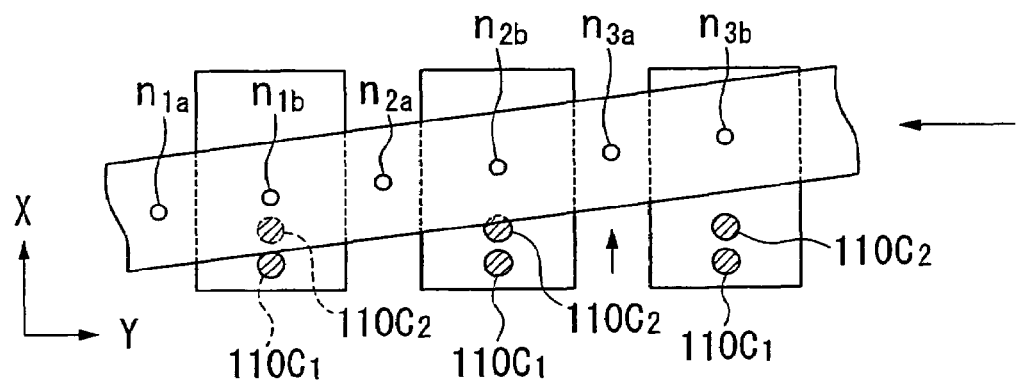
Figure 41C:
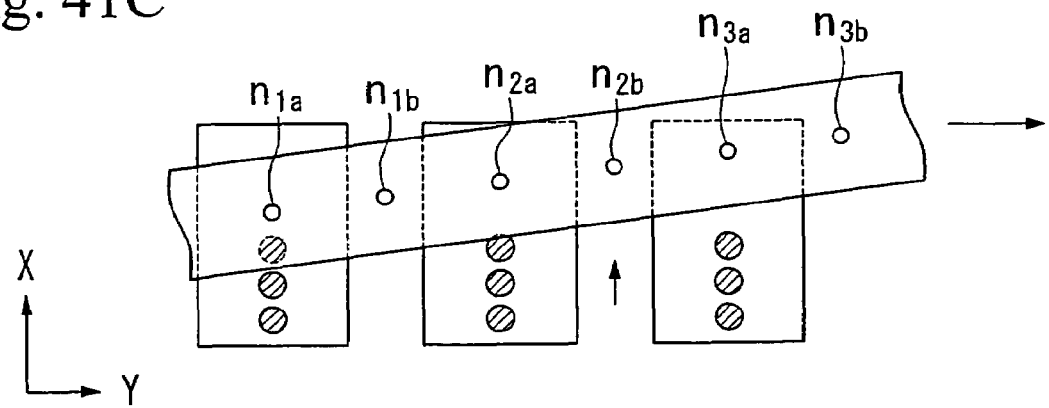

FIG. 41 is a process diagram showing this process when forming the positive hole injection/transport layer 110a upon the various picture element regions A1 . . . with a single scan of the ink jet head 121. FIG. 41(a) shows the situation after the ink jet head 121 has scanned from the position shown in FIG. 41 along the X direction in the figure; FIG. 41(b) shows the situation when, from the situation shown in FIG. 41(a), the ink jet head 121, along with scanning a little along the X direction in the figure, has also shifted in the direction opposite to the Y direction in the figure; and FIG. 41(c) shows the situation when, from the situation shown in FIG. 41(b), the ink jet head 121, along with scanning a little along the X direction in the figure, has also shifted in the Y direction in the figure.

Figure 44:
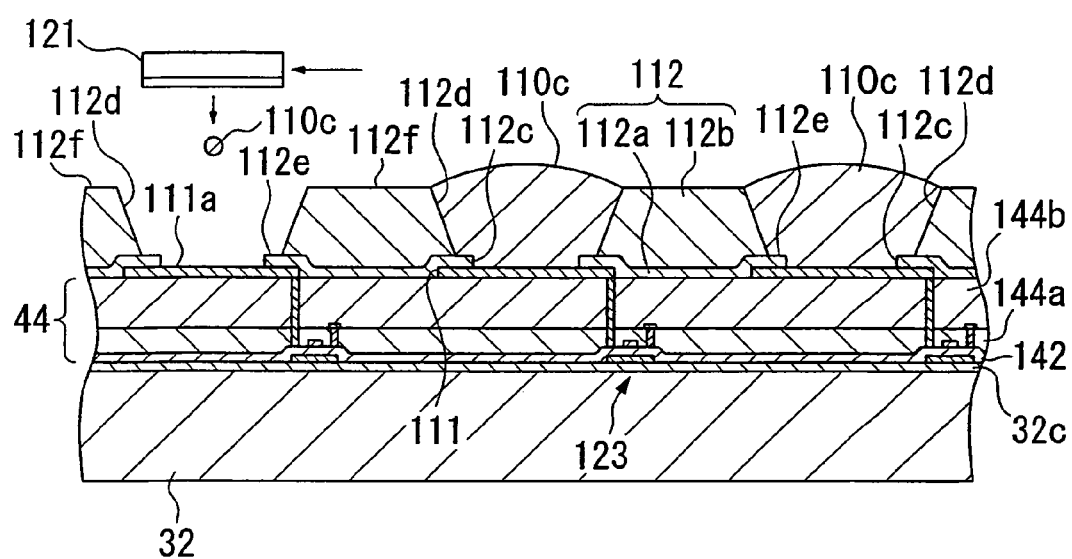
FIG. 44 is a process diagram for explanation of the method of manufacture of a display device which is another embodiment of an electro optical device according to the present invention.

Furthermore, in FIG. 44 there is shown a schematic sectional view of the picture element regions A and of the ink jet head. Six of the nozzles which are provided to one portion of the ink jet head 121 are shown in FIG. 41 and are designated by the reference symbols n1a through n3b. Three of these six nozzles, the ones designated as n1a, n2a, and n3a, are arranged so as to be respectively positioned over picture element regions A1 through A3 when the ink jet head 121 is shifted in the X direction as seen in the figure, while the other three of the six nozzles, i.e. the ones designated as n1b, n2b, and n3b, are arranged so as to be positioned between adjacent ones of the picture element regions A1 through A3 when the ink jet head 121 is shifted in the X direction as seen in the figures.

In FIG. 41(a), among the nozzles which are included in the ink jet head 121, the first composite material which is included in the material which is to form the positive hole injection/transport layer is discharged upon the picture element regions A1 through A3 from the three nozzles n1a through n3a. It should be understood that in this preferred embodiment of the present invention the first composite material is discharged by scanning the ink jet head 121 over the base plate 32, but it would also be acceptable, as an alternative, to scan the base plate 32 under the ink jet head 121.

Furthermore, it would also be possible to discharge the first composite material by shifting the ink jet head 121 and the base plate 32 relatively to one another. Moreover, it should be understood that this point explained above also applies to the other processes described hereinafter in relation to this liquid drop discharge head.

The discharge from the ink jet head 121 takes place as described below. That is to say, as shown in FIG. 41(a) and in FIG. 44, the nozzles n1a through n3a which are formed in the ink jet head 121 are arranged to oppose the electrode surfaces 111a, and an initial liquid drop 110c1 of the first composite material is discharged from each of the nozzles n1a through n3a. The picture element regions A1 through A3 are formed from the picture element electrodes 111 and the banks 112 which compartment around the peripheries of the picture element electrodes 111, and the initial liquid drops 110c1 of the first composite material are discharged from the nozzles n1a through n3a against these picture element regions A1 through A3 with the amount of liquid per each drop being controlled.

Next, as shown in FIG. 41(b), while scanning the ink jet head 121 a little along the X direction as seen in the figure, each of the nozzles n1b through n3b is positioned over the corresponding one of the picture element regions A1 through A3 respectively by shifting the ink jet head 121 along the direction opposite to the Y direction as seen in the figure. And second liquid drops 110c2 of the first composite material are discharged against the picture element regions A1 through A3 from the nozzles n1b through n3b respectively.

Furthermore, as shown in FIG. 41(c), while scanning the ink jet head 121 a little along the X direction as seen in the figure, each of the nozzles n1a through n3a is again positioned over the corresponding one of the picture element regions A1 through A3 respectively by shifting the ink jet head 121 along the Y direction as seen in the figure. And third liquid drops 110c3 of the first composite material are discharged against the picture element regions A1 through A3 from the nozzles n1a through n3a respectively.

By doing this, i.e. by shifting the ink jet head a little to and fro along the Y direction as seen in the figure while scanning the ink jet head 121 along the X direction as seen in the figure, liquid drops of the first composite material are discharged against a single picture element region A in order from two of the nozzles. The total number of liquid drops which are discharged against a single picture element region A can be in the range, for example, from 6 to 20, but this range will vary according to the area of the picture elements, and in some circumstances the most appropriate number of drops may be greater or less than this stated range. The total amount of the first composite material which is discharged against each of the picture element regions (upon each of the electrode surfaces 111a) is determined according to the sizes of the lower opening portions 112c and the upper opening portions 112d, according to the thickness of the positive hole injection/transport layer which it is desired to form, according to the concentration of the material for forming the positive hole injection/transport layer within the first composite material, and the like.

In this manner, for the case of forming the positive hole/transport layer in a single scan, the nozzles are changed over every time the first composite material is discharged, and, since the first composite material is discharged against each of the picture element regions A1 through A3 from two of the nozzles, accordingly, by comparison with the case of discharging the first composite material against each of the picture element regions A a plurality of times from a single nozzle as in the prior art, it is possible to perform mutual cancellation between undesirable deviations in the discharge amounts between the nozzles, so that undesirable deviations in the discharge amounts of the first composite material upon each of the picture element electrodes 111 . . . are reduced, and it is possible to form the positive hole injection/transport layer of a uniform film thickness. By doing this, it is possible to ensure that the amount of emitted light from each of the picture elements should be uniform, and accordingly it is possible to manufacture a display device which is endowed with a superior display quality.

(2) A Method Performed with a Plurality of Scans of the Ink Jet Head 121, and by Using a Plurality of Nozzles During Those Scans FIG. 42 is a process diagram showing this process when forming the positive hole injection/transport layer 110$a$ upon the various picture element regions A1 . . . with three scanning episodes of the ink jet head 121. FIG. 42($a$) shows the situation after the ink jet head 121 has completed its first scanning episode; FIG. 42($b$) shows the situation after the ink jet head 121 has completed its second scanning episode; and FIG. 42($c$) shows the situation after the ink jet head 121 has completed its third and last scanning episode.

In the first scanning episode, among the various nozzles of the ink jet head 121 shown in FIG. 41, the initial liquid drops 110$c$ of the first composite material are discharged from the nozzles n1$a$ through n3$a$ against the picture element regions A1 through A3 which these nozzles respectively oppose, and then the ink jet head 121 is shifted a little in the widthwise scanning direction and the second liquid drops 110$c$2 of the first composite material are discharged from the nozzles n1$b$ through n3$b$ against the picture element regions A1 through A3 which these nozzles respectively oppose. By doing this, as shown in FIG. 42($a$), the two liquid drops 110$c$1 and 110$c$2 are discharged against each of the picture element regions A1 through A3. It should be understood that each of these first and second liquid drops 110$c$1 and 110$c$2 may be discharged against its one of the picture element regions A1 through A3 with an interval being opened up between them, as shown in FIG. 42($a$); or, alternatively, they may be discharged over one another.

Next, in the second scanning episode, in the same manner as during the first scanning episode, the third liquid drops 110$c$3 of the first composite material are discharged from the nozzles n1$a$ through n3$a$ against the picture element regions A1 through A3 which these nozzles respectively oppose, and then again the ink jet head 121 is shifted a little in the widthwise scanning direction and the fourth liquid drops 110$c$4 of the first composite material are discharged from the nozzles n1$b$ through n3$b$ against the picture element regions A1 through A3 which these nozzles respectively oppose. By doing this, as shown in FIG. 42($b$), the further two liquid drops 110$c$3 and 110$c$4 are discharged against each of the picture element regions A1 through A3. It should be understood that each of these third and fourth liquid drops 110$c$3 and 110$c$4 may be discharged against its one of the picture element regions A1 through A3 with an interval being opened up mutually between them and also with an interval being opened up between them and the first and second liquid drops 110$c$1 and 110$c$2 so that none of these four liquid drops are mutually superimposed, as shown in FIG. 42($b$); or, alternatively, they may be discharged over one another and over the first and second liquid drops 110$c$1 and 110$c$2.

Next, in the third scanning episode, in the same manner as during the first and second scanning episodes, the fifth liquid drops 110$c$5 of the first composite material are discharged from the nozzles n1$a$ through n3$a$ against the picture element regions A1 through A3 which these nozzles respectively oppose, and then again the ink jet head 121 is shifted a little in the widthwise scanning direction and the sixth liquid drops 110$c$6 of the first composite material are discharged from the nozzles n1b through n3$b$ against the picture element regions A1 through A3 which these nozzles respectively oppose. By doing this, as shown in FIG. 42($c$), the further two liquid drops 110$c$5 and 110$c$6 are discharged against each of the picture element regions A1 through A3. It should be understood that each of these fifth and sixth liquid drops 110$c$5 and 110$c$6 may be discharged against its one of the picture element regions A1 through A3 with an interval being opened up mutually between them and also with an interval being opened up between them and the first four liquid drops 110$c$1 through 110$c$4 so that none of these six liquid drops are mutually superimposed, as shown in FIG. 42($c$); or, alternatively, they may be discharged over one another and over the first through the fourth liquid drops 110$c$1 through 110$c$4.

Since in this manner, when forming the positive hole injection/transport layer with a plurality of scans, the nozzles are changed over between each scan and the next, and the first composite material is discharged against each of the picture element regions A1 through A3 from its own two ones of the nozzles, accordingly, by comparison with the case of discharging the first composite material against each of the picture element regions a plurality of times from a single nozzle as in the prior art, it is possible to perform mutual cancellation between undesirable deviations in the discharge amounts between the nozzles, so that undesirable deviations in the discharge amounts of the first composite material upon each of the picture element electrodes 111 . . . are reduced, and it is possible to form the positive hole injection/transport layer of a uniform film thickness. By doing this, it is possible to ensure that the amount of emitted light from each of the picture elements is maintained as uniform, and accordingly it is possible to manufacture a display device which is endowed with a superior display quality.

(3) A Method Performed with a Plurality of Scans of the Ink Jet Head 121, and by Using a Different Nozzle in Each of Those Scans FIG. 43 is a process diagram showing this process when forming the positive hole injection/transport layer 110$a$ upon the various picture element regions A1 . . . with two scanning episodes of the ink jet head 121. FIG. 43($a$) shows the situation after the ink jet head 121 has completed its first scanning episode; FIG. 43($b$) shows the situation after the ink jet head 121 has completed its first scanning episode; and FIG. 43($c$) shows another possible situation after the ink jet head 121 has completed its first and second scanning episodes.

In the first scanning episode, among the various nozzles of the ink jet head 121 shown in FIG. 41, the initial liquid drops 110$c$1 and the second and third liquid drops 110$c$2, and 110$c$3 of the first composite material are discharged in order from each of the nozzles n1$a$ through n3$a$ against each of the picture element regions A1 through A3 which these nozzles respectively oppose. By doing this, as shown in FIG. 41($a$), the three liquid drops 110$c$1, 110$c$2, and 110$c$3 are discharged against each of the picture element regions A1 through A3. It should be understood that each of these liquid drops 110$c$1 through 110$c$3 may be discharged against its one of the picture element regions A1 through A3 with an interval being opened up between them, as shown in FIG. 41($a$); or, alternatively, they may be discharged over one another, so that they are mutually superimposed.

Then, in the second scanning episode, the ink jet head 121 is shifted a little in the widthwise scanning direction and the fourth, fifth, and sixth liquid drops 110c4, 110c5, and 110c6 of the first composite material are discharged in order from the nozzles n1b through n3b against the picture element regions A1 through A3 which these nozzles respectively oppose. By doing this, as shown in FIG. 43(b), the further three liquid drops 110c4 through 110c6 are discharged against each of the picture element regions A1 through A3. It should be understood that each of these fourth through sixth liquid drops 110c4, 110c5, and 110c6 may be discharged against its one of the picture element regions A1 through A3 with an interval being opened up mutually between them and also with an interval being opened up between them and the first three liquid drops 110c1 through 110c3 so that none of these six liquid drops are mutually superimposed, as shown in FIG. 43(b); or, alternatively, they may be discharged over one another and over the first through the third liquid drops 110c1 through 110c3.

Figure 43A:
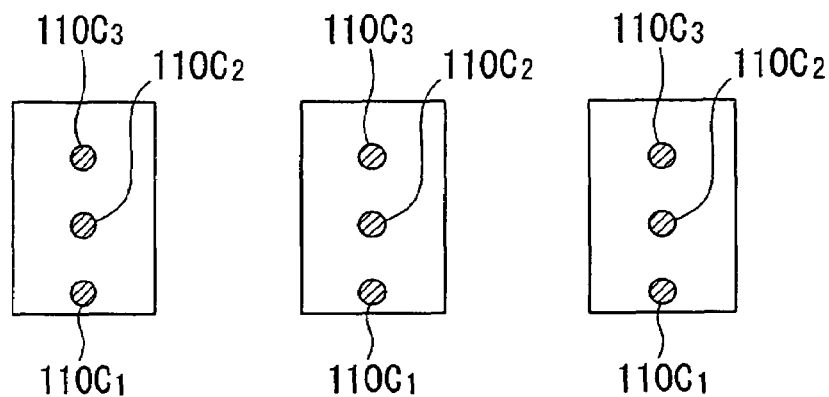
FIGS. 43(A) through 43(C) are process diagrams for explanation of a process when forming a positive hole injection and transport layer with a second scan of an ink jet head.
Figure 43B:
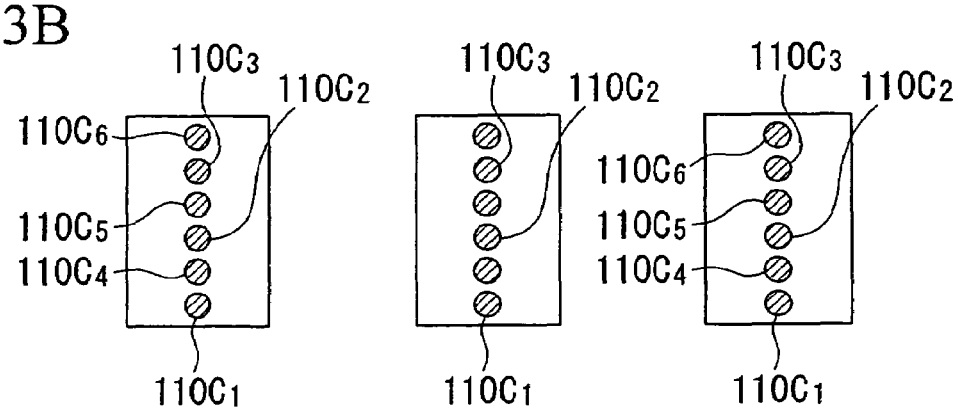
Figure 43C:
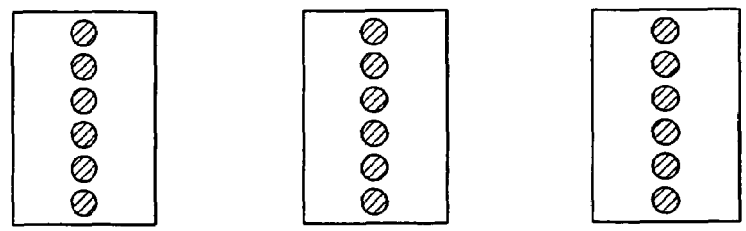

Furthermore, FIG. 43(c) shows a different situation after the first and second scanning episodes. In FIG. 43(c) the number of scanning episodes is supposed to have been two, and, with regard to the point that the first through the third liquid drops are discharged in the first scanning episode, and that, in the second scanning episode, the fourth through the sixth liquid drops are discharged from different ones of the nozzles after the ink jet head 121 has been shifted, the situation is the same as in the case of FIG. 43(a) and FIG. 43(b).

However the point in which the situation of FIG. 43(c) differs from the situation of FIGS. 43(a) and 43(b) is that the discharge position of each of the liquid drops is different. In detail, in FIG. 43(c), the liquid drops 110c1 through 10c3 which are discharged in the first scanning episode are all located in the lower half portion in the figure of each of the picture element regions A1 through A3, while the liquid drops 110c4 through 110c6 which are discharged in the second scanning episode are all located in the upper half portion in the figure of each of the picture element regions A1 through A3; in other words, the liquid drops 110c1 through 110c3 which are discharged in the first scanning episode are not interleaved with the liquid drops 110c4 through 110c6 which are discharged in the second scanning episode, as was the case with the process shown in FIGS. 43(a) and 43(b).

It should be understood that although, in FIGS. 42 and 43, the total number of liquid drops which are discharged against a single picture element region A was supposed to be six, it may be in the range, for example, from 6 to 20; but, since this range will vary according to the area of the picture elements, in some circumstances the most appropriate number of drops may be greater or less than this stated range. The total amount of the first composite material which is discharged against each of the picture element regions (i.e., upon each of the electrode surfaces 111a) is determined according to the sizes of the lower opening portions 112c and the upper opening portions 112d, according to the thickness of the positive hole injection/transport layer which it is desired to form, according to the concentration of the material for forming the positive hole injection/transport layer within the first composite material, and the like.

Since in this manner, when forming the positive hole injection/transport layer with a plurality of scanning episodes, the nozzles are changed over between each scan and the next, and the first composite material is discharged against each of the picture element regions A1 through A3 from its own two ones of the nozzles, accordingly, by comparison with the case of discharging the first composite material against each of the picture element regions A a plurality of times from a single nozzle as in the prior art, it is possible to perform mutual cancellation between undesirable deviations in the discharge amounts between the nozzles, so that undesirable deviations in the discharge amounts of the first composite material upon each of the picture element electrodes 111 . . . are reduced, and it is possible to form the positive hole injection/transport layer of a uniform film thickness. By doing this, it is possible to ensure that the amount of emitted light from each of the picture elements is maintained as uniform, and accordingly it is possible to manufacture a display device which is endowed with a superior display quality.

It should be understood that it would be acceptable, when performing scanning of the ink jet head 121 a plurality of times, to perform each pass of the ink jet head 121, i.e. each scan, in the same direction; or, alternatively, each pass of the ink jet head 121 might be performed in an opposite direction to the previous one.

As shown in FIG. 44, the liquid drops 110c of the first composite material which have been discharged from the ink jet head 121 finally spread out over the electrode surfaces 111a and the first superimposed layer portions 112e which have been subjected to hydrophilic processing, and fill up the lower opening portions 112c and the upper opening portions 112d.

On the 1 other hand, even if one of the liquid drops 110c of the first composite material has wandered from its predetermined discharge position and has been discharged against an upper surface 112f, the upper surface 112f is not wetted by this first composite material drop 110c, and the first composite material drop 110c is shed off from the upper surface 112f and finally slides to one of the lower opening portions 112c or one of the upper opening portions 112d.

As the first composite material which may be used here, for example, it is possible to utilize a composite material consisting of a mixture of polythiophene-derivetive, for instance polyethylenedioxithiophene (PEDOT) or the like, and polystyrenesulfonic acid (PSS) or the like dissolved in a polar solvent. As such a polar solvent, for example, it is possible to suggest isopropyl alcohol (IPA), normalbutanol, γ-butyrolactone, N-methylpyrolidone (NMP), 1,3-dimethyl-2-imidazolidinone (DMI), and its derivative, carbitol, buthylcarbitolacetate, glycolethers, or the like.

In more concrete terms, as an exemplary composition for the first composite material, it is possible to utilize a material consisting of a mixture of PEDOT and PSS (with the PEDOT/PSS ratio being 1:20) to the amount of 22.4% by weight, PSS to the amount of 1.44% by weight, IPA to the amount of 10% by weight, NMP to the amount of 27.0% by weight, and DMI to the amount of 50% by weight. It should be understood that it is desirable for the viscosity of the first composite material to be in the range from 2 to 20 cPs, and in particular it is desirable for it to be in the range from 4 to 12 cPs.

By using the above described first composite material, it is possible to perform stable discharge through the discharge nozzles H2, without any danger of occurrence of blockages.

Moreover, with regard to the material for forming the positive hole injection/transport layer, it will be acceptable to use the same material for each of the red (R), green (G), and blue (B) light emission layers 110b1 through 110b3; or, alternatively, it could be different for each of these light emission layers.

Figure 45:
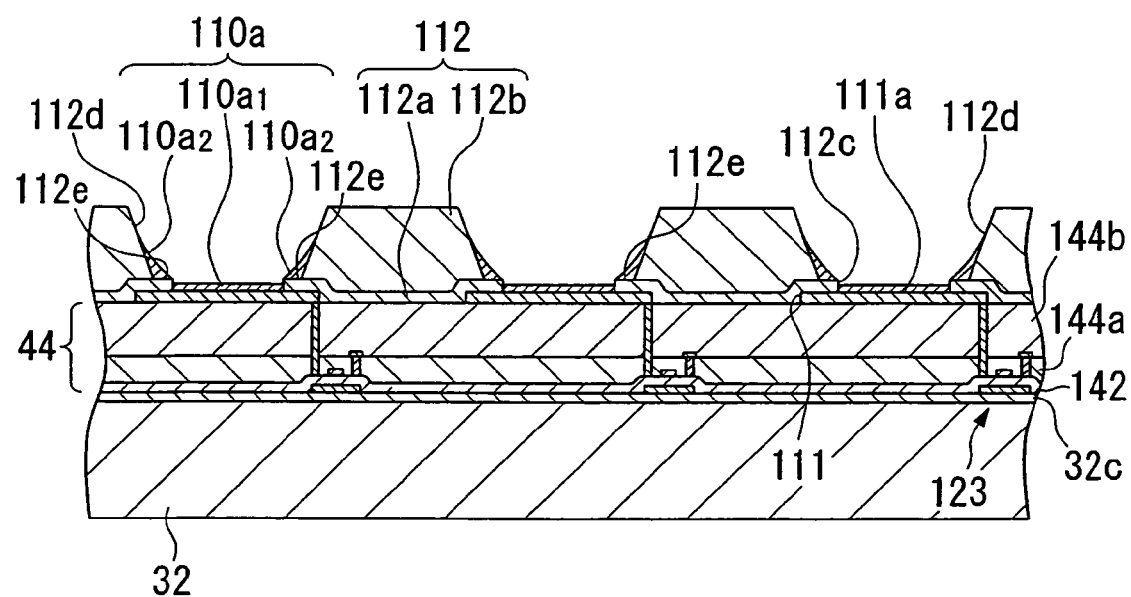
FIG. 45 is a process diagram for explanation of the method of manufacture of the same display device.

Next, a drying process such as the one shown in FIG. 45 is performed.

By performing this drying process, the first composite material is dried after having been discharged, the polar solvent which was contained in the first composite material is vaporized, and thereby the positive hole injection/transport layer 110a is formed.

When performing this drying process, the vaporization of the polar solvent which is contained in the first composite material drops 110c principally occurs at positions which are close to the inorganic material bank layers 112a and the organic material bank layers 112b, and the material which constitutes the positive hole injection/transport layer is thickened and deposited along with the vaporization of the polar solvent.

Due to this, as shown in FIG. 45, the peripheral edge portions 110a2 which are made from the material which constitutes the positive hole injection/transport layer are formed over the first superimposed layer portions 112e. These peripheral edge portions 110a2 closely adhere to the wall surfaces of the upper opening portions 112d (the organic material bank layers 112b), and their thickness becomes thinner towards the electrode surfaces 111a, while they become thicker away from the electrode surfaces 111a, in other words towards the organic material bank layers 112b.

Furthermore, at the same time as this is happening, the vaporization of the polar solvent takes place over the electrode surfaces 111a due to the drying process, and due to this the flat portions 110a1 are formed over the electrode surfaces 111a from the material which is to constitute the positive hole injection/transport layer. Since the speed of vaporization of the polar solvent over the electrode surfaces 111a is almost uniform, the material which is to constitute the positive hole injection/transport layer is thickened almost uniformly over the electrode surfaces 111a, and due to this the flat portions 110a are formed of substantially uniform thickness.

By doing this, the positive hole injection/transport layer 110a which consists of the peripheral edge portions 10a2 and the flat portions 110a1 is formed.

It should be understood that a variant preferred embodiment would also be acceptable, as an alternative, in which the peripheral edge portions 110a2 were not formed, but the positive hole injection/transport layer was only formed over the electrode surfaces 111a.

The above described drying procedure is performed, for example, in a nitrogen atmosphere, at room temperature, and at a pressure of, for example, approximately 133.3 to 13.3 Pa (1 to 0.1 torr). If the pressure were to be reduced abruptly, the first composite material drops 110c would be caused to collide with one another, which would be undesirable; and accordingly it is desirable to reduce the pressure slowly and steadily. Furthermore, it the temperature is raised to a high temperature, the speed of vaporization of the polar solvent would be elevated to a level which would be undesirable, and it would become impossible to form an even positive hole injection/transport layer. Accordingly a working temperature in the range of from 30 degree Celsius to 80 degree Celsius is considered to be desirable.

After the drying procedure, it is desirable to remove any polar solvent or water which may remain in the positive hole injection/transport layer 110a by performing heat processing by heating up the work-piece in vacuum to a temperature of approximately 200 degree Celsius and by keeping it there for about 10 minutes.

In the above described process of forming the positive hole injection/transport layer, the liquid drops 110c of the first composite material which have been discharged are on the one hand filled into the lower opening portions 112c and the upper opening portions 112d, while any quantities of the first composite material which may have landed upon the organic material bank layers 112b which have been subjected to water repellentation processing are repelled thereby and are transferred to within the lower opening portions 112c and the upper opening portions 112d. Due to this, the liquid drops 110c of the first composite material which have been discharged can be reliably and inescapably caused to be filled into the lower opening portions 112c and the upper opening portions 112d, so that it is possible to form the positive hole injection/transport layer 110a upon the electrode surfaces 111a.

Furthermore, according to the above described formation process for the positive hole injection/transport layer, since the liquid drops 110c1 of the first composite material which are initially discharged into each of the picture element regions A are contacted against the wall surfaces 112h of the organic material bank layers 112b, because these liquid drops are transferred from these wall surfaces 112h to the first superimposed layer portions 112e and to the electrode surfaces 111a, accordingly, as a priority, the liquid drops 110c of the first composite material wet and spread out over the entire range of the picture element electrodes 111, and it is possible to apply the first composite material without any blurring, so that thereby it is possible to form the positive hole injection/transport layer 110a with a substantially uniform film thickness.

(4) The Process of Formation of the Light Emission Layer

Next, the process of forming the light emission layer includes a surface modification process, a light emission layer formation material discharge process, and a drying process.

First, a surface modification process is performed for modifying the surface of the positive hole injection/transport layer 110a. This process will be described in detail hereinafter. Next, a second composite material is discharged upon the positive hole injection/transport layer 110a by a liquid drop discharge method which may be the same as that employed for the process of formation of the positive hole injection/transport layer 110a which was described above. After this, a process of drying processing (and heat processing) of this second composite material which has been discharged is performed, and thereby the light emission layer 110b is formed over the positive hole injection/transport layer 110a.

Next, as a process for forming the light emission layer, after a second composite material which contains a light emission layer formation material has been discharged upon the positive hole injection/transport layer 110a by a liquid drop discharge method, a drying procedure is performed, and thereby the light emission layer 110b is formed over the positive hole injection/transport layer 110a.

Figure 46:
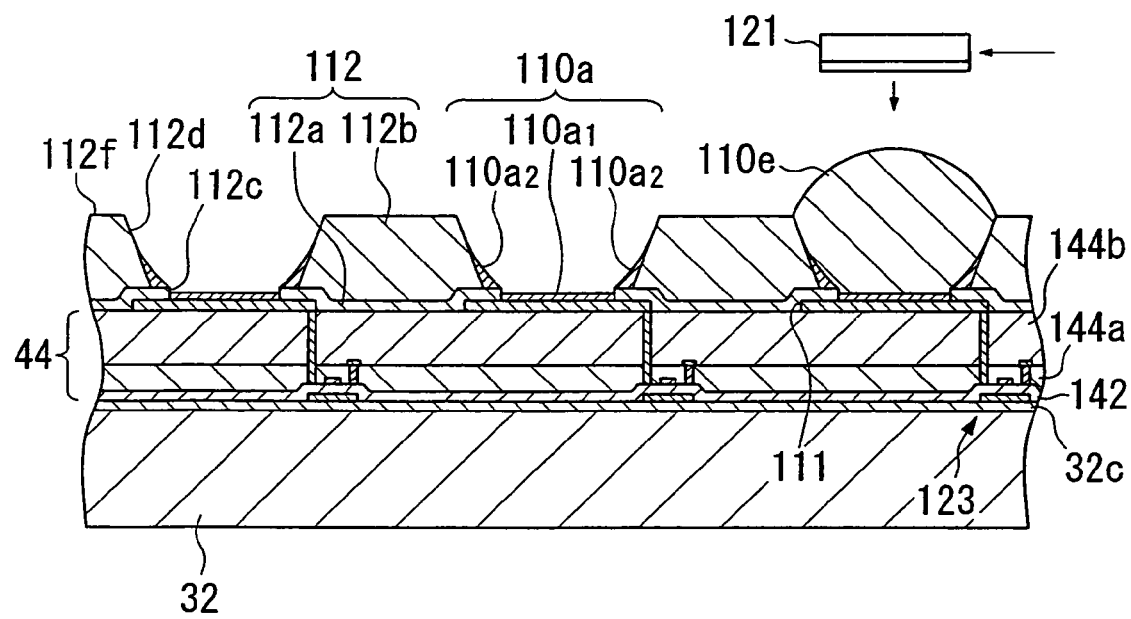
FIG. 46 is a process diagram for explanation of the method of manufacture of the same display device.

The liquid drop discharge method is shown in outline in FIG. 46. As shown in FIG. 46, the ink jet head 431 and the base plate 32 are shifted relatively to one another, and the second composite material which includes light emission layer formation material of various colors (for example blue (B) colored light emission layer formation material) is discharged from the discharge nozzles which are formed in the ink jet head 431.

During this discharge, the discharge nozzles oppose the positive hole injection/transport layers 110a which are positioned within the lower opening portions 112c and the upper opening portions 112d, and the second composite material is discharged while shifting the ink jet head 431 and the base plate 32 relatively to one another. The liquid amounts for each of the drops which are discharged from the discharge nozzles are controlled for each drop individually. The liquid (the second composite material drops 110e) of which the liquid amount has been controlled in this manner is discharged from the discharge nozzles, and these second composite material drops 110e are discharged against and over the positive hole injection/transport layer 10a.

The process of formation of the light emission layer proceeds in the same manner as did the process of forming the positive hole injection/transport layer, so that the second composite material is discharged from a plurality of the nozzles against a single one of the picture element regions.

In other words, in the same manner as in the cases shown in FIG. 41, FIG. 42, and FIG. 43, the ink jet head 121 is scanner and the light emission layer 110b is formed over each of the positive hole injection/transport layers 110a. In this process, For this process there are three possibilities: (4) a method which is performed with a single scanning episode of the ink jet head 121; (5) a method which is performed with a plurality of scanning episodes of the ink jet head 121, and moreover by using a plurality of nozzles during those scanning episodes; and (6) a method which is performed with a plurality of scanning episodes of the ink jet head 121, and moreover by using a separate nozzle in each of those scanning episodes. In the following, a summary of each of these three methods (4) through (6) will be explained.

(4) A Method Performed with a Single Scan of the Ink Jet Head 121

With this method, a light emission layer is formed upon each of the picture element regions (over the positive hole injection/transport layer 110a) in the same manner as in the case of FIG. 41. In detail, in the same manner as in the case of FIG. 41(a), the nozzles n1a through n3a of the ink jet head 121 are arranged to oppose the positive hole injection/transport layers 10a, and initial liquid drops of the second composite material are discharged from these nozzles n1a through n3a against the positive hole injection/transport layers 110a. Next, in the same manner as in the case of FIG. 41(b), along with scanning the ink jet head 121 a little along the main scanning direction, each of the nozzles nib through n3b is positioned over the corresponding one of these positive hole injection/transport layers 110a by shifting the ink jet head 121 along the direction opposite to the widthwise scanning direction, and second liquid drops of the second composite material are discharged from the nozzles n1b through n3b against the positive hole injection/transport layers 110a. Then, in the same manner as in the case of FIG. 41(c), while scanning the ink jet head 121 a little along the main scanning direction, each of the nozzles n1a through n3a is again positioned over its positive hole injection/transport layer 110a by shifting the ink jet head 121 along the widthwise scanning direction, and third liquid drops of the second composite material are discharged from the nozzles n1a through n3a against the positive hole injection/transport layers 110a.

By doing this, i.e. by shifting the ink jet head 121 a little to and fro along the widthwise scanning direction while scanning the ink jet head 121 along the main scanning direction, liquid drops of the second composite material are discharged against a single picture element region A (a single positive hole injection/transport layer 110a) in order from two of the nozzles. The total number of liquid drops which are discharged against a single picture element region A can be in the range, for example, from 6 to 20, but this range will vary according to the area of the picture elements, and in some circumstances the most appropriate number of drops may be greater or less than this stated range. The total amount of the second composite material which is discharged against each of the picture element regions (each of the positive hole injection/transport layers 110a) is determined according to the sizes of the lower opening portions 112c and the upper opening portions 112d, according to the thickness of the light emission layers which it is desired to form, according to the concentration of the material for forming the light emission layers within the second composite material, and the like.

In this manner, for the case of forming the light emission layer in a single scanning episode, the nozzles are changed over every time the second composite material is discharged, and, since the second composite material is discharged against each of the picture element regions from two of the nozzles, accordingly, by comparison with the case of discharging the second composite material against each of the picture element regions a plurality of times from a single nozzle as in the prior art, it is possible to perform mutual cancellation between undesirable deviations in the discharge amounts between the nozzles, so that undesirable deviations in the discharge amounts of the second composite material upon each of the picture element regions are reduced, and it is possible to form the light emission layer of a uniform film thickness. By doing this, it is possible to ensure that the amount of emitted light from each of the picture elements should be maintained to be uniform, and accordingly it is possible to manufacture a display device which is endowed with a superior display quality.

Figure 42A:
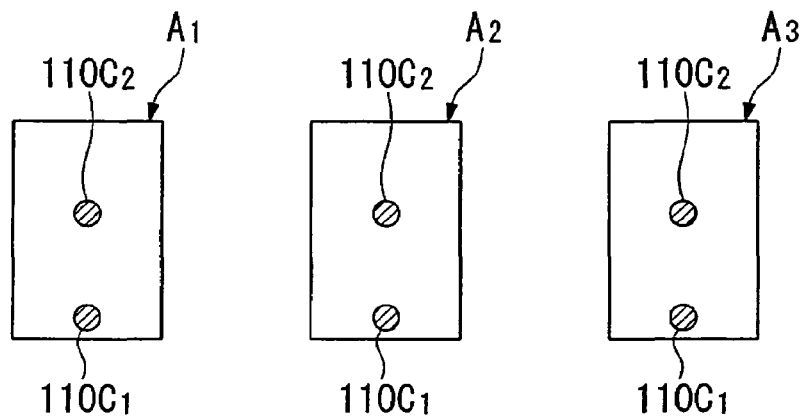
FIGS. 42(A) through 42(C) are process diagrams for explanation of a process when forming a positive hole injection and transport layer with a third scan of an ink jet head.

(5) A Method Performed with a Plurality of Scans of the Ink Jet Head 121, and a Method Using a Plurality of Nozzles During Those Scans In this method, first in the same manner as in the case of FIG. 42(a), in a first scanning episode, among the various nozzles of the ink jet head 121, the initial liquid drops of the second composite material are discharged from the nozzles n1a through n3a against the picture element regions which these nozzles respectively oppose, and then the ink jet head 121 is shifted a little in the widthwise scanning direction and the second liquid drops of the second composite material are discharged from the nozzles n1b through n3b against the picture element regions which these nozzles respectively oppose.

By doing this, in the same manner as shown in FIG. 42(a), two liquid drops are discharged against each of the picture element regions. It should be understood that each of these first and second liquid drops may be discharged against its one of the picture element regions with an interval being mutually opened up between them, in the same manner as shown in FIG. 42(a); or, alternatively, they may be discharged over one another in a mutually superimposed manner.

Figure 42B:
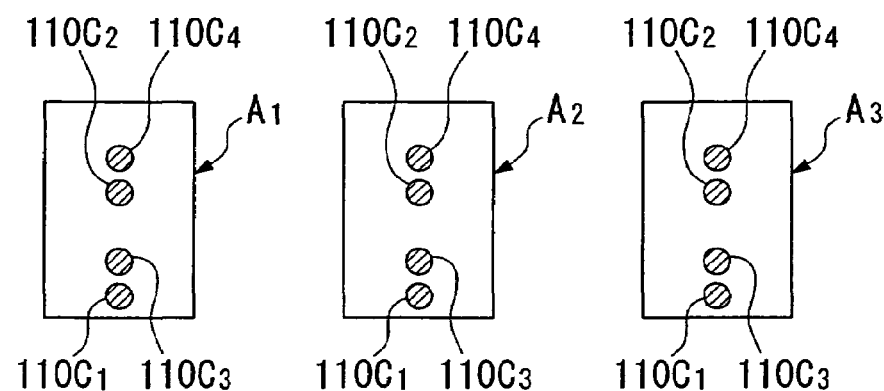

Next, in the second scanning episode, in the same manner as during the first scanning episode, among the various nozzles of the ink jet head 121, the third liquid drops of the second composite material are discharged from the nozzles n1a through n3a against the picture element regions which these nozzles respectively oppose, and then again the ink jet head 121 is shifted a little in the widthwise scanning direction and the fourth liquid drops of the second composite material are discharged from the nozzles n1b through n3b against the picture element regions which these nozzles respectively oppose. By doing this, in the same manner as shown in FIG. 42(b), the further two liquid drops are discharged against each of the picture element regions. It should be understood that each of these third and fourth liquid drops may be discharged against its one of the picture element regions with an interval being opened up mutually between them and also with an interval being opened up between them and the first and second liquid drops and so that none of these four liquid drops are mutually superimposed, in the same manner as shown in FIG. 42(b); or, alternatively, they may be discharged over one another and over the first and second liquid drops, so that all four are mutually superimposed.

Figure 42C:
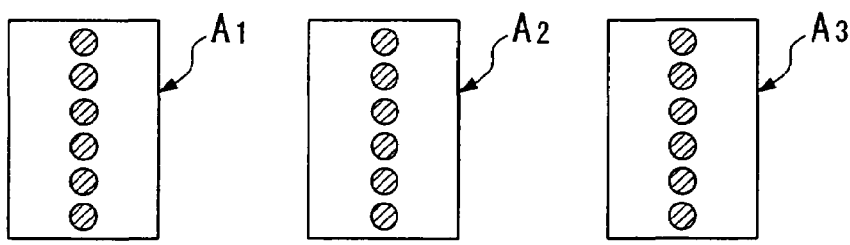

Next, in the third scanning episode, in the same manner as during the first and second scanning episodes, among the various nozzles of the ink jet head 121, the fifth liquid drops of the second composite material are discharged from the nozzles n1a through n3a against the picture element regions which these nozzles respectively oppose, and then again the ink jet head 121 is shifted a little in the widthwise scanning direction and the sixth liquid drops of the second composite material are discharged from the nozzles n1b through n3b against the picture element regions which these nozzles respectively oppose. By doing this, in the same manner as shown in FIG. 42(c), a further two liquid drops are discharged against each of the picture element regions. It should be understood that each of these fifth and sixth liquid drops may be discharged against its one of the picture element regions with an interval being opened up mutually between them and also with an interval being opened up between them and the first four liquid drops so that none of these six liquid drops are mutually superimposed, in the same manner as shown in FIG. 42(c); or, alternatively, they may be discharged over one another and over the first through the fourth liquid drops, so that all six of the liquid drops are mutually superimposed.

Since in this manner, when forming the light emission layer with a plurality of scans, the nozzles are changed over between each scan and the next, and the second composite material is discharged against each of the picture element regions from its own two ones of the nozzles, accordingly, by comparison with the case of discharging the second composite material against each of the picture element regions a plurality of times from a single nozzle as in the prior art, it is possible to perform mutual cancellation between undesirable deviations in the discharge amounts between the nozzles, so that undesirable deviations in the discharge amounts of the second composite material upon each of the picture element regions are reduced, and it is possible to form the light emission layer of a uniform film thickness. By doing this, it is possible to ensure that the amount of emitted light from each of the picture elements is maintained as uniform, and accordingly it is possible to manufacture a display device which is endowed with a superior display quality.

(6) A Method Performed with a Plurality of Scans of the Ink Jet Head 121, and by Using a Different Nozzle in Each of Those Scans In this method, first, in the same manner as shown in FIG. 43(a), in a first scanning episode, the initial liquid drops and the second and third liquid drops of the second composite material are discharged in order from each of the nozzles n1a through n3a among the various nozzles of the ink jet head 121 against each of the picture element regions which these nozzles respectively oppose. By doing this, in the same manner as shown in FIG. 43(a), three liquid drops are discharged against each of the picture element regions. It should be understood that each of these liquid drops may be discharged against its one of the picture element regions with an interval being mutually opened up between them, in the same manner as shown in FIG. 43(a); or, alternatively, they may be discharged over one another so as to be mutually superimposed.

Then, in the second scanning episode, the ink jet head 121 is shifted a little in the widthwise scanning direction and the fourth, fifth, and sixth liquid drops of the second composite material are discharged in order from the nozzles n1b through n3b against the picture element regions which these nozzles respectively oppose. By doing this, in the same manner as shown in FIG. 43(b), the further three liquid drops are discharged against each of the picture element regions. It should be understood that each of these fourth through sixth liquid drops may be discharged against its one of the picture element regions with an interval being opened up mutually between them and also with an interval being opened up between them and the first three liquid drops so that none of these six liquid drops are mutually superimposed, in the same manner as shown in FIG. 43(b); or, alternatively, they may be discharged over one another and over the first through the third liquid drops, so that all six of these liquid drops are mutually superimposed.

Furthermore, as a variant of this method, in the same manner as shown in FIG. 43(c), the liquid drops which are discharged in the first scanning episode may all be located in one half portion of each of the picture element regions, while the liquid drops which are discharged in the second scanning episode are all located in the other half portion of each of the picture element regions; in other words, the liquid drops which are discharged in the first scanning episode are not interleaved with the liquid drops which are discharged in the second scanning episode.

It should be understood that although the total number of liquid drops which are discharged against a single picture element region was supposed to be six, it may be in the range, for example, from 6 to 20; but, since this range will vary according to the area of the picture elements, in some circumstances the most appropriate number of drops may be greater or less than this stated range. The total amount of the second composite material which is discharged against each of the picture element regions (i.e., upon each of the positive hole injection/transport layers 110a) is determined according to the sizes of the lower opening portions 112c and the upper opening portions 112d, according to the thickness of the light emission layer which it is desired to form, according to the concentration of the material for forming the light emission layer within the second composite material, and the like.

Since in this manner, when forming the positive hole injection/transport layer with a plurality of scanning episodes, the nozzles are changed over between each scan and the next, and the second composite material is discharged against each of the picture element regions from its own two ones of the nozzles, accordingly, by comparison with the case of discharging the second composite material against each of the picture element regions a plurality of times from a single nozzle as in the prior art, it is possible to perform mutual cancellation between undesirable deviations in the discharge amounts between the nozzles, so that undesirable deviations in the discharge amounts of the second composite material upon each of the picture element regions are reduced, and it is possible to form the light emission layer of a uniform film thickness. By doing this, it is possible to ensure that the amount of emitted light from each of the picture elements is maintained as uniform, and accordingly it is possible to manufacture a display device which is endowed with a superior display quality.

It should be understood that, in the same way as was the case in the process of forming the positive hole injection/transport layer, it would also be acceptable, when performing scanning of the ink jet head 121 a plurality of times, to perform each pass of the ink jet head 121, i.e. each scan, in the same direction; or, alternatively, each pass of the ink jet head 121 might be performed in an opposite direction to the previous one.

Furthermore, as the material for the light emission layer, for example, it is possible to utilize polyfluolenederivetive, polyphenylenederivative, polyvinylcarbazole, polythiophenederivative, or doped materials by doping penylene group pigments, coumaline group pigments, rhodamine group pigments, for instance, rublene, perylene, 9,10-diphenylanthracene, terraphenylbutadiene, neilred, coumalin 6, quinacridone or the like with the above polymers may be used.

As a non polar solvent, which is a desirable type from the point of view of not dissolving the previously formed positive hole injection/transport layers 110*a*, it is possible to use, for example, cychrohexilbenzene, dihydrobenzofuran, trimethylbenzene, tetramethylbenzene, or the like.

By using this type of non polar solvent in the second composite material for making the light emission layers 110*b*, it is possible to apply the second composite material without re-dissolving the positive hole injection/transport layers 110*a* which have already been formed.

As shown in FIG. 46, the liquid drops 110*e* of the second composite material which have been discharged from the ink jet head 121 spread out over the 1 positive hole injection/ transport layer 1104*a*, and fill up the lower opening portions 112*c* and the upper opening portions 112*d*. On the other hand, even if one of the liquid drops 110*e* of the second composite material has wandered from its predetermined discharge position and has been discharged against an upper surface 112*f* which has been subjected to water repellentation processing, the upper surface 112*f* is not wetted by this second composite material drop 110*e*, and the second composite material drop 110*e* is shed off from the upper surface 112*f* and is transferred to one of the lower opening portions 112*c* or one of the upper opening portions 112*d*.

Figure 47:
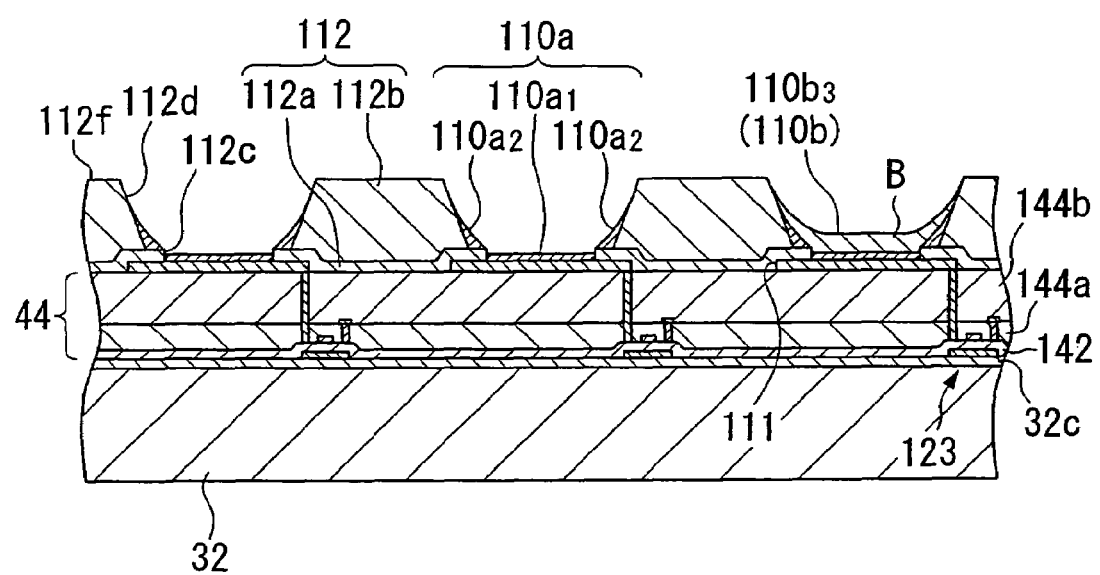
FIG. 47 is another process diagram for explanation of the method of manufacture of the same display device.

Next, after the second composite material has been discharged in the predetermined positions therefor, a drying procedure is performed for the drops 110*e* of the second composite material after their discharge, so as to form the light emission layer 110*b*3. That is to say, the non polar solvent which was contained in the second composite material is vaporized by this drying process, and a blue (B) colored light emission layer 110*b*3 such as shown in FIG. 47 is formed. It should be understood that, although in FIG. 47 only a single light emission layer 110*b*3 which emits blue colored light is shown, in fact, as is clear from FIG. 30 and other figures, basically the light emitting elements are formed so as to be arranged in a matrix pattern, and, viewing the component as a whole, a large number of light emission layers (corresponding to blue color) not shown in the figure are formed.

Figure 48:
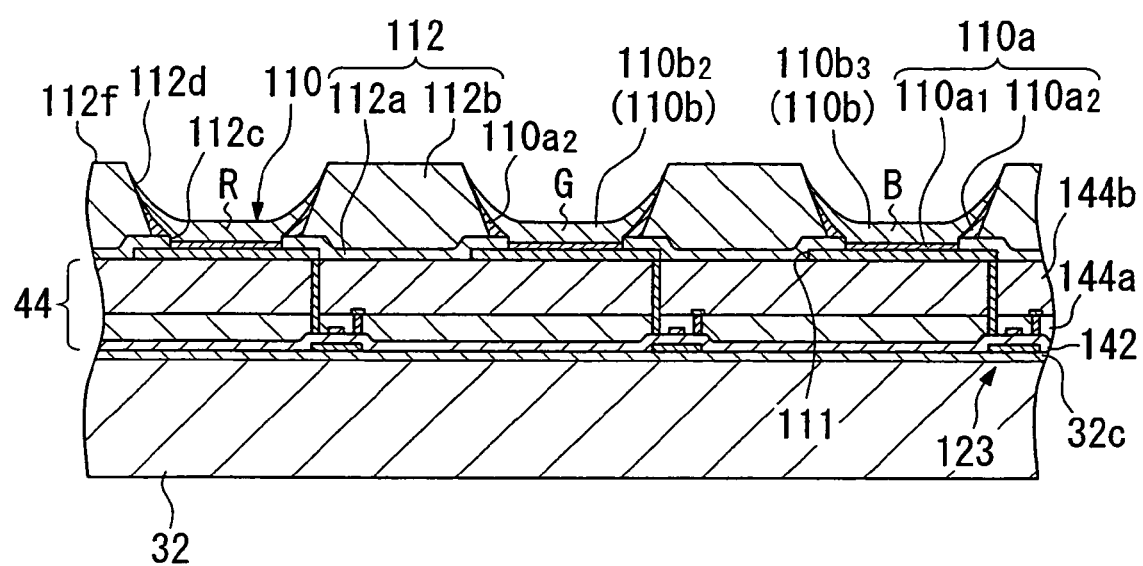
FIG. 48 is yet another process diagram for explanation of the method of manufacture of the same display device.

Next, as shown in FIG. 48, a red (R) colored light emission layer 110*b*1 is formed by using the same process as in the case of formation of the blue (B) colored light emission layer 110*b*3 as described above; and, finally, a green (G) colored light emission layer 110*b*2 is formed by using the same technique.

It should be understood that the order in which these three light emission layers 110*b* are formed is not to be considered as being limited by the example above; any suitable order would be acceptable. For example, it would also be possible to determine the order of formation of the light emission layers, according to the specific qualities of the materials from which they were to be formed.

As drying conditions for the second composite material for forming the light emission layer, for example, in the case of the blue (B) colored light emission layer 110*b*3, they may be: in a nitrogen atmosphere, at room temperature, and at a pressure of, for example, approximately 133.3 to 13.3 Pa (1 to 0.1 torr). If the pressure were too low, the second composite material drops 110*c* would be caused to collide with one another, which would be undesirable. Furthermore, it the temperature were too high, the speed of vaporization of the non polar solvent would be elevated to a level which would be undesirable, and it might be the case that a large quantity of the light emission layer formation material might adhere to the wall surfaces of the upper opening portions 112*d*. Accordingly a working temperature in the range of from 30 degree Celsius to 80 degree Celsius is considered to be desirable.

Furthermore, in the cases of the green (G) colored light emission layer 110*b*2 and of the red (R) colored light emission layer 110*b*1, it is desirable to perform the drying gently, since the number of the components in the material from which the light emission layer is to be formed is relatively large. For example, as acceptable conditions, it may be acceptable to perform this drying by blowing nitrogen against the work-piece at a temperature of 40 degree Celsius for about 5 to 10 minutes.

As another possible means of performing this drying procedure, an infrared irradiation method, or a method of blowing nitrogen gas at high temperature against the work-piece, or the like may be utilized.

By the above procedures, the positive hole injection/transport layers 110*a* and the light emission layers 110*b* are formed above the picture element electrodes 111.

(5) The Process of Formation of the Opposing Electrode (the Negative Electrode)

Next, in an opposing electrode formation process, the negative electrode 42 (the opposing electrode) is formed over the entire surfaces of the light emission layers 110*b* and the organic material bank layers 112*b*, as shown in FIG. 49. It should be understood that it would also be acceptable, as an alternative, to form this negative electrode 42 from a plurality of layers of different materials superimposed upon one another. For example, it is desirable to form the side of the negative electrode 42 towards the light emission layer from a material whose work function is small, and for example it is possible to use Ca or Ba or the like for this portion, or, for this material, there are also cases in which it is best to make this lower layer as a thin layer of LiF or the like. Furthermore, for the upper side (the sealing side) of the negative electrode 42, it is possible to utilize a material whose work function is higher than that of the material used for the lower side thereof, for example Al or the like.

Yet further, it is desirable to form the negative electrode 42 by, for example, an evaporation adhesion method, a spattering method, a CVD method or the like, and in particular, it is desirable to form it by an evaporation adhesion method, from the point of view of being able to prevent damage to the light emission layers 110*b* due to heat.

Furthermore, it would also be acceptable to form only the portions over the light emission layers 110*b* from lithium fluoride; or it would also be possible to form the lithium fluoride portion in correspondence to a predetermined color or colors. For example, it would be acceptable to form the lithium fluoride portion over only the blue (B) colored light emission layers 110*b*3. In this case, an upper negative electrode layer 12*b* which was made from calcium or the like would be contacted against the red (R) colored light emission layers 110*b*1 and against the green (G) colored light emission layers 110*b*2.

Furthermore, it is desirable for an Al layer, an Ag layer or the like to be formed over the upper portion of the negative electrode 42 by an evaporation deposition method, a spattering method, a CVD method or the like. Yet further, it is desirable for the thickness of this layer to be, for example, in the range from 100 to 1000 nm, and in particular it may be in the range from approximately 200 to 500 nm.

Moreover, it would be acceptable to provide a protective layer of SiO2, SiN or the like over the negative electrode 842, for preventation of oxidization thereof.

(6) The Process of Sealing

The final sealing process is a process of sealing between the base plate 32 upon which the light emitting element is formed and the sealing substrate plate 3b using a sealing resin 3a. For example, a sealing resin 3a which consists of a heat curing resin or an ultraviolet light curing resin is applied over the entire surface of the base plate 32, and a substrate plate 3b for sealing is laid over this sealing resin 3a, i.e. is superimposed thereupon. By this process, a sealing portion 33 is formed over the base plate 32.

It is desirable for this sealing process to be performed in an inert gas atmosphere of nitrogen, argon, helium or the like. If this sealing process is performed in the ambient atmosphere, then, if defect portions such as pinholes or the like have occurred in the negative electrode 42, there is a danger that water or oxygen or the like may enter into the negative electrode 42 through these defect portions, and may oxidize the negative electrode 42, which is not desirable.

Furthermore, along with connecting the negative electrode 42 to a lead wire 35a of the substrate plate 5 as shown by way of example in FIG. 30, the lead wires of the circuit element portion 44 are connected to the drive IC 36, and thereby the display device 31 of this preferred embodiment of the present invention is obtained.

In this preferred embodiment as well, by performing the ink jet method described above in the same manner as in the case of the other preferred embodiments explained previously, the same beneficial results are obtained in the same manner. Furthermore since, when selectively applying the functional liquid masses, the liquid mass for a single functional layer is discharged by using a plurality of nozzles, accordingly it is possible to eradicate deviations in the discharge amounts between the nozzles, so that, by reducing variations in the amounts of source material between each of the electrodes, it is possible to ensure that each of the functional layers has a uniform film thickness. By doing this, it is possible to ensure that the amount of emitted light from each of the picture elements is maintained as unifo rm, and accordingly it is possible to manufacture a display device which is endowed with a superior display quality.

Other Preferred Embodiments

Although the present invention has been described above in terms of certain preferred embodiments thereof, the present invention is not to be considered as being limited by these preferred embodiments; and variations such as will now be described above are acceptable, provided that the objectives of the present invention are attained. In other words, it is possible to implement multitudinous variations in the concrete structure and form of the present invention, without departing from the scope of the present invention, which is to be defined solely by the scope of the appended claims.

In other words although, by way of example, the main scanning of the motherboard 12 by the ink jet head 421 was performed by shifting the ink jet head 421 along the main scanning direction X, and the widthwise scanning of the motherboard 12 by the ink jet head 421 was performed by shifting the motherboard 12 with the widthwise scanning drive device 425, it would be possible to implement an opposite arrangement, in which the main scanning was executed by shifting the motherboard 12, and the widthwise scanning was executed by shifting the ink jet head 421. Furthermore, it would also be possible to implement various other sorts of structure in which the ink jet head 421 and the surface of the motherboard 12 were mutually shifted respectively to one another, by shifting only the motherboard 12 without shifting the ink jet head 421, or by shifting only the ink jet head 421 without shifting the motherboard 12, or by shifting both of them in relatively opposite directions, or the like.

Furthermore, although in the above described preferred embodiments an ink jet head 421 was utilized which was made so as to discharge the ink by taking advantage of the flexible deformation of the piezoelectric elements, it would also be possible to utilize an ink jet head of any other different structure; for example, one which utilized a method of discharging the ink in pulses which were generated by heating up the ink.

Yet further although, in the preferred embodiments shown in FIGS. 1 through 13, for the irk jet head 421, one was explained in which the nozzles 466 were arranged at substantially equal intervals and in two rows along substantially straight lines, the present invention is not to be considered as being limited to the case of two rows; it would be possible for various different numbers of rows to be utilized. Moreover, the intervals between the nozzles 466 along their rows need not all be equal to one another. Yet further, it is not even necessary for the nozzles 466 to be arranged along straight lines.

And the objects for the manufacture of which the liquid drop discharge devices 16, 401 may be used are not to be considered as being limited to the liquid crystal device 101 and the electro-luminescent device 201; these liquid drop discharge devices 16, 401 may also be applied to the production of a wide range of electro optical devices which comprise substrate plates and predetermined layers formed in predetermined places thereupon, such as an electron emission device such as a FED (Field Emission Display) or the like, a PDP (Plasma Display Panel), an electrical migration device—in other words a device in which ink, which is a functional liquid mass which includes charged grains, is discharged into concave portions between division walls which separate various picture elements, and which performs display by applying voltage between electrodes which are disposed above and below each picture element so as to sandwich it, whereby the charged grains are attracted towards one of the electrodes—a CRT (Cathode Ray Tube) display such as a thin type CRT, or the like.

The device and the method of the present invention can be utilized in various processes for manufacturing various types of devices which have substrate plates (backings), including electro optical devices, in which it is possible to employ a process of discharging liquid drops against such a backing. For example, they can be applied to manufacture of any of the following structures: a structure consisting of electrical connecting wires upon a printed circuit substrate plate, in which these electrical connecting wires are formed by discharging a liquid metal or an electro-conductive material, or a paint containing a metallic substance or the like, against this printed circuit substrate plate by using an ink jet method; a structure for a fuel cell in which an electrode or an ion conduction layer or the like is formed by discharge using an ink jet method; a structure in which an optical member such as a minute micro lens is formed upon a backing by discharge using an ink jet method; a structure in which a resist, which is to be applied on a substrate plate, is applied only upon appropriate portions thereof by discharge using an ink jet method; a structure in which convex portions for scattering light, or a minute white pattern or the like, are formed upon a transparent substrate plate made from a plastic or the like by discharge using an ink drop method, so as to form a light scattering plate; or a structure in which a biochip is formed by discharging RNA (ribonucleic acid) using an ink drop method upon spike spots which are arranged in a matrix array upon a DNA (deoxyribonucleic acid) chip such as a reagent inspection device or the like, or in which a sample or an antibody, or DNA (deoxyribonucleic acid) or the like, is discharged using an ink jet method upon a backing in positions in dot form which are compartmented apart, so as to manufacture a fluorescent marker probe by performing hybridization or the like upon a DNA chip; or the like.

Furthermore, as well as to a complete liquid crystal device 101, the present invention can also be applied to any portion which is included in an electro optical system of a liquid crystal device, such as a structure such as an active matrix liquid crystal panel which comprises TFT transistors or the like or active elements such as TFDs in the picture elements, or the like, in which division walls 6 are formed which define and surround the picture element electrodes, and in which ink is discharged by an ink jet method in the concave portions which are defined by these division walls 6, so as to form a color filter 1; or a structure in which a color filter 1 is formed as an electro-conductive color filter upon picture element electrodes by discharging a mixture of a colored material and an electro-conductive material, which serves as an ink, against the picture element electrodes using an ink jet method; or a structure which is formed by discharging, using an ink jet method, particles of a spacer for maintaining a gap with respect to a substrate plate; or the like.

Yet further, the present invention is not limited in its application to a color filter 1 or to an electro-luminescent device; it can also be applied to any other type of electro optical device. Moreover, in the case of the electro-luminescent device as well, the present invention can also be applied to any of various structures, such as one in which the electro-luminescent layers which correspond to the three colors R, G, and B are formed in a stripe pattern, or, as described above, it can be applied to an display device of the active matrix type which comprises transistors which control the flow of electric current in the light emission layers for each of the picture elements individually, or to one of the passive matrix type, or the like.

Figure 27:
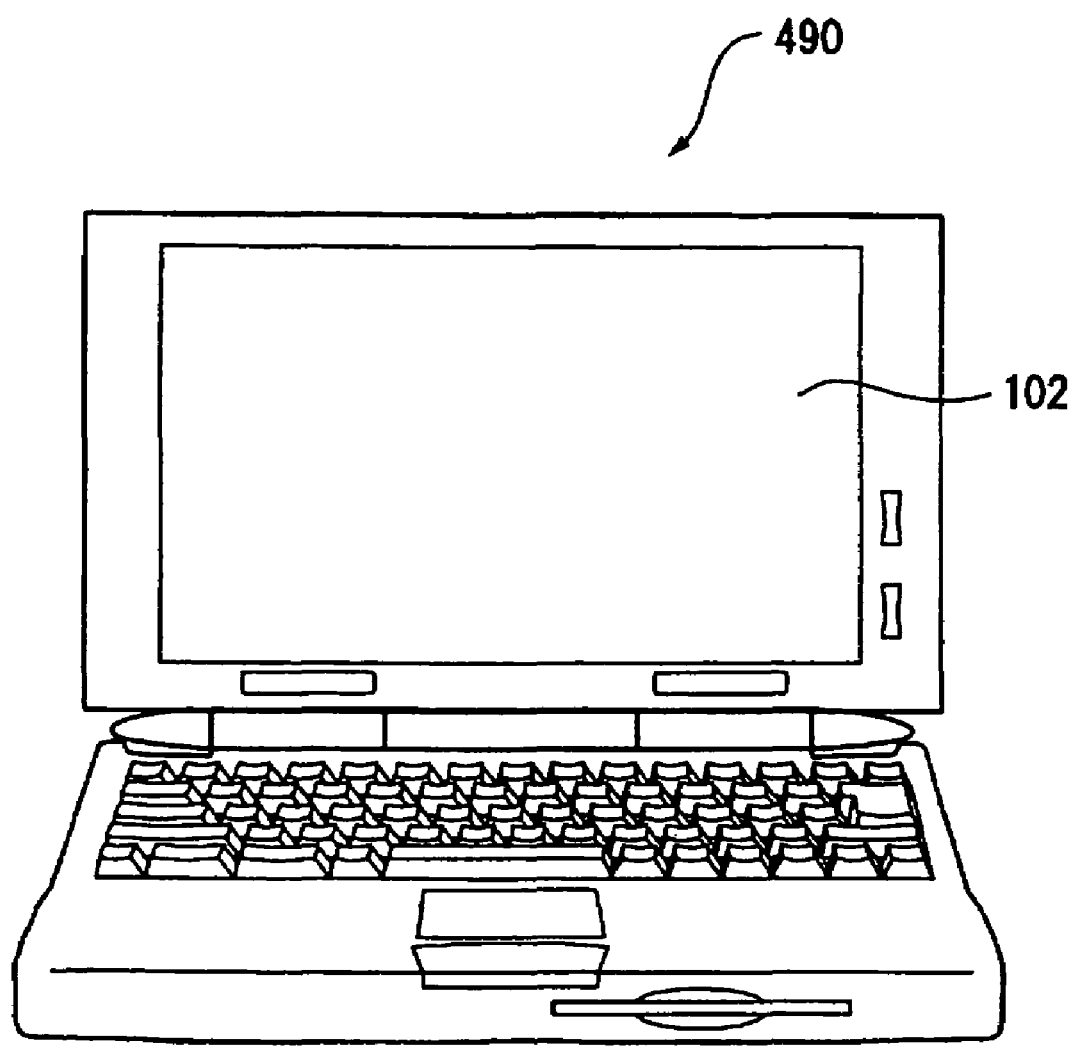
FIG. 27 is a perspective view showing a personal computer which is an electronic device equipped with the same electro optical device.
Figure 28:
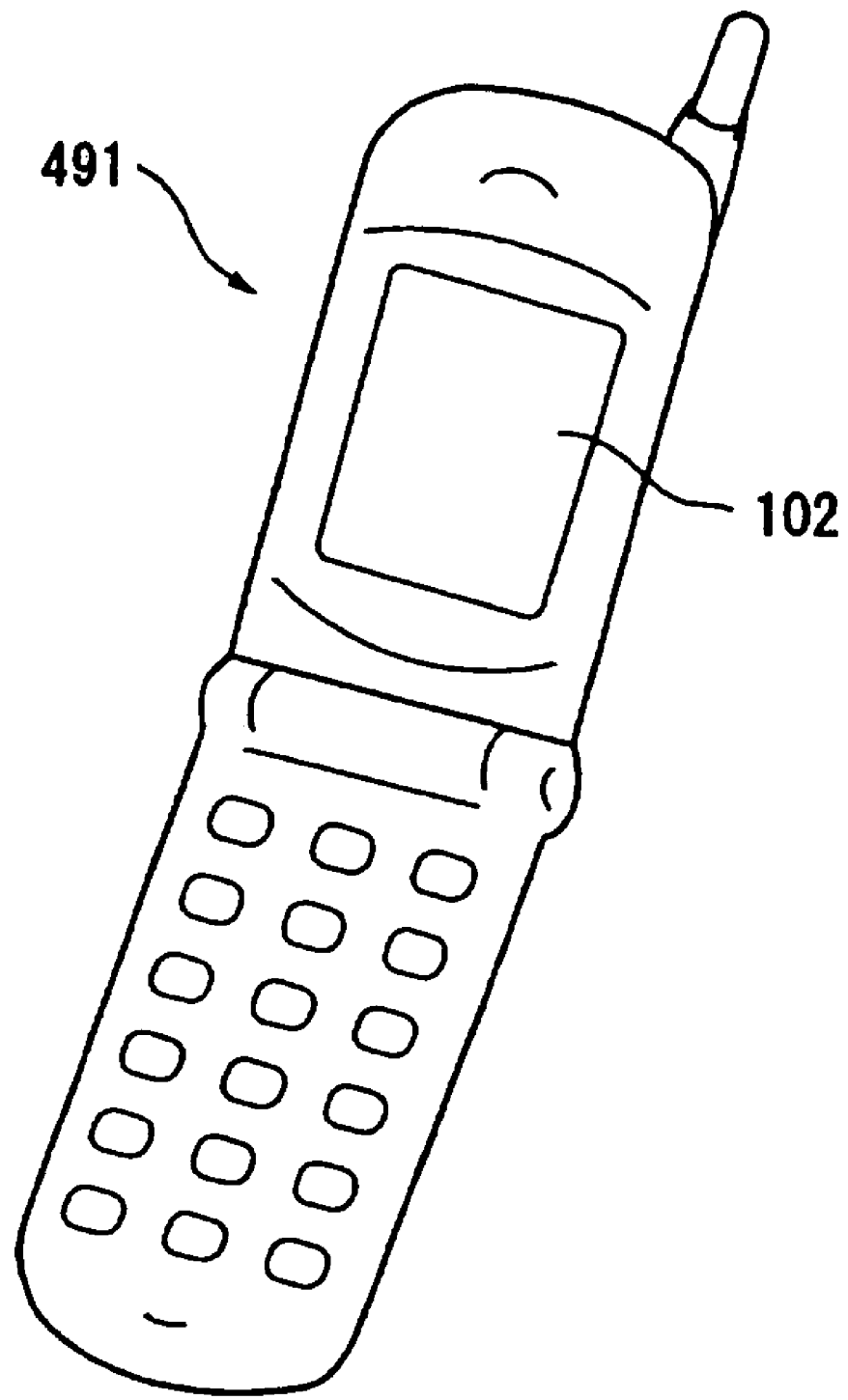
FIG. 28 is a perspective view showing a portable telephone which is an electronic device equipped with the same electro optical device.

And, as for the electronic device to which the electro optical device according to any of the above described preferred embodiments of the present invention is assembled, its application is not to be considered as being limited to a personal computer 490 such as shown, for example, in FIG. 27; on the contrary, it is possible to adapt the present invention to various types of electronic device, such as a portable telephone instrument like the portable telephone 491 shown in FIG. 28 or a PHS (Personal Handyphone System) unit or the like, or to an electronic notebook, a POS (Point Of Sale) terminal, an IC card, a mini disc player, a liquid crystal projector, an engineering workstation (Engineering Work Station: EWS), a word processor, a television, a video tape recorder of the viewfinder type or the direct vision monitor type, a tabletop electronic calculator, a car navigation device, a device incorporating a touch panel, a watch, a game device, or the like.

Further to the embodiments in which the division walls 6 of the color filter 1 are formed from the resin materials which are non transparent, resin materials which are transparent are available for the division walls. In this case, shading members made of metal layer or resin material which locate between the filter elements 3, for instance over the division walls 6 and beneath the division walls 6, and perform as a black musk are available. It should be understood that in this description of the present invention the term "division wall" is used to include the meaning of "bank", and is an expression of which denotes portions which are convex as seen from the substrate plate, are almost perpendicular or which have angles somewhat greater than or what less than roughly 90 degree.

The colors of the filter element 3 are not limited in R, G, and B of the embodiments, colors of C (cyan), M (magenta), and Y (yellow) are also utilized. In a case of utilizing C, M and Y, filter element materials 13 having colors of C, M and Y are utilized in place of the filter element materials 13 having colors of R, G and B.

It should be understood that the structure and the procedures of the various preferred embodiments of the present invention which have been disclosed in concrete terms are not intended to be limiting; other versions thereof which fall within the scope of the appended claims, and which attain the objectives of the present invention, will be acceptable, and are not to be considered as departing from its range.

What is claimed is:

1. An electro-luminescent display device, comprising:
   a substrate having electrodes; and
   electro-luminescent layers made from at least an electro-luminescent material and provided in correspondence with the electrodes upon the substrate, wherein:
   each of a plurality of discharge apparatuses comprises a nozzle surface having at least one linear nozzle row, the nozzle row having nozzles that discharge a liquid containing the electro-luminescent material onto the substrate;
   a holding apparatus holds and arranges the discharge apparatuses so that at least two of the nozzles are linearly-arranged along a main scanning direction and that the each nozzle surface of the discharge apparatuses is facing a surface of the substrate with a gap therebetween
   the main scanning direction is a direction of relative movement between the discharge apparatuses and the substrate; and
   the nozzles are linearly-arranged along the main scanning direction and discharge the same liquid, while relatively moving the holding apparatus and the substrate along the main direction, and while the discharge apparatuses are directed along the surface of the substrate.

2. The electro-luminescent display device according to claim 1, further comprising:
   positive hole injection layers above which the electro-luminescent layers are formed.

3. The electro-luminescent display device according to claim 1, wherein
   each of the electro-luminescent-layers comprises a stack layer formed by repeating a process including discharging the liquid and drying the liquid.

4. The electro-luminescent display device according to claim 3, wherein the electro-luminescent material comprises an organic electroluminescent material.

* * * * *